(12) United States Patent
Liu et al.

(10) Patent No.: US 11,568,609 B1
(45) Date of Patent: Jan. 31, 2023

(54) IMAGE SENSOR HAVING ON-CHIP COMPUTE CIRCUIT

(71) Applicant: Meta Platforms Technologies, LLC, Menlo Park, CA (US)

(72) Inventors: Xinqiao Liu, Medina, WA (US); Barbara De Salvo, Belmont, CA (US); Hans Reyserhove, San Jose, CA (US); Ziyun Li, Redmond, WA (US); Asif Imtiaz Khan, Campbell, CA (US); Syed Shakib Sarwar, Bellevue, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/315,056

(22) Filed: May 7, 2021

Related U.S. Application Data

(63) Continuation-in-part of application No. 16/910,844, filed on Jun. 24, 2020, now Pat. No. 11,315,330,
(Continued)

(51) Int. Cl.
*G06T 19/00* (2011.01)
*G06F 3/01* (2006.01)
(Continued)

(52) U.S. Cl.
CPC .......... *G06T 19/006* (2013.01); *G02B 27/017* (2013.01); *G02B 27/0172* (2013.01);
(Continued)

(58) Field of Classification Search
None
See application file for complete search history.

(56) References Cited

U.S. PATENT DOCUMENTS

| 7,362,365 B1 | 4/2008 | Reyneri et al. |
| 8,134,623 B2 | 3/2012 | Purcell et al. |

(Continued)

FOREIGN PATENT DOCUMENTS

| CN | 103207716 | 7/2013 |
| CN | 104125418 A | 10/2014 |

(Continued)

OTHER PUBLICATIONS

Amir et al. "NeuroSensor: A 3D Image Sensor with Integrated Neural Accelerator," Oct. 10-13, 2016, 2-16 IEEE SOI-3D Subthreshold Microelectronics Technology Unified Conference (S3S), pp. 1-2 (Year: 2016).*

(Continued)

*Primary Examiner* — Peter Hoang
(74) *Attorney, Agent, or Firm* — Weaver Austin Villeneuve & Sampson LLP

(57) ABSTRACT

In one example, an apparatus comprises: a first sensor layer, including an array of pixel cells configured to generate pixel data; and one or more semiconductor layers located beneath the first sensor layer with the one or more semiconductor layers being electrically connected to the first sensor layer via interconnects. The one or more semiconductor layers comprises on-chip compute circuits configured to receive the pixel data via the interconnects and process the pixel data, the on-chip compute circuits comprising: a machine learning (ML) model accelerator configured to implement a convolutional neural network (CNN) model to process the pixel data; a first memory to store coefficients of the CNN model and instruction codes; a second memory to store the pixel data of a frame; and a controller configured to execute the codes to control operations of the ML model accelerator, the first memory, and the second memory.

20 Claims, 27 Drawing Sheets

Related U.S. Application Data which is a continuation of application No. 15/909,162, filed on Mar. 1, 2018, now Pat. No. 10,726,627.

(60) Provisional application No. 63/038,636, filed on Jun. 12, 2020, provisional application No. 63/021,476, filed on May 7, 2020, provisional application No. 62/536,605, filed on Jul. 25, 2017.

(51) Int. Cl.
| | |
|---|---|
| *G06T 7/73* | (2017.01) |
| *G02B 27/01* | (2006.01) |
| *G06V 20/20* | (2022.01) |
| *G06K 9/62* | (2022.01) |
| *G06V 10/44* | (2022.01) |
| *G06V 10/94* | (2022.01) |
| *G06V 20/64* | (2022.01) |
| *G06V 30/192* | (2022.01) |
| *H04N 5/378* | (2011.01) |
| *H01L 27/146* | (2006.01) |
| *H01L 31/0352* | (2006.01) |
| *H01L 31/0384* | (2006.01) |
| *H01L 27/28* | (2006.01) |
| *H01L 27/30* | (2006.01) |

(52) U.S. Cl.
CPC ............ *G06F 3/013* (2013.01); *G06K 9/627* (2013.01); *G06K 9/6256* (2013.01); *G06K 9/6268* (2013.01); *G06T 7/73* (2017.01); *G06V 10/454* (2022.01); *G06V 10/955* (2022.01); *G06V 20/20* (2022.01); *G06V 20/64* (2022.01); *G06V 20/647* (2022.01); *G06V 30/195* (2022.01); *G02B 2027/011* (2013.01); *G02B 2027/014* (2013.01); *G02B 2027/0138* (2013.01); *G02B 2027/0178* (2013.01); *G06T 2207/20084* (2013.01); *H01L 27/14627* (2013.01); *H01L 27/14634* (2013.01); *H01L 27/14636* (2013.01); *H01L 27/14643* (2013.01); *H01L 27/14665* (2013.01); *H01L 27/286* (2013.01); *H01L 27/307* (2013.01); *H01L 31/03845* (2013.01); *H01L 31/035218* (2013.01); *H04N 5/378* (2013.01)

(56) References Cited

U.S. PATENT DOCUMENTS

| | | | |
|---|---|---|---|
| 8,779,346 | B2 | 7/2014 | Fowler et al. |
| 9,001,251 | B2 | 4/2015 | Smith et al. |
| 9,094,629 | B2 | 7/2015 | Ishibashi |
| 9,282,264 | B2 | 3/2016 | Park et al. |
| 9,363,454 | B2 | 6/2016 | Ito et al. |
| 9,940,534 | B1* | 4/2018 | Yang ............... G06N 3/0454 |
| 10,726,627 | B2 | 7/2020 | Liu |
| 2003/0020100 | A1 | 1/2003 | Guidash |
| 2005/0057389 | A1 | 3/2005 | Krymski |
| 2007/0222881 | A1 | 9/2007 | Mentzer |
| 2009/0244346 | A1 | 10/2009 | Funaki |
| 2009/0245637 | A1 | 10/2009 | Barman et al. |
| 2009/0321615 | A1 | 12/2009 | Sugiyama et al. |
| 2010/0276572 | A1 | 11/2010 | Iwabuchi et al. |
| 2011/0254986 | A1 | 10/2011 | Nishimura et al. |
| 2012/0133807 | A1 | 5/2012 | Wu et al. |
| 2012/0212465 | A1 | 8/2012 | White et al. |
| 2012/0262616 | A1 | 10/2012 | Sa et al. |
| 2013/0056809 | A1 | 3/2013 | Mao et al. |
| 2013/0057742 | A1 | 3/2013 | Nakamura et al. |
| 2013/0141619 | A1 | 6/2013 | Lim et al. |
| 2013/0207219 | A1 | 8/2013 | Ahn |
| 2013/0299674 | A1 | 11/2013 | Fowler et al. |
| 2014/0042299 | A1 | 2/2014 | Wan et al. |
| 2014/0368687 | A1 | 12/2014 | Yu et al. |
| 2015/0035165 | A1* | 2/2015 | Chen ............... H01L 25/0657 257/774 |
| 2015/0189209 | A1 | 7/2015 | Yang et al. |
| 2015/0201142 | A1 | 7/2015 | Smith et al. |
| 2015/0229859 | A1 | 8/2015 | Guidash et al. |
| 2015/0279884 | A1 | 10/2015 | Kusumoto |
| 2015/0309316 | A1 | 10/2015 | Osterhout et al. |
| 2015/0312502 | A1 | 10/2015 | Borremans |
| 2015/0358571 | A1 | 12/2015 | Dominguez Castro et al. |
| 2015/0381911 | A1 | 12/2015 | Shen et al. |
| 2016/0011422 | A1 | 1/2016 | Thurber et al. |
| 2016/0018645 | A1 | 1/2016 | Haddick et al. |
| 2016/0028974 | A1 | 1/2016 | Guidash et al. |
| 2016/0088253 | A1 | 3/2016 | Tezuka |
| 2016/0100115 | A1 | 4/2016 | Kusano |
| 2016/0165160 | A1 | 6/2016 | Hseih et al. |
| 2016/0197117 | A1 | 7/2016 | Nakata et al. |
| 2016/0360127 | A1 | 12/2016 | Dierickx et al. |
| 2017/0039906 | A1 | 2/2017 | Jepsen |
| 2017/0228345 | A1 | 8/2017 | Gupta et al. |
| 2017/0272768 | A1 | 9/2017 | Tall et al. |
| 2017/0280031 | A1 | 9/2017 | Price et al. |
| 2017/0324917 | A1 | 11/2017 | Mlinar et al. |
| 2017/0339327 | A1 | 11/2017 | Koshkin et al. |
| 2018/0136471 | A1 | 5/2018 | Miller et al. |
| 2018/0167575 | A1 | 6/2018 | Watanabe et al. |
| 2018/0276841 | A1 | 9/2018 | Krislmaswamy et al. |
| 2019/0035154 | A1 | 1/2019 | Liu |
| 2019/0098232 | A1 | 3/2019 | Mori et al. |
| 2020/0053299 | A1 | 2/2020 | Zhang et al. |
| 2021/0019606 | A1* | 1/2021 | Yang .................. G06T 1/20 |

FOREIGN PATENT DOCUMENTS

| | | |
|---|---|---|
| CN | 104204904 | 12/2014 |
| CN | 104704813 A | 6/2015 |
| CN | 105706439 A | 6/2016 |
| CN | 106255978 | 12/2016 |
| CN | 106791504 | 5/2017 |
| CN | 109298528 | 2/2019 |
| EP | 1746820 A1 | 1/2007 |
| EP | 2804074 A2 | 11/2014 |
| WO | 2014055391 A2 | 4/2014 |
| WO | 2017013806 A1 | 1/2017 |

OTHER PUBLICATIONS

Chi et al. "Prime: A Novel Processing-in-memory Architecture for Neural Network Computation in ReRam-based Main Memory," 2016 ACM/IEEE 43rd Annual International Symposium on Computer Architecture; pp. 27-39 (Year: 2016).*

Hu et al., "Hardware Realization of BSB Recall Function Using Memristor Crossbar Arrays,"2012 in proc. DAC; pp. 498-503 (Year: 2012).*

Non-Final Office Action dated Jul. 25, 2019 in U.S. Appl. No. 15/909,162.

Notice of Allowance dated Mar. 18, 2020 in U.S. Appl. No. 15/909,162.

Chinese Application No. 201810821296, "First Search", dated Jun. 28, 2020, 2 pages.

Chinese Application No. 201810821296, "First Office Action", dated Jul. 3, 2020, 17 pages.

Chinese Application No. 201810821296, "Second Office Action", dated Mar. 9, 2021, 10 pages.

PCT Application No. PCT/US2021/031201, "International Search Report and Written Opinion", dated Aug. 2, 2021, 11 pages.

Amir, et al., "3-D Stacked Image Sensor With Deep Neural Network Computation", IEEE Sensors Journal, IEEE Service Center, New York, NY, US, vol. 18, No. 10, May 15, 2018 (May 15, 2018), pp. 4187-4199, XP011681876.

Chu-xi, et al. Depth Convolutional Neural Network Approximation by Memristor-Based PIM Structures, et al., Computer Research and Development, No. 6, pp. 1367-1380, Jun. 30, 2017.

Millet, et al., "A 5500-frames/s 85-GOPS/W 3-D Stacked BSI Vision Chip Based on Parallel In-Focal-Plane Acquisition and

(56) References Cited

OTHER PUBLICATIONS

Processing", IEEE Journal of Solid-State Circuits, IEEE, USA, vol. 54, No. 4, Apr. 1, 2019 (Apr. 1, 2019), pp. 1096-1105, XP011716786.
Sebastian, et al. "Memory devices and applications for in-memory computing", Nature Nanotechnology, Nature Pub. Group, Inc, London, vol. 15, No. 7, Mar. 30, 2020 (Mar. 30, 2020), pp. 529-544, XP037194929.
Shi, et al., "ISSCC 2014 / SESSION 7 / Image Sensors/ 7.3 A 1000fps Vision Chip Based on a Dynamically Reconfigurable Hybrid Architecture Comprising a PE Array and Self-Organizing Map Neural Network", Feb. 10, 2014 (Feb. 10, 2014), pp. 128-129, XP055826878.
Cho K., et al., "A Low Power Dual CDS for a Column-Parallel CMOS Image Sensor," Journal of Semiconductor Technology and Science, Dec. 30, 2012, vol. 12 (4), pp. 388-396.
Corrected Notice of Allowability dated Apr. 9, 2021 for U.S. Appl. No. 16/255,528, filed Jan. 23, 2019, 5 Pages.
Extended European Search Report for European Application No. 18179846.3, dated Dec. 7, 2018, 10 Pages.
Extended European Search Report for European Application No. 18179851.3, dated Dec. 7, 2018, 8 Pages.
Extended European Search Report for European Application No. 19743908.6, dated Sep. 30, 2020, 9 Pages.
Final Office Action dated Jan. 27, 2021 for U.S. Appl. No. 16/255,528, filed Jan. 23, 2019, 31 Pages.
International Search Report and Written Opinion for International Application No. PCT/US2018/039350, dated Nov. 15, 2018, 11 Pages.
International Search Report and Written Opinion for International Application No. PCT/US2018/039352, dated Oct. 26, 2018, 8 Pages.
International Search Report and Written Opinion for International Application No. PCT/US2018/039431, dated Nov. 7, 2018, 12 Pages.
International Search Report and Written Opinion for International Application No. PCT/US2019/014904, dated Aug. 5, 2019, 7 Pages.
Non-Final Office Action dated Sep. 2, 2021 for U.S. Appl. No. 16/910,844, filed Jun. 24, 2020, 7 Pages.
Non-Final Office Action dated Jul. 10, 2020 for U.S. Appl. No. 16/255,528, filed Jan. 23, 2019, 27 Pages.
Non-Final Office Action dated Nov. 23, 2018 for U.S. Appl. No. 15/847,517, filed Dec. 19, 2017, 21 Pages.
Notice of Allowance dated Apr. 1, 2021 for U.S. Appl. No. 16/255,528, filed Jan. 23, 2019, 7 Pages.
Notice of Allowance dated Dec. 22, 2021 for U.S. Appl. No. 16/910,844, filed Jun. 24, 2020, 7 pages.
Notice of Allowance dated Nov. 24, 2021 for U.S. Appl. No. 16/910,844, filed Jun. 24, 2020, 8 pages.
Notification of the First Office Action dated Oct. 28, 2021 for Chinese Application No. 2019800218483, filed Jan. 24, 2019, 17 pages.
Partial European Search Report for European Application No. 18179838.0, dated Dec. 5, 2018, 13 Pages.
Non-Finai Office Action dated Jun. 21, 2022 for U.S. Appl. No. 17/313,884, filed May 6, 2021, 19 pages, [FACTP164US].
Office Action dated Apr. 28, 2022 for Taiwan Application No. 108102703, 32 pages.
Yao H., et al., "Gabor Feature Based Convolutional Neural Network for Object Recognition in Natural Scene," 3rd International Conference on information Scene and Control Engineer, 2016, pp. 386-390.

\* cited by examiner

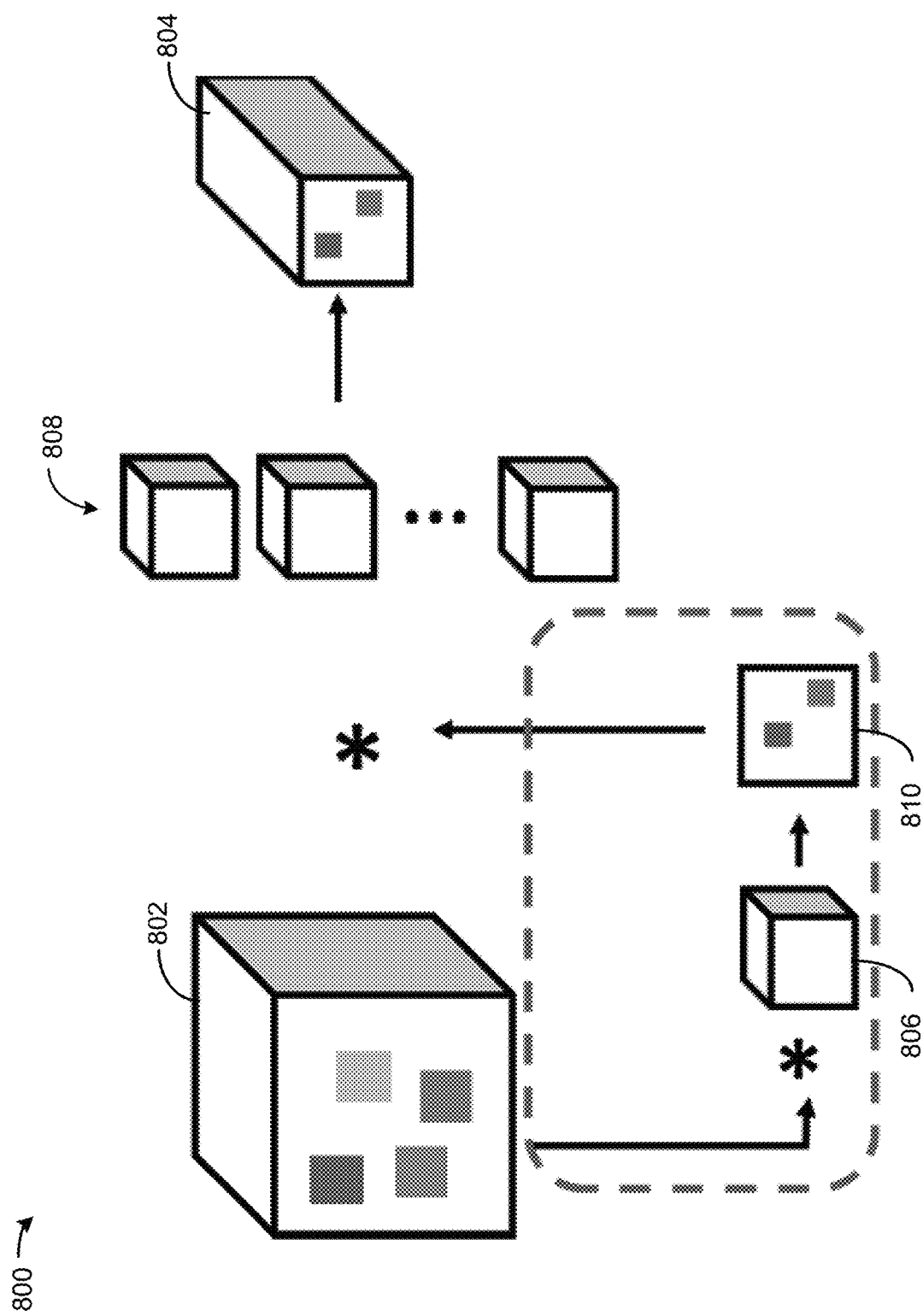

IMAGE SENSOR HAVING ON-CHIP COMPUTE CIRCUIT

RELATED APPLICATION

This application claims the benefit of priority to U.S. Provisional Application 63/021,476, entitled "Smart Sensor" filed May 7, 2020, and U.S. Provisional Application 63/038,636, entitled "Smart Sensor" filed Jun. 12, 2020, and is a continuation-in-part of and claims the benefit of priority to U.S. Non-Provisional application Ser. No. 16/910,844, entitled "Sensor System Based on Stacked Sensor Layers" filed Jun. 24, 2020, which is a continuation and claims the benefit of priority to U.S. Non-Provisional application Ser. No. 15/909,162, entitled "Sensor System Based on Stacked Sensor Layers" filed Mar. 1, 2018, which claims the benefit of priority to U.S. Provisional Application 62/536,605, entitled "Stacked Sensor System Using Memristors" filed Jul. 25, 2017, the entire contents of which are hereby incorporated by reference in their entirety for all purposes.

TECHNICAL FIELD

The present disclosure generally relates to implementation of sensor devices, and specifically relates a sensor system comprising a plurality of stacked sensor layers that can be part of an artificial reality system.

BACKGROUND

Artificial reality systems such as head-mounted display (HMD) systems employ complex sensor devices (cameras) for capturing features of objects in a surrounding area in order to provide satisfactory user experience. A limited number of conventional sensor devices can be implemented in an HMD system and utilized for eye tracking, hand tracking, body tracking, scanning of a surrounding area with a wide field-of-view, etc. Most of the time, the conventional sensor devices capture a large amount of information from the surrounding area. Due to processing a large amount of data, the conventional sensor devices can be easily saturated, negatively affecting processing speed. Furthermore, the conventional sensor devices employed in artificial reality systems dissipate a large amount of power while having a prohibitively large latency due to performing computationally intensive operations.

SUMMARY

A sensor assembly for determining one or more features of a local area surrounding some or all of the sensor assembly is presented herein. The sensor assembly includes a plurality of stacked sensor layers, i.e., sensor layers stacked on top of each other. A first sensor layer of the plurality of stacked sensor layers located on top of the sensor assembly can be implemented as a photodetector layer and includes an array of pixels. The top sensor layer can be configured to capture one or more images of light reflected from one or more objects in the local area. The sensor assembly further includes one or more sensor layers located beneath the photodetector layer. The one or more sensor layers can be configured to process data related to the captured one or more images for determining the one or more features of the local area, e.g., depth information for the one or more objects or an image classifier.

A head-mounted display (HMD) can further integrate a plurality of sensor assemblies. The HMD displays content to a user wearing the HMD. The HMD may be part of an artificial reality system. The HMD further includes an electronic display, at least one illumination source and an optical assembly. The electronic display is configured to emit image light. The at least one illumination source is configured to illuminate the local area with light captured by at least one sensor assembly of the plurality of sensor assemblies. The optical assembly is configured to direct the image light to an eye box of the HMD corresponding to a location of a user's eye. The image light may comprise depth information for the local area determined by the at least one sensor assembly based in part on the processed data related to the captured one or more images.

In some examples, an apparatus is provided. The apparatus comprises: a first sensor layer of a plurality of stacked sensor layers, including an array of pixel cells configured to generate pixel data; and one or more semiconductor layers of the plurality of stacked sensor layers located beneath the first sensor layer, the one or more semiconductor layers being electrically connected to the first sensor layer via interconnects. The one or more semiconductor layers comprises on-chip compute circuits configured to receive the pixel data via the interconnects and process the pixel data, the on-chip compute circuits comprising: a machine learning (ML) model accelerator configured to implement a convolutional neural network (CNN) model to process the pixel data; a first memory to store coefficients of the CNN model and instruction codes; a second memory to store the pixel data of a frame; and a controller configured to execute the codes to control operations of the ML model accelerator, the first memory, and the second memory.

In some aspects, the controller is configured to power down the ML model accelerator and the second memory within an exposure period of a frame period, power up the ML model accelerator and the second memory after the exposure period ends to process the pixel data, and power down the ML model accelerator and the second memory after the processing of the pixel data completes.

In some aspects, the first memory comprises a non-volatile memory (NVM). The second memory comprises static random access memory (SRAM) devices.

In some aspects, the NVM comprise at least one of: magnetoresistive random access memory (MRAM) devices, resistive random-access memory (RRAM) devices, or phase-change memory (PCM) devices.

In some aspects, the one or more semiconductor layers comprises a first semiconductor layer and a second semiconductor layer forming a stack. The first semiconductor layer includes the ML model accelerator and the first memory. The second semiconductor layer includes the second memory. The second memory is connected to the ML model accelerator via a parallel through silicon via (TSV) interface.

In some aspects, the second semiconductor layer further comprises a memory controller configured to perform an in-memory compute operation on the pixel data stored in the second memory, the in-memory compute operation comprising at least one of: a matrix transpose operation, a matrix re-shaping operation, or a matrix multiplication operation.

In some aspects, the second memory comprise circuits to perform at least one of: a logical AND operation between two matrices representing the pixel data and the coefficients, or a logical NOR operation between the two matrices. The memory controller is configured to perform, based on a result of the at least one of the logical AND operation or the logical NOR operation, at least one of: a multiplication operation, a summation operation, or a degree of similarity operation between the two matrices.

In some aspects, a zero coefficient is represented by an asserted flag bit in the first memory. A non-zero coefficient is represented by a de-asserted flag bit and a set of data bits representing a numerical value of the non-zero coefficient in the first memory.

In some aspects, the ML model accelerator is configured skip arithmetic operations involving zero coefficients based on detecting the asserted flag bits of the zero coefficients.

In some aspects, the ML model accelerator is configured to implement a gating model to select a subset of the pixel data as input to the CNN model. The gating model comprises a user-specific model and a base model, the user-specific model being generated at the apparatus, the base model being generated at an external device external to the apparatus.

In some aspects, the gating model selects different subsets of the pixel data for different input channels and for different frames.

In some aspects, the one or more semiconductor layers comprise an NVM comprising an MRAM device. The controller is configured to: transmit pulses to the MRAM device to modulate a resistance of the MRAM device; generate a sequence of random numbers based on measuring the modulated resistances of the MRAM device; and encrypt at least one of: the coefficients of the CNN model, or the pixel data, using the sequence of random numbers.

In some aspects, the CNN model comprises: a first layer including a first set of weights; and a second layer including a second set of weights. The first set of weights and the second set of weights are trained based on an ex-situ training operation external to the apparatus. The second set of weights are adjusted based on an in-situ training operation at the apparatus.

In some aspects, the ex-situ training operation is performed in a cloud environment. The apparatus is configured to transmit the adjusted second set of weights back to the cloud environment.

In some aspects, the in-situ training operating comprises a reinforcement learning operation. The first memory comprises an array of memristors to implement the second layer. The ML model accelerator is configured to compare intermediate outputs from the array of memristors with random numbers to generate outputs and to adjust weights stored in the array of memristors based on the outputs.

In some aspects, the first memory comprises an MRAM device. The controller is configured to transmit pulses to the MRAM device to generate the random numbers.

In some aspects, the in-situ training operating comprises an unsupervised learning operation. The first memory comprises an array of memristors to implement the second layer. The array of memristors is configured to receive signals representing events detected by array of pixels and to generate intermediate outputs representing a pattern of relative timing of the events. The ML model accelerator is configured to generate outputs based on the intermediate outputs and to adjust weights stored in the array of memristors based on the outputs.

In some aspects, the first memory comprises an array of memristors to implement the second layer. The array of memristors is configured to perform at least one of: a vector-matrix multiplication operation or a vector-vector multiplication operation, to implement a fully-connected neural network layer of the CNN model.

In some examples, a method is provided. The method comprises: generating pixel data using an array of pixel cells of a first sensor layer of a plurality of stacked sensor layers; transmitting, via interconnects that electrically connect between the first sensor layer and one or more semiconductor layers of the plurality of stacked sensor layers located beneath the first sensor layer, the pixel data to on-chip compute circuits in the one or more semiconductor layers, wherein the on-chip compute circuits include a machine learning (ML) model accelerator that implements convolutional neural network (CNN) model, a first memory that stores coefficients of the CNN model, and a second memory; storing the pixel data at the second memory; and processing, using the ML model accelerator and based on the coefficients stored in the first memory, the pixel data from the second memory to generate a processing result.

In some aspects, processing, using the ML model and based on the coefficients stored in the first memory, the pixel data from the second memory to generate a processing result comprises at least one of: using an array of memristors included in the first memory to perform the processing or using circuits of the second memory to perform at least one of: a logical AND operation between two matrices representing the pixel data and the coefficients or a logical NOR operation between the two matrices, to perform the processing.

BRIEF DESCRIPTION OF THE DRAWINGS

FIG. 8A, FIG. 8B, and FIG. 8C illustrate example components of sensor system of FIG. 6 and their operations, in accordance with one or more examples of the present disclosure.

Figure 1A:
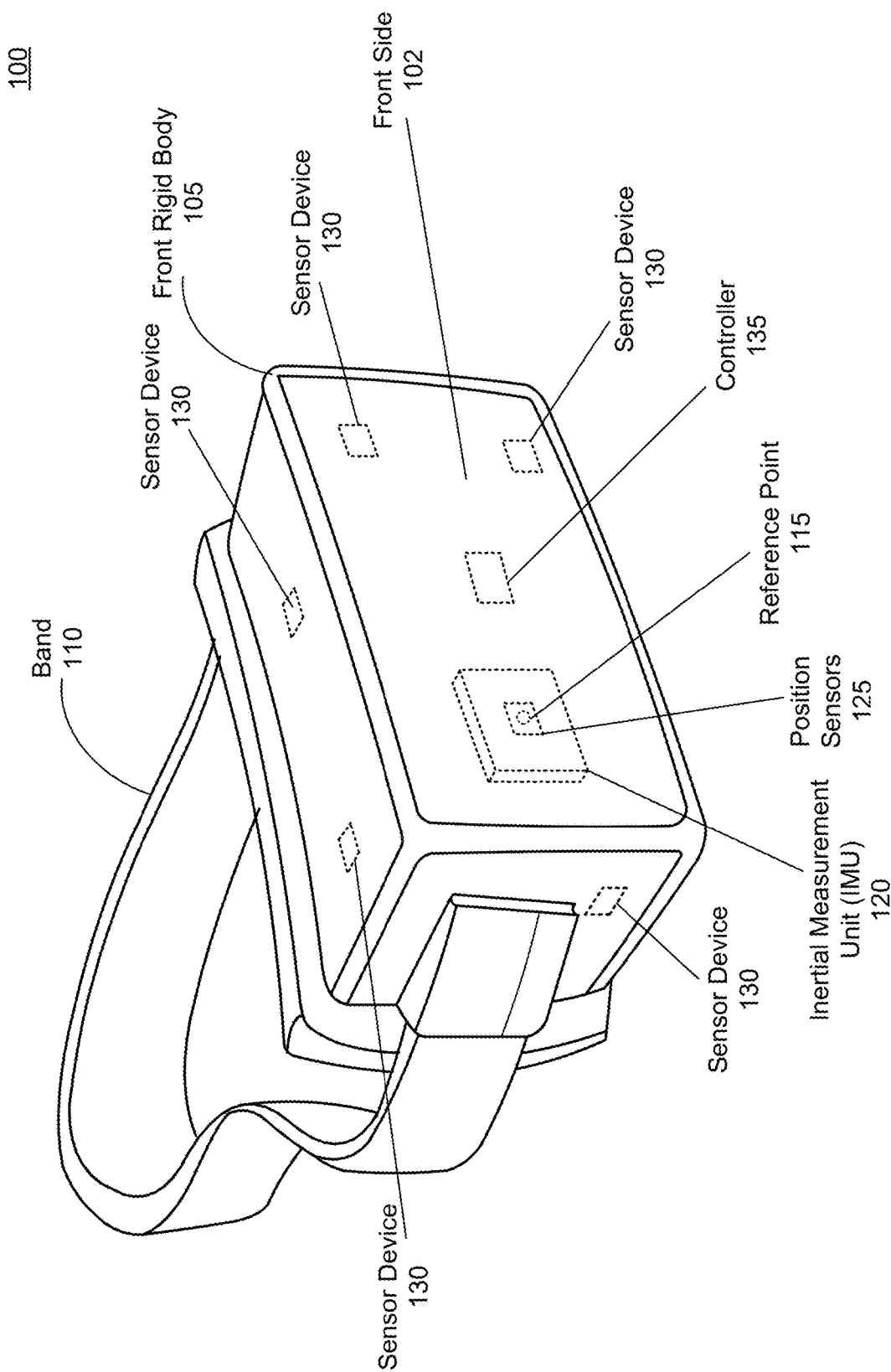
FIG. 1A is a diagram of a head-mounted display (HMD), in accordance with one or more examples of the present disclosure.

The figures depict examples of the present disclosure for purposes of illustration only. One skilled in the art will readily recognize from the following description that alternative examples of the structures and methods illustrated herein may be employed without departing from the principles, or benefits touted, of the disclosure described herein.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes an array of pixel cells. Each pixel cell includes a photodiode to sense incident light by converting photons into charge (e.g., electrons or holes). The charge generated by photodiodes of the array of pixel cells can then be quantized by an analog-to-digital converter (ADC) into digital values. The ADC can quantize the charge by, for example, using a comparator to compare a voltage representing the charge with one or more quantization levels, and a digital value can be generated based on the comparison result. The digital values can then be stored in a memory to generate the image.

The image data from an image sensor can support various wearable applications, such as fusion of 2D and 3D sensing, object recognition and tracking, or location tracking. These applications can extract feature information from a subset of pixels of the image to perform computations. For example, to perform 3D sensing, an application can identify pixels of reflected structured light (e.g., dots), compare a pattern extracted from the pixels with the transmitted structured light, and perform depth computation based on the comparison. The application can also identify 2D pixel data from the same pixel cells that provide the extracted pattern of structured light to perform fusion of 2D and 3D sensing. To perform object recognition and tracking, an application can also identify pixels of image features of the object, extract the image features from the pixels, and perform the recognition and tracking based on the extraction results. These applications are typically executed on a host processor, which can be electrically connected with the image sensor and receive the pixel data via interconnects. The host processor, the image sensor, and the interconnects can be part of a wearable device, such as a head mounted display (HMD).

All these applications can benefit from high-resolution images and/or high frame rates. Higher-resolution images allow the application to extract more detailed features/patterns (e.g., more refined patterns of reflected structured light or more detailed image features), whereas providing images generated at a higher frame rate enables an application to track the location of an object, the location of the wearable device, etc., at a higher sampling rate, both of which can improve the performances of the applications.

However, high-resolution images and high frame rates can lead to generation, transmission, and processing of a large volume of pixel data, which can present numerous challenges. For example, transmitting and processing a large volume of pixel data at a high data rate can lead to high power consumption at the image sensor, the interconnect, and the host processor. Moreover, the image sensor and the host processor may impose bandwidth limitations on and add latency to the generation and processing of large volumes of pixel data. The high power and high bandwidth requirement can be especially problematic for a wearable device which tends to operate with relatively low power and at a relatively low speed due to form factor and safety considerations.

This disclosure relates to an image sensor having on-chip compute circuits that can address at least some of the issues above. In some examples, an image sensor assembly comprises a first sensor layer, of a plurality of stacked sensor layers, including an array of pixel cells; and one or more semiconductor layers of the plurality of stacked sensor layers located beneath the first sensor layer. The first sensor layer can include photodiodes to convert light to charge and ADC to quantize the charge to pixel data, whereas the one or more semiconductor layers comprise on-chip compute circuits configured to process the pixel data. The one or more semiconductor layers may include a machine learning (ML) model accelerator configured to implement a convolutional neural network (CNN) model to process the pixel data; a first memory to store coefficients of the CNN model and instruction codes; a second memory to store the pixel data of a frame; and a controller configured to execute the codes to control operations of the ML model accelerator, the first memory, and the second memory. The processing may include, for example, feature extraction or object detection. The image sensor assembly can be part of a mobile device, such as an HMD. The HMD displays content to a user wearing the HMD. The HMD may be part of an artificial reality system, and the displayed content can be based on the result of processing of the captured images.

The image sensor assembly can be housed within a chip package forming a chip, with interconnects (e.g., through silicon vias (TSV)) providing electrical connection between the stacked sensor layers to, for example, transmit pixel data from the first sensor layer to the on-chip compute circuits of the one or more semiconductor layers. Compared with an arrangement where pixel data are transmitted off-chip, providing on-chip compute circuits to process the pixel data allows the pixel data to be transmitted within the chip, which can reduce the power consumption and increase the speed of the pixel data transmission.

In some examples, the on-chip compute circuits may include a controller to control the image sensing operations of the array of pixel cells based on the result of processing of the pixel data. For example, the controller can control the array of pixel cells to perform a sparse image sensing operation, in which a subset of the array of pixel cells is enabled to perform an image sensing operation to generate pixel data, whereas the rest of the pixel cells are disabled or to generate pixel data of lower precisions. The controller can determine, based on the result of processing, regions of interest that are likely to contain certain features, or an object of interest in an image captured by the array of pixel cells, and identify the subset of the array of pixel cells based on the image locations of the regions of interest. The on-chip compute circuits, together with the array of pixel cells, can form a feedback loop to continuously update the image locations of the regions of interest based on the captured images, to enable sparse image sensing operations on a changing scene due to, for example, relative movements between the object of interest and the image sensor assembly.

With sparse image sensing operation, only a subset of pixel cells are enabled to generate useful pixel data. Such arrangements can reduce the power and computation and memory resources consumed by the array of pixel cells in the image sensing operations, as well as the transmission of the pixel data. Moreover, the image sensing operations can be made more efficient, as waste of power and resources in generation and transmission of pixel data not useful for the consuming application can be reduced. The efficiency can be further improved by having an on-chip compute circuit to process the image data and adjust the sparse image sensing operations dynamically, as the adjustment can be sped up without moving the pixel data off-chip. All these can improve the performance of the image sensor, especially within the power and resource constraint imposed by a wearable device, as well as the applications that rely on the outputs of the image sensor.

Various techniques are proposed to further reduce the computing and memory power of the image sensor assembly, to improve privacy and security of image data generated by the image sensor assembly, and to customize the image sensor assembly for different users, all of which can improve the performance of the image sensor assembly and improve user experience.

Specifically, to reduce power consumption, the controller may disable part of the on-chip compute circuits during the exposure period in which the array of pixel cells performs the image sensing operation and enable the part of the on-chip compute circuits after the image sensing operation completes to process the pixel data. For example, the second memory that stores pixel data can be powered down during the exposure period when the photodiodes of the pixel cells are still generating charge. But the second memory can be powered up after the exposure period ends to store the pixel data generated by the ADC from quantizing the charge. In some examples, the first memory, which stores the coefficients of the machine learning model and the codes, can also be disabled. The first memory can be implemented using various kinds of non-volatile memory devices, such as magnetoresistive random access memory (MRAM), resistive random-access memory (RRAM), or phase-change memory (PCM), to avoid losing the coefficients and the codes when the first memory is powered down.

In addition, the on-chip compute circuit may include processing circuits to perform the processing of the pixel data. The processing circuits may include, for example, a digital signal processor (DSP) or a neural network accelerator. In some examples, to reduce the workload of the DSP and the neural network accelerator, which can reduce power and free up computation resources for other tasks, the second memory can be configured to support in-memory compute operations, such as a matrix transpose operation, a matrix re-shaping operation, or a matrix multiplication operation. In some examples, the second memory may include an array of memristor to support matrix multiplications. In some examples, the second memory can also include circuits to perform a logical AND and a logical NOR operation between elements of two matrices (e.g., two matrices representing the pixel data or intermediate outputs of a layer and coefficients), and a memory controller can manipulate the logical AND logical NOR operation results to generate multiplication and/or summation between the vectors. The operation results can also be used to determine a degree of similarity between the vectors to support, for example, feature extraction operations.

In addition, the on-chip compute circuits may process sparse images captured by the array of pixel cells, which may perform sparse image processing operations based on the processing outputs of the on-chip compute circuits on previous images. Various techniques are proposed to reduce the computing and memory power involved in the sparse image processing operations. In some examples, zero entries and non-zero entries of a matrix can be stored in different forms and using different number of bits in the memory. Moreover, the processing circuits can include zero skip circuits to recognize a zero entry of a matrix and skip arithmetic operations (e.g., additions and multiplications) on the zero entry. In some examples, a gating model can be used to select a subset of pixels of an image (which may or may not be a sparse image) for processing by the processing circuits. The gating model can be generated from various sources such as statistical analysis or training and can be dynamic and data-dependent. The gating model can include a base model representing a general distribution of pixels of interest in a scene under a particular operating condition and a user-specific model reflecting the actual distribution of pixels in a scene captured by a specific sensor system. These arrangements can reduce the volume of pixel data processed by the processing circuits, while providing relevant pixel data to the processing circuits for processing to improve efficiency.

In some examples, the memory of the on-chip compute circuits can also be configured to improve privacy and security of image data generated by the image sensor assembly and to support customization of the image sensor assembly for different users. For example, the memory can include an MRAM device, which can be used to generate random numbers to support encryption of the pixel data stored in the memory. In addition, the memory can also support training operations to customize the machine learning model of the image sensor assembly. The training operation can include ex-situ training to train a base machine learning model for feature extraction and in-situ training to further customize the base machine learning model. The ex-situ training may occur in the cloud but may not involve images captured specific wearable devices operated by the users, to avoid transmission of images taken by the users, which can cause privacy issues. On the other hand, the in-situ training may occur at the user's wearable devices based on images taken by the user, to customize the machine learning model for different users. The training can be performed using an array of memristors, where the weights stored in the array of memristors can be updated based on the training outputs. The memory can also include MRAM devices to generate random numbers to support reinforced learning, which can be part of the in-situ training.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an HMD 100, in accordance with one or more examples. The HMD 100 may be part of an artificial reality system. In examples that describe AR system and/or an MR system, portions of a front side 102 of the HMD 100 are at least partially transparent in the visible band (~380 nm to 750 nm), and portions of the HMD 100 that are between the front side 102 of the HMD 100 and an eye of the user are at least partially transparent (e.g., a partially transparent electronic display). The HMD 100 includes a front rigid body 105, a band 110, and a reference point 115.

The front rigid body 105 includes one or more electronic display elements (not shown in FIG. 1A), one or more integrated eye tracking systems (not shown in FIG. 1A), an Inertial Measurement Unit (IMU) 120, one or more position sensors 125, and the reference point 115. In the embodiment shown by FIG. 1A, the position sensors 125 are located within the IMU 120, and neither the IMU 120 nor the position sensors 125 are visible to a user of the HMD 100. The IMU 120 is an electronic device that generates IMU data based on measurement signals received from one or more of the position sensors 125. A position sensor 125 generates one or more measurement signals in response to motion of the HMD 100. Examples of position sensors 125 include: one or more accelerometers, one or more gyroscopes, one or more magnetometers, another suitable type of sensor that detects motion, a type of sensor used for error correction of the IMU 120, or some combination thereof. The position sensors 125 may be located external to the IMU 120, internal to the IMU 120, or some combination thereof.

The HMD 100 includes a distributed network of sensor devices (cameras) 130, which may be embedded into the front rigid body 105. Note that, although not shown in FIG. 1A, at least one sensor device 130 may be also embedded into the band 110. Each sensor device 130 may be implemented as a camera of a relatively small size. The distributed network of sensor devices 130 may replace a plurality of large conventional cameras. In some examples, each sensor device 130 of the distributed network embedded in the HMD 100 is implemented as a tiny chip camera with a limited predefined resolution, e.g., each sensor device 130 may include an array of 100×100 pixels or an array of 200×200 pixels. In some examples, each sensor device 130 in the distributed network has a field-of-view that does not overlap with a field-of-view of any other sensor device 130 integrated into the HMD 100. This is in contrast to overlapping field-of-views of large conventional cameras, which may cause capturing a large amount of overlapping data from a surrounding area. The HMD 100 may also include an imaging aperture associated with each sensor device 130 (not shown in FIG. 1A). A sensor device 130 may capture light reflected from the surrounding area through the imaging aperture.

Note that it would be impractical for each sensor device 130 in the distributed network of sensor devices 130 to have its own direct link (bus) to a central processing unit (CPU) or a controller 135 embedded into the HMD 100. Instead, each individual sensor device 130 may be coupled to the controller 135 via a shared bus (not shown in FIG. 1A) in a scalable manner, thus providing a scalable network of sensor devices 130 embedded into the HMD 100. The scalable network of sensor devices 130 can be viewed as a redundant system. Combined together, the sensor devices 130 cover a much larger field-of-view (e.g., 360 degrees) than typically deployed by large conventional cameras (e.g., 180 degrees). The wider field-of-view obtained by the sensor devices 130 provides increased robustness.

Note that it is not required to always keep active (i.e., turned on) all the sensor devices 130 embedded into the HMD 100. In some examples, the controller 135 is configured to dynamically activate a first subset of the sensor devices 130 and deactivate a second subset of the sensor devices 130, e.g., based on a specific situation. In one or more examples, depending on a particular simulation running on the HMD 100, the controller 135 may deactivate a certain portion of the sensor devices 130. For example, after locating a preferred part of an environment for scanning, specific sensor devices 130 can remain active, whereas other sensor devices 130 can be deactivated in order to save power dissipated by the distributed network of sensor devices 130.

A sensor device 130 or a group of sensor devices 130 can, e.g., track, during a time period, one or more moving objects and specific features related to the one or more moving objects. The features related to the moving objects obtained during the time period may be then passed to another sensor device 130 or another group of sensor devices 130 for continuous tracking during a following time period, e.g., based on instructions from the controller 135. For example, the HMD 100 may use the extracted features in the scene as a "land marker" for user localization and head pose tracking in a three-dimensional world. A feature associated with a user's head may be extracted by, e.g., one sensor device 130 at a time instant. In a next time instant, the user's head may move and another sensor device 130 may be activated to locate the same feature for performing head tracking. The controller 135 may be configured to predict which new sensor device 130 could potentially capture the same feature of a moving object (e.g., the user's head). In one or more examples, the controller 135 may utilize the IMU data obtained by the IMU 120 to perform coarse prediction. In this scenario, information about the tracked feature may be passed from one sensor device 130 to another sensor device 130, e.g., based on the coarse prediction. A number of active sensor devices 130 may be dynamically adjusted (e.g., based on instructions from the controller 135) in accordance with a specific task performed at a particular time instant. Furthermore, one sensor device 130 can perform an extraction of a particular feature of an environment and provide extracted feature data to the controller 135 for further processing and passing to another sensor device 130. Thus, each sensor device 130 in the distributed network of sensor devices 130 may process a limited amount of data. In contrast, conventional sensor devices integrated into an HMD system typically perform continuous processing of large amounts of data, which consumes much more power.

In some examples, each sensor device 130 integrated into the HMD 100 can be configured for a specific type of processing. For example, at least one sensor device 130 can be customized for tracking various features of an environment, e.g., determining sharp corners or hand tracking. Furthermore, each sensor device 130 can be customized to detect one or more particular landmark features, while ignoring other features. In some examples, each sensor device 130 can perform early processing that provides information about a particular feature, e.g., coordinates of a feature and feature description. To support the early processing, certain processing circuitry may be incorporated into the sensor device 130, as discussed in more detail in conjunction with FIGS. 2-5. The sensor device 130 can then pass, e.g., to the controller 135, data obtained based upon the early processing, thus reducing an amount of data being communicated between the sensor device 130 and the controller 135. In this way, a frame rate of the sensor device 130 can increase while preserving a bandwidth requirement between the sensor device 130 and the controller 135. Furthermore, power dissipation and processing latency of the controller 135 can be reduced as partial processing is performed at the sensor device 130 and computational burden of the controller 135 is reduced and distributed to one or more sensor devices 130. Another advantage of the partial and early processing performed at the sensor device 130 includes reduction in memory requirement for storage of image frames on an internal memory of the controller 135 (not shown in FIG. 1A). Additionally, power consumption at the controller 135 may be reduced as less memory access leads to a lower power dissipation.

In an embodiment, a sensor device 130 can include an array of 100×100 pixels or an array of 200×200 pixels coupled to processing circuitry customized for extracting of, e.g., up to 10 features of an environment surrounding some or all of the HMD 100. In another embodiment, processing circuitry of a sensor device 130 can be customized to operate as a neural network trained to track, e.g., up to 20 joint locations of a user's hand, which may be required for performing accurate hand tracking. In yet other embodiment, at least one sensor device 130 can be employed for face tracking where, e.g., a user's mouth and facial movements can be captured. In this case, the at least one sensor device 130 can be oriented downward to facilitate tracking of user's facial features.

Note that each sensor device 130 integrated into the HMD 100 may provide a level of signal-to-noise ratio (SNR) above a threshold level defined for that sensor device 130. Because a sensor device 130 is customized for a particular task, sensitivity of the customized sensor device 130 can be improved in comparison with conventional cameras. Also note that the distributed network of sensor devices 130 is a redundant system and it is possible to select (e.g., by the controller 135) a sensor device 130 of the distributed network that produces a preferred level of SNR. In this manner, tracking accuracy and robustness of the distributed network of sensor devices 130 can be greatly improved. Each sensor device 130 may also be configured to operate in an extended wavelength range, e.g., in the infrared and/or visible spectrum.

In some examples, a sensor device 130 includes a photodetector layer with an array of silicon-based photodiodes. In alternate examples, a photodetector layer of a sensor device 130 can be implemented using a material and technology that is not silicon based, which may provide improved sensitivity and wavelength range. In one embodiment, a photodetector layer of a sensor device 130 is based on an organic photonic film (OPF) photodetector material suitable for capturing light having wavelengths larger than 1000 nm. In another embodiment, a photodetector layer of a sensor device 130 is based on Quantum Dot (QD) photodetector material. A QD-based sensor device 130 can be suitable for, e.g., integration into AR systems and applications related to outdoor environments at low visibility (e.g., at night). Available ambient light is then mostly located in the long wavelength non-visible range between, e.g., approximately 1 µm and 2.5 µm, i.e., in the short wave infrared range. The photodetector layer of the sensor device 130 implemented based on an optimized QD film can detect both visible and short wave infrared light, whereas the silicon based film may be sensitive only to wavelengths of light around approximately 1.1 µm.

In some examples, the controller 135 embedded into the front rigid body 105 and coupled to the sensor devices 130 of the distributed sensor network is configured to combine captured information from the sensor devices 130. The controller 135 may be configured to properly integrate data associated with different features collected by different sensor devices 130. In some examples, the controller 135 determines depth information for one or more objects in a local area surrounding some or all of the HMD 100, based on the data captured by one or more of the sensor devices 130.

Figure 1B:
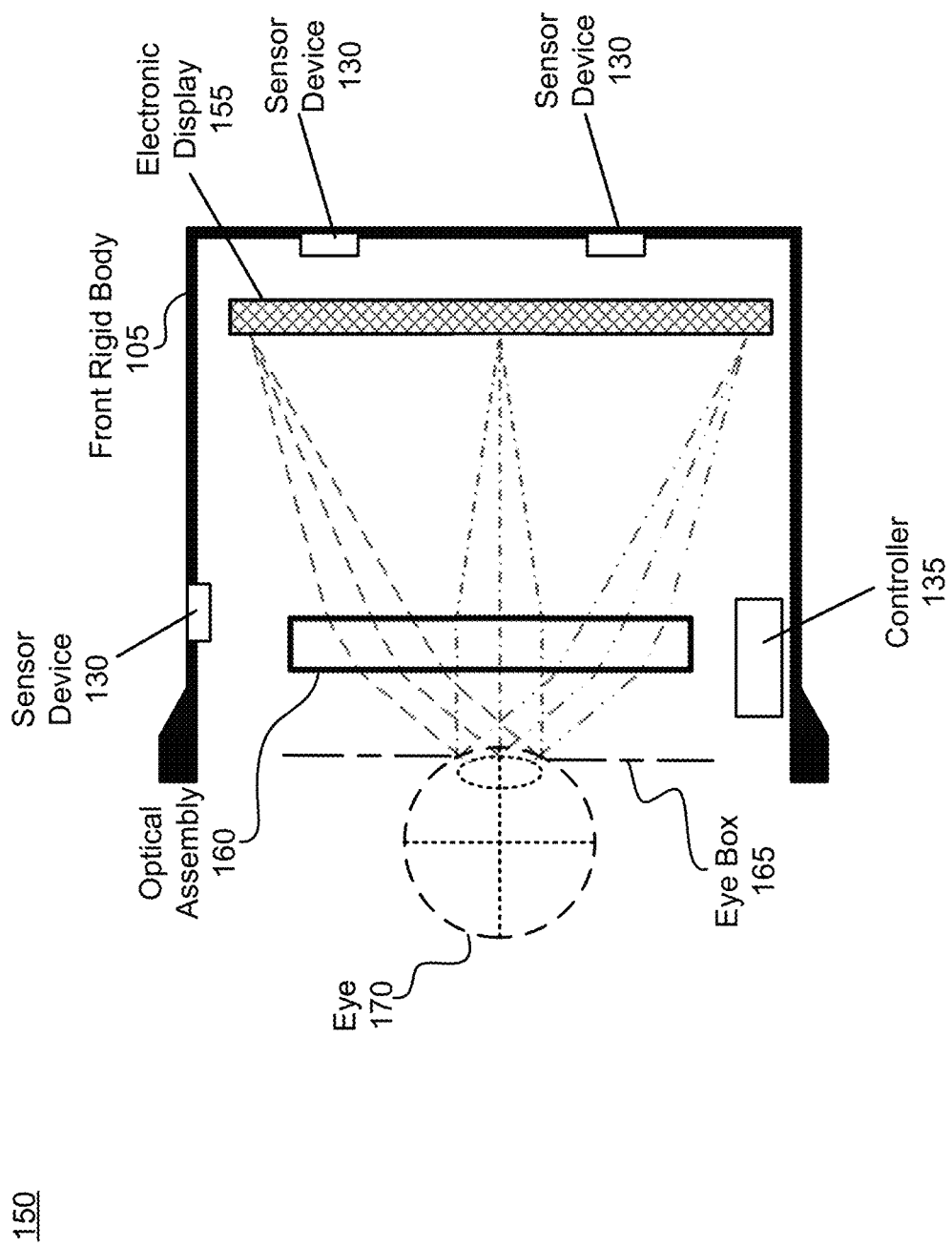
FIG. 1B is a cross section of a front rigid body of the HMD in FIG. 1A, in accordance with one or more examples of the present disclosure.

FIG. 1B is a cross section 150 of the front rigid body 105 of the HMD 100 shown in FIG. 1A, in accordance with one or more examples. The front rigid body 105 includes the sensor devices 130, the controller 135 coupled to the sensor devices 130, an electronic display 155 and an optical assembly 160. The electronic display 155 and the optical assembly 160 together provide image light to an eye box 165. The eye box 165 is a region in space that is occupied by a user's eye 170. For purposes of illustration, FIG. 1B shows a cross section 150 associated with a single eye 170, but another optical assembly 160, separate from the optical assembly 160 shown in FIG. 1B, provides altered image light to another eye of the user.

The electronic display 155 emits image light toward the optical assembly 160. In various examples, the electronic display 155 may comprise a single electronic display or multiple electronic displays (e.g., a display for each eye of a user). Examples of the electronic display 155 include: a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, some other display, a projector, or some combination thereof. The electronic display 155 may also include an aperture, a Fresnel lens, a convex lens, a concave lens, a diffractive element, a waveguide, a filter, a polarizer, a diffuser, a fiber taper, a reflective surface, a polarizing reflective surface, or any other suitable optical element that affects the image light emitted from the electronic display 155. In some examples, the electronic display 155 may have one or more coatings, such as anti-reflective coatings.

The optical assembly 160 receives image light emitted from the electronic display 155 and directs the image light to the eye box 165 of the user's eye 170. The optical assembly 160 also magnifies the received image light, corrects optical aberrations associated with the image light, and the corrected image light is presented to a user of the HMD 100. In some examples, the optical assembly 160 includes a collimation element (lens) for collimating beams of image light emitted from the electronic display 155. At least one optical element of the optical assembly 160 may be an aperture, a Fresnel lens, a refractive lens, a reflective surface, a diffractive element, a waveguide, a filter, or any other suitable optical element that affects image light emitted from the electronic display 155. Moreover, the optical assembly 160 may include combinations of different optical elements. In some examples, one or more of the optical elements in the optical assembly 160 may have one or more coatings, such as anti-reflective coatings or dichroic coatings. Magnification of the image light by the optical assembly 160 allows elements of the electronic display 155 to be physically smaller, weigh less, and consume less power than larger displays. Additionally, magnification may increase a field-of-view of the displayed media. For example, the field-of-view of the displayed media is such that the displayed media is presented using almost all (e.g., 110 degrees diagonal), and in some cases all, of the user's field-of-view. In some examples, the optical assembly 160 is designed so its effective focal length is larger than the spacing to the electronic display 155, which magnifies the image light projected by the electronic display 155. Additionally, in some examples, the amount of magnification may be adjusted by adding or removing optical elements.

In some examples, the front rigid body 105 further comprises an eye tracking system (not shown in FIG. 1B) that determines eye tracking information for the user's eye 170. The determined eye tracking information may comprise information about a position (including orientation) of the user's eye 170 in the eye box 165, i.e., information about an angle of an eye-gaze. In one embodiment, the eye tracking system illuminates the user's eye 170 with structured light. The eye tracking system can determine the position of the user's eye 170 based on deformations in a pattern of structured light reflected from a surface of the user's eye and captured by a camera of the eye tracking system. In another embodiment, the eye tracking system determines the position of the user's eye 170 based on magnitudes of image light captured over a plurality of time instants.

In some examples, the front rigid body 105 further comprises a varifocal module (not shown in FIG. 1B). The varifocal module may adjust focus of one or more images displayed on the electronic display 155, based on the eye tracking information obtained from the eye tracking system. In one embodiment, the varifocal module adjusts focus of the displayed images and mitigates vergence-accommodation conflict by adjusting a focal distance of the optical assembly 160 based on the determined eye tracking information. In other embodiment, the varifocal module adjusts focus of the displayed images by performing foveated rendering of the one or more images based on the determined eye tracking information.

Figure 2:
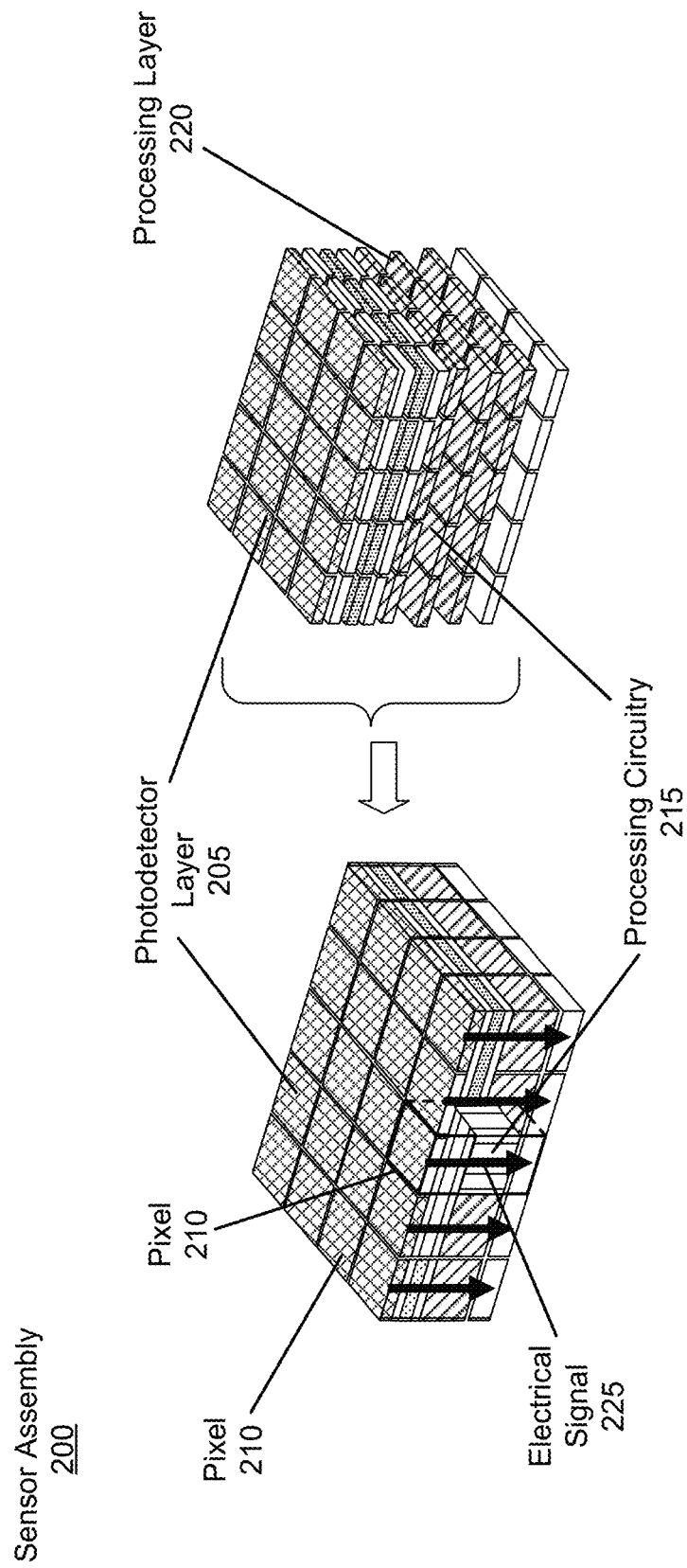
FIG. 2 is a cross-sectional view of a stacked sensor system with a plurality of stacked sensor layers, which may be part of the HMD in FIG. 1A, in accordance with one or more examples of the present disclosure.

FIG. 2 is a cross-sectional view of a sensor assembly 200 with a plurality of stacked sensor layers, in accordance with one or more examples. The sensor assembly 200 may be an embodiment of a sensor device 130 of the HMD 100 in FIG. 1A. In some examples, the sensor assembly 200 includes a plurality of layers of silicon stacked on top of each other. In alternate examples, at least one layer in the plurality of stacked sensor layers of the sensor assembly 200 is implemented based on a non-silicon photo-detection material. A top sensor layer in the sensor assembly 200 may be customized for photo-detection and can be referred to as a photodetector layer 205. The photodetector layer 205 may comprise a two-dimensional array of pixel cells 210. Each pixel 210 of the photodetector layer 205 may be directly coupled, e.g., via copper bonding (not shown in FIG. 2), with processing circuitry 215 of a processing layer 220 located within the sensor assembly 200 beneath the photodetector layer 205.

Stacking of multiple sensor layers (wafers) as shown in FIG. 2 allows copper bonding between the photodetector layer 205 and the processing layer 220 on per pixel resolution. By putting two wafers face to face, a copper pad connection from one wafer in the sensor assembly 200 to another wafer in the sensor assembly 200 can be made at per pixel level, i.e., an electrical signal 225 corresponding to a single pixel can be sent from the photodetector layer 205 to the processing circuitry 215 of the processing layer 220. In one or more examples, an interconnection between the processing layer 220 and at least one other layer in a multiple stacked structure of the sensor assembly 200 can be achieved using, e.g., "through silicon via" (TSV) technology. Due to TSV's geometry size (e.g., around 10 µm), the interconnection between the processing layer 220 and the at least one other layer of the sensor assembly 200 is not at a pixel level, but can still be very dense. In some examples, more miniaturized TSVs (e.g., micro-TSV) with a pitch similar at 1 micrometer or below can also be used between processing layer 220 and the at least one other layer of the sensor assembly 200 to allow for a finer three-dimensional connection.

In some examples, by employing wafer scaling, the sensor assembly 200 of a small size can be efficiently implemented. For example, a wafer of the photodetector layer 205 can be implemented using, e.g., 45 nm process technology, whereas a wafer of the processing layer 220 can be implemented using more advanced process technology, e.g., 28 nm or smaller process technology. Since a transistor in the 28 nm process technology occupies a very small area, a large number of transistors can be fit into a small area of the processing layer 220. In the illustrative embodiment, the sensor assembly 200 can be implemented as a cube of 1 mm×1 mm×1 mm having a power dissipation of approximately 10 mW. In comparison, conventional sensors (cameras) comprise a photodetector pixel array and processing circuitry implemented on a single silicon layer, and a total sensor area is determined as a sum of areas of all functional blocks. Without the benefit of vertical stacking as in the embodiment shown in FIG. 2, the conventional sensors occupy much larger areas than the sensor assembly 200.

Figure 3A:
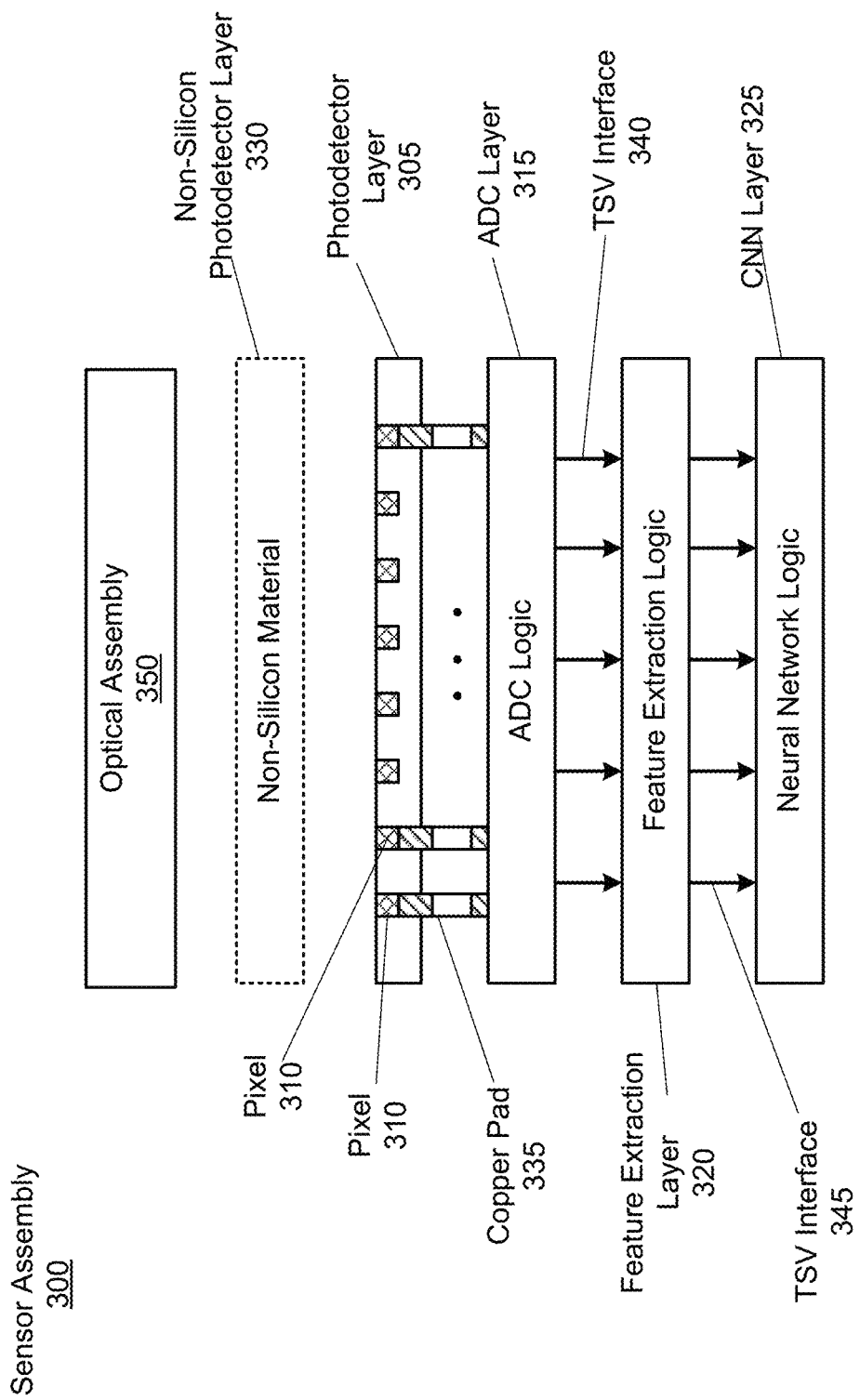
FIG. 3A and FIG. 3B are detailed view of a plurality of stacked sensor layers, which may be part of the stacked sensor system in FIG. 2, and their operations, in accordance with one or more examples of the present disclosure.

FIG. 3A is a detailed view of a sensor assembly 300 comprising a plurality of stacked sensor layers, in accordance with one or more examples. The sensor assembly 300 may be an embodiment of the sensor device 130 in FIG. 1A and an embodiment of the sensor assembly 200 in FIG. 2. In some examples, a photodetector layer 305 may be positioned on top of the sensor assembly 300 and may comprise an array of pixel cells 310, e.g., a two-dimensional array of photodiodes. As processing circuitry of the sensor assembly 300 can be integrated into other layers beneath the photodetector layer 305, the photodetector layer 305 can be customized only for photo-detection. Thus, an area of the photodetector layer 305 can be relatively small, and the photodetector layer 305 may dissipate a limited amount of power. In some examples, an ADC layer 315 customized for conversion of analog signals (e.g., intensities of light captured by the photodetector layer 305) into digital data may be placed immediately beneath the photodetector layer 305. The ADC layer 315 may be configured to convert (e.g., by its processing circuitry or ADC logic, details not shown in FIG. 3) analog values of light intensities captured by the pixels 310 of the photodetector layer 305 into digital values corresponding to, e.g., image frame data. The ADC layer 315 may also include a memory (not shown in FIG. 3) for storing the digital values obtained after the conversion.

In some examples, a feature extraction layer 320 with processing circuitry customized for feature extraction may be placed immediately beneath the ADC layer 315. The feature extraction layer 320 may also include a memory for storing, e.g., digital sensor data generated by the ADC layer 315. The feature extraction layer 320 may be configured to extract one or more features from the digital sensor data obtained from the ADC layer 315. As the feature extraction layer 320 is customized for extracting specific features, the feature extraction layer 320 may be efficiently designed to occupy a small area size and dissipate a limited amount of power. More details about the feature extraction layer 320 are provided in conjunction with FIG. 4.

In some examples, a convolutional neural network (CNN) layer 325 may be placed immediately beneath the feature extraction layer 320, or in the same layer as the processing circuitry of feature extraction. A neural network logic of the CNN layer 325 may be trained and optimized for particular input data, e.g., data with information about a specific feature or a set of features obtained by the feature extraction layer 320. As the input data are fully expected, the neural network logic of the CNN layer 325 may be efficiently implemented and customized for a specific type of feature extraction data, resulting into a reduced processing latency and lower power dissipation.

In some examples, the CNN layer 325 is designed to perform image classification and recognition applications. Training of the neural network logic of the CNN layer 325 may be performed offline, and network weights in the neural network logic of the CNN layer 325 may be trained prior to utilizing the CNN layer 325 for image classification and recognition. In one or more examples, the CNN layer 325 is implemented to perform inference, i.e., to apply the trained network weights to an input image to determine an output, e.g., an image classifier. In contrast to designing a generic CNN architecture, the CNN layer 325 may be implemented as a custom and dedicated neural network and can be designed for a preferred level of power dissipation, area size and efficiency (computational speed).

Figure 3B:
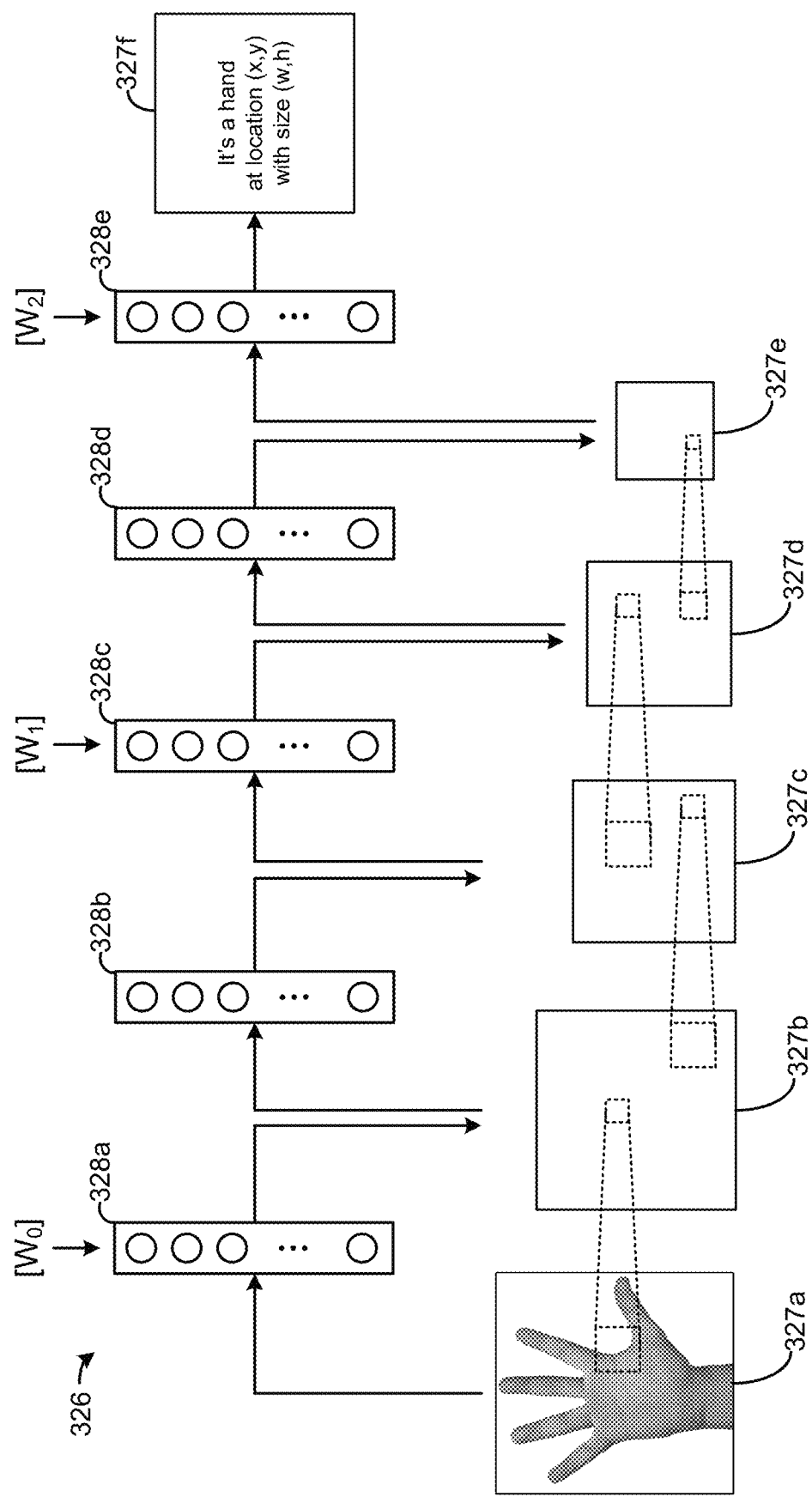

FIG. 3B illustrates an example architecture of CNN 326 that can be implemented in CNN layer 325. CNN 326 may include four main operations: (1) convolution; (2) non-linearity function (e.g., ReLU); (3) pooling or sub-sampling; and (4) classification (fully-connected layer). These operations may be the basic building blocks of every convolutional neural network. Different CNNs may have different combinations of these four main operations.

An image to be classified, such as input image 327a, may be represented by a matrix of pixel values. Input image 327a may include multiple channels, each channel representing a certain component of the image. For example, an image from a digital camera may have a red channel, a green channel, and a blue channel. Each channel may be represented by a 2-D matrix of pixels having pixel values in the range of 0 to 255 (i.e., 8-bit). A gray-scale image may have only one channel. In the following description, the processing of a single image channel using CNN 326 is described. Other channels may be processed similarly.

As shown in FIG. 3B, input image 327a may be processed by a first convolution layer 328a using a first weight array (labelled [$W_0$] in FIG. 3B). First convolution layer 328a may include multiple nodes, with each node assigned to multiply a pixel of input image 327a with a weight in first weights array. As part of the convolution operation, blocks of pixels of input image 327a can be multiplied with first weights array to generate a sum. Each sum is then processed by a non-linear activation function (e.g., ReLU or software max) to generate an output, and the outputs can form an output matrix 327b. The first weights array can be used to, for example, extract certain basic features (e.g., edges) from input image 327a, and output matrix 327b can represent a distribution of the basic features as a basic feature map. Output matrix (or feature map) 327b may be passed to a pooling layer 328b, where output matrix 327b may be subsampled or down-sampled by pooling layer 328b to generate a matrix 327c.

Matrix 327c may be processed by a second convolution layer 328c using a second weights array (labelled [$W_1$] in FIG. 3B]. The second weights array can be used to, for example, identify patterns of features specific for an object, such as a hand, from matrix 327c. As part of the convolution operation, blocks of pixels of matrix 327c can be multiplied with the second weights array to generate a sum. Each sum is then processed by a non-linear activation function (e.g., ReLU or softmax) to generate an output, and the outputs can form an output matrix 327d. A non-linear activation function (e.g., ReLU) may also be performed by the second convolution layer 328c as in the first convolution layer 328a. An output matrix 327c (or feature map) from second convolution layer 328c may represent a distribution of features representing a hand. Output matrix 327d may be passed to a pooling layer 328d, where output matrix 327d may be subsampled or down-sampled to generate a matrix 327e.

Matrix 327e can then be passed through a fully-connected layer 328e, which can include a multi-layer perceptron (MLP). Fully-connected layer 328e can perform a classification operation based on matrix 327e (e.g., to classify whether the object in image 327a represents a hand). Fully-connected layer 328e can also multiply matrix 327e with a third weights array (labelled [$W_2$] in FIG. 3B) to generate sums, and the sums can also be processed by an activation function (e.g., ReLu or softmax) to generate a classification output 327f.

CNN 326 can be implemented in CNN layer 325 using various techniques. For example, as to be described below, CNN 326 can be implemented in machine learning hardware accelerator supported with in-memory compute. The in-memory compute can include, for example, performing read/write operations at a memory to perform matrix transpose or reshaping. In some examples, the in-memory compute can include matrix multiplication which can be performed by an array of memristors as to be described in FIG. 5.

In some examples, each sensor layer 305, 315, 320, 325 in the sensor assembly 300 customized for a particular processing task can be implemented using silicon-based technology. Alternatively, at least one of the sensor layers 305, 315, 320, 325 may be implemented based on a non-silicon photo-detection material, e.g., OPF photo-detection material and/or QD photo-detection material. In some examples, instead of the silicon-based photodetector layer 305 that includes the array of pixel cells 310 based on photodiodes, a non-silicon photodetector layer 330 can be placed on top of the sensor assembly 300. In one embodiment, the non-silicon photodetector layer 330 is implemented as a photodetector layer of QD photo-detection material and can be referred to as a QD photodetector layer. In some examples, the non-silicon photodetector layer 330 is implemented as a photodetector layer of OPF photo-detection material and can be referred to as an OPF photodetector layer. In some examples, more than one photodetector layer can be used for photo detection in the sensor assembly 300, e.g., at least one silicon-based photodetector layer 305 and at least one non-silicon based photodetector layer 330.

In some examples, a direct copper bonding can be used for inter-layer coupling between the photodetector layer 305 and the ADC layer 315. As shown in FIG. 3A, a copper pad 335 may be used as an interface between a pixel 310 in the photodetector layer 305 and processing circuitry (ADC logic) of the ADC layer 315. For example, in the case of photodetector layer 305 implemented as a 20M-pixel camera, up to approximately 20 Mega copper pad connections 335 may be implemented between the photodetector layer 305 and the processing circuitry of the ADC layer 315. Note that a pitch of the photodetector layer 305 can be relatively small, e.g., between approximately 1 μm and 2 μm.

In some examples, as discussed, interconnection between sensor layers located in the sensor assembly 300 beneath the photodetector layer 305 can be achieved using, e.g., TSV technology. Referring back to FIG. 3A, a TSV interface 340, which can include parallel TSVs and/or micro-TSVs, may interconnect the ADC logic/memory of the ADC layer 315 with the feature extraction logic of the feature extraction layer 320. The TSV interface 340 may provide digital sensor data obtained by the ADC layer 315 to the feature extraction layer 320 for extraction of one or more specific features, wherein the digital sensor data can be related to image data captured by the photodetector layer 305. Similarly, another TSV interface 345 may be used to interconnect the feature extraction logic of the feature extraction layer 320 with the neural network logic of the CNN layer 325. The TSV interface 345 may provide feature extraction data obtained by the feature extraction logic of the feature extraction layer 320 as inputs into the neural network logic of the CNN layer 325 for, e.g., image classification and/or recognition.

In some examples, an optical assembly 350 may be positioned on top of the silicon-based photodetector layer 305 (or the non-silicon based photodetector layer 330). The optical assembly 350 may be configured to direct at least a portion of light reflected from one or more objects in a local area surrounding the sensor assembly 300 to the pixels 310 of the silicon-based photodetector layer 305 (or sensor elements of the non-silicon based photodetector layer 330). In some examples, the optical assembly 350 can be implemented by stacking one or more layers of wafers (not shown in FIG. 3A) on top of the silicon-based photodetector layer 305 (or the non-silicon based photodetector layer 330). Each wafer of the optical assembly 350 may be implemented as a glass wafer and represents an individual lens element of the optical assembly 350. In one or more examples, a polymer-based material can be molded on a top surface and/or a bottom surface of the glass wafer to serve as a reflective surface of the individual lens element of the optical assembly 350. This technology can be referred to as the wafer level optics. Additionally, a spacer (not shown in FIG. 3A) can be included between a pair of adjacent glass wafers (layers) in the optical assembly 350 to adjust a space between the adjacent glass layers.

In some examples, all glass wafers of the optical assembly 350 and all silicon wafers of the sensor layers 305, 315, 320, 325 can be manufactured and stacked together before each individual sensor-lens unit is diced from a wafer stack to obtain one instantiation of the sensor assembly 300. Once the manufacturing is finished, each cube obtained from the wafer stack becomes a complete, fully functional camera, e.g., the sensor assembly 300 of FIG. 3A. It should be understood that the sensor assembly 300 does not require any plastic housing for the sensor layers 305, 315, 320, 325, which facilitates implementing the sensor assembly 300 as a cube of a predefined volume size smaller than a threshold volume.

In some examples, when the non-silicon based photodetector layer 330 (e.g., QD photodetector layer or OPF photodetector layer) is part of the sensor assembly 300, the non-silicon based photodetector layer 330 may be directly coupled to the ADC layer 315. Electrical connections between sensor elements (pixels) in the non-silicon based photodetector layer 330 and the ADC layer 315 may be made as copper pads. In this case, the non-silicon based photodetector layer 330 can be deposited on the ADC layer 315 after all the other sensor layers 315, 320, 325 are stacked. After the non-silicon based photodetector layer 330 is deposited on the ADC layer 315, the optical assembly 350 is applied on top of the non-silicon based photodetector layer 330.

Figure 4:
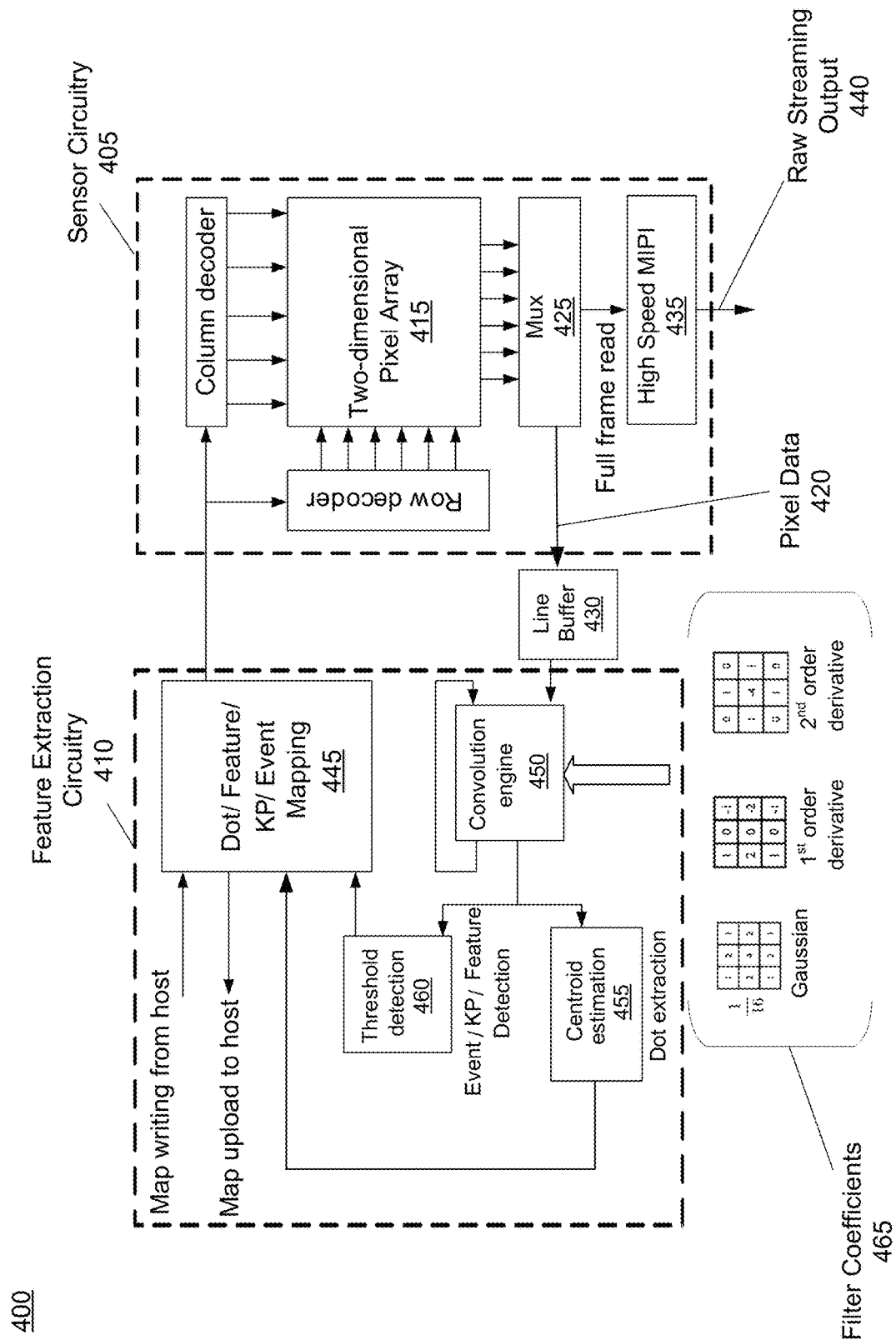
FIG. 4 is an example sensor architecture that consists of coupled sensor layers, which may be part of the stacked sensor system in FIG. 2, in accordance with one or more examples of the present disclosure.

FIG. 4 is an example sensor architecture 400 of coupled sensor layers in a stacked sensor assembly, in accordance with one or more examples. The sensor architecture 400 may include sensor circuitry 405 coupled to feature extraction circuitry 410, e.g., via TSV interface. The sensor architecture 400 may be implemented as part of at least two sensor layers of the sensor assembly 300 in FIG. 3. In some examples, the sensor circuitry 405 may be part of the photodetector layer 305 and the ADC layer 315, whereas the feature extraction circuitry 410 may be part of the feature extraction layer 320.

The sensor circuitry 405 may acquire and pre-process sensor data, before providing the acquired sensor data to the feature extraction circuitry 410, e.g., via a TSV interface. The sensor data may correspond to an image captured by a two-dimensional array of pixel cells 415, e.g., M×N array of digital pixels, where M and N are integers of same or different values. Note that the two-dimensional array of pixel cells 415 may be part of the photodetector layer 305 of the sensor assembly 300 of FIG. 3A. Furthermore, the two-dimensional array of pixel cells 415 may include per pixel interface with ADC logic (not shown in FIG. 4), which may be part of the ADC layer 315 of FIG. 3A. Pixel data 420 from an output of a multiplexer 425 may include digital sensor data related to the captured image. The pixel data 420 may be stored into a line buffer 430 and provided, e.g., via TSV interface, to the feature extraction circuitry 410 for extraction of one or more specific features. Note that a full frame read from the multiplexer 425 may be output via a high speed Mobile Industry Processor Interface (MIPI) 435 for producing a raw streaming output 440.

The feature extraction circuitry 410 may determine one or more features from the captured image represented by the pixel data 420. In the illustrative embodiment of FIG. 4, the feature extraction circuitry 410 includes a Dot/Feature/Key Point (KP)/Event mapping block 445, a convolution engine 450, a centroid estimation block 455, and a threshold detection block 460. The convolution engine 450 may process the pixel data 420 buffered in the line buffer 430 by applying, e.g., 3×3 convolution using various filter coefficients (kernels) 465, such as filter coefficients 465 for Gaussian filter, first order derivative, or second order derivative. The filtered data from the convolution engine 450 may be further fed into the threshold detection block 460 where a particular key feature or event in the captured image can be detected based on, e.g., filter and threshold settings. Location of the key feature/event determined by the threshold detection block 460 may be written into the mapping block 445. A map of one or more key features/events may be uploaded to, e.g., a host (not shown in FIG. 4); another map of key feature(s)/event(s) may be also written from the host to the mapping block 445. In an embodiment, the sensor architecture 400 can be used to measure depth information in a scene based on the structured light principle. In this case, a laser dot centroid can be extracted from the centroid estimation block 455, and the centroid may be written into the mapping block 445.

It should be understood that the sensor architecture 400 shown in FIG. 4 represents the illustrative embodiment. Other examples of the sensor circuitry 405 and/or the feature extraction circuitry 410 may include different and/or additional processing blocks.

Figure 5:
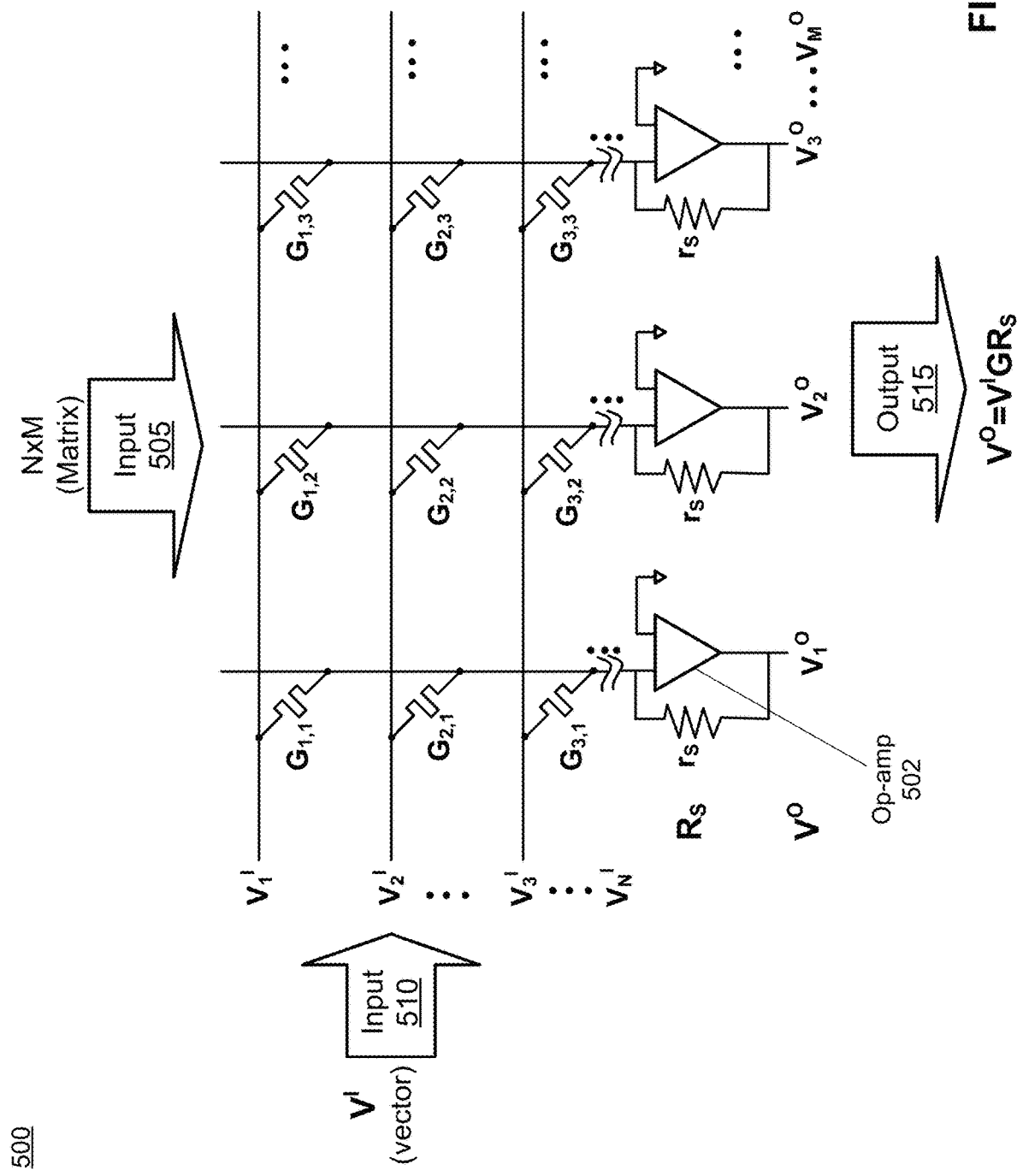
FIG. 5 is an example of a neural network based on an array of memristors, which may be part of the stacked sensor system in FIG. 2, in accordance with one or more examples of the present disclosure.

FIG. 5 illustrates an example of a neural network 500 based on an array of memristors, in accordance with one or more examples. The neural network 500 may be an embodiment of the neural network logic in the CNN layer 325 of the sensor assembly 300 of FIG. 3A. In some examples, the neural network 500 represents a CNN (e.g., CNN 326 of FIG. 3B) that is trained and utilized for certain processing based on machine learning algorithms, e.g., for image classification and/or recognition. Note that the feature extraction circuitry 410 of FIG. 4 and the neural network 500 can co-exist in an intelligent sensor system (e.g., the sensor assembly 300 of FIG. 3A) as more traditional computer vision algorithms, e.g., for depth extraction can be implemented on the feature extraction circuitry 410.

In some examples, the neural network 500 may be optimized for neuromorphic computing having a memristor crossbar suitable for performing vector-matrix multiplication. Learning in the neural network 500 is represented in accordance with a set of parameters that include values of conductance $G=G_{n,m}$ (n=1, 2, . . . , N; m=1, 2, . . . , M) and resistance $R_S$ (e.g., vector of M resistance values $r_S$) at cross-bar points of the neural network 500. An op-amp 502 and its associated resistor $r_S$ serves as an output driver and a column-wise weighting coefficient of each column of memristor elements, respectively.

In some examples, instead of fetching parameters from, e.g., a dynamic random-access memory (DRAM), the parameters in the form of conductance and resistance values are directly available at the cross-bar points of the neural network 500 and can be directly used during computation, e.g., during the vector-matrix multiplication. The neural network 500 based on the memristor crossbar shown in FIG. 5 can have a dual function, i.e., the neural network 500 can be employed as a memory storage device and as a computational device. The neural network 500 can be thus referred to as a "compute in memory implementation" having a preferred level of power dissipation, area size and computational efficiency. The neural network 500 can efficiently replace combination of a memory storage device and a CPU, which makes the neural network 500 suitable for efficient implementation as part of the CNN layer 325 of the sensor assembly 300 of FIG. 3A.

Initial weights of the neural network 500, $G_{n,m}$, can be written via an input 505 with values organized in, e.g., N rows and M columns, which may represent a matrix input. In one or more examples, the matrix input 505 may correspond to a kernel for a convolution operation. In some examples, an input 510 may correspond to digital pixel values of an image, e.g., captured by the photodetector layer 305 and processed by ADC layer 315 and the feature extraction layer 320 of the sensor assembly 300 of FIG. 3A. The input 510 may include digital voltage values $V^I$ organized into a vector of e.g., N voltage values $V_1^I, V_2^I, V_3^I, \ldots, V_N^I$. During inference operation, the vector input 510 may be applied into the matrix input 505. An output 515 may be obtained as a result of multiplication between the vector input 510 and the matrix input 505, i.e., as a result of the vector-matrix multiplication. As shown in FIG. 5, the output 515 represents a vector of digital voltage values $V^O$, i.e., M voltage values $V_1^O, V_2^O, V_3^O, \ldots, V_M^O$, where $V^O=V^I G R_S$. The output vector $V^O$ may be used for inference functions, such as object classification.

In some examples, the neural network 500 can be efficiently interfaced with the photodetector layer 305, the ADC layer 315 and the feature extraction layer 320 of the sensor assembly 300 of FIG. 3A, e.g., via the TSV interface 345 between the feature extraction layer 320 and the CNN layer 325 (i.e., the neural network 500). Furthermore, the neural network 500 implemented based on the memristor cross-bar may avoid parallel-to-serial and serial-to-parallel conversion of data, which simplifies implementation and increases processing speed. Alternatively, the neural network 500 may be used for image segmentation and sematic applications, which can be enabled with the memristor cross-bar of FIG. 5 with different sets of learned coefficients.

Figure 6:
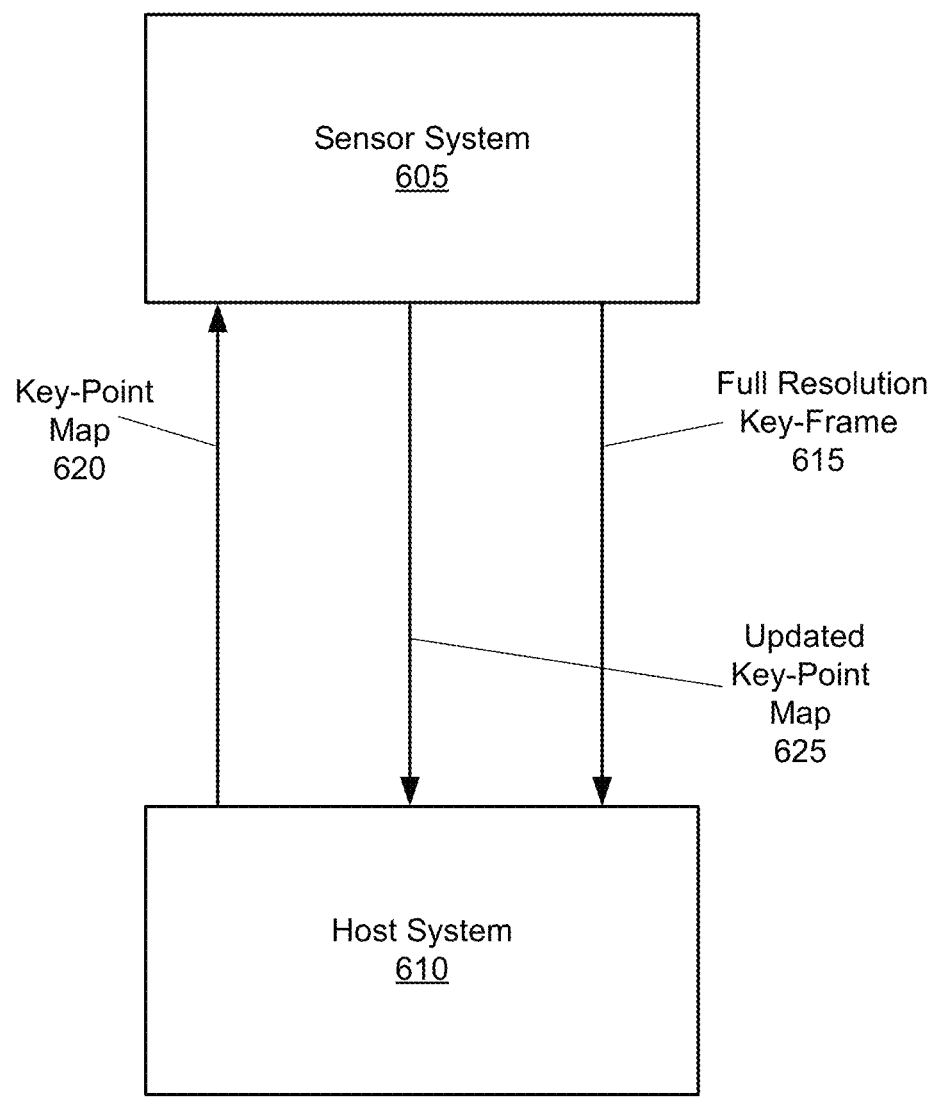
FIG. 6 is an example of a host-sensor closed loop system, in accordance with one or more examples of the present disclosure.

FIG. 6 is an example of a host-sensor closed loop system 600, in accordance with one or more embodiment. The host-sensor closed loop system 600 includes a sensor system 605 and a host system 610. The sensor system 605 can be an embodiment of the sensor device 130 in FIG. 1A, an embodiment of the sensor assembly 200 in FIG. 2 and/or an embodiment of the sensor assembly 300 in FIG. 3A; the host system 610 can be an embodiment of the controller 135 in FIG. 1A. In some examples, the sensor system 605 may obtain one or more key features of e.g., a captured image of at least portion of an environment. The sensor system 605 may initially provide the one or more key features to the host system 610 as full resolution key-frame(s) 615 at a rate of, e.g., 10 frames per second. Based on the processed one or more full resolution key-frames 615, the host system 610 may be configured to predict one or more key points representing, e.g., future locations of the one or more key features in next image frame(s). The host system 610 may then provide a key-point map 620 to the sensor system 605 at a rate of, e.g., 10 frames per second.

After receiving the key-point map 620, the sensor system 605 may activate a portion of pixels, e.g., that correspond to a vicinity of the predicted feature(s). The sensor system 605 would then capture and process only those intensities of light related to the activated portion of pixels. By activating only the portion of pixels and processing only a portion of intensity values captured by the activated portion of pixels, power dissipated by the sensor system 605 can be reduced. The sensor system 605 may derive one or more updated locations of the one or more key features. The sensor system 605 may then send the one or more updated locations of the one or more key features to the host system 610 as an updated key-point map 625 at an increased rate of, e.g., 100 frames per second since the updated key-point map 625 includes less data than the full resolution key-frame 615. The host system 610 may then process the updated key-point map 625 having a reduced amount of data in comparison with the full resolution key-frame 615, which provides saving in power dissipated at the host system 610 while a computational latency at the host system 610 is also decreased. In this manner, the sensor system 605 and the host system 610 form the host-sensor closed loop system 600 with predictive sparse capture. The host-sensor closed loop system 600 provides power savings at both the sensor system 605 and the host system 610 with an increased communication rate between the sensor system 605 and the host system 610.

Computing/Memory Power Reduction

In the following figures, example techniques are provided which can 1) reduce the computing and memory power of sensor system 605; 2) improve privacy and security of image data generated by sensor system 605; and 3) customize sensor system 605 for different users.

Figure 7A:
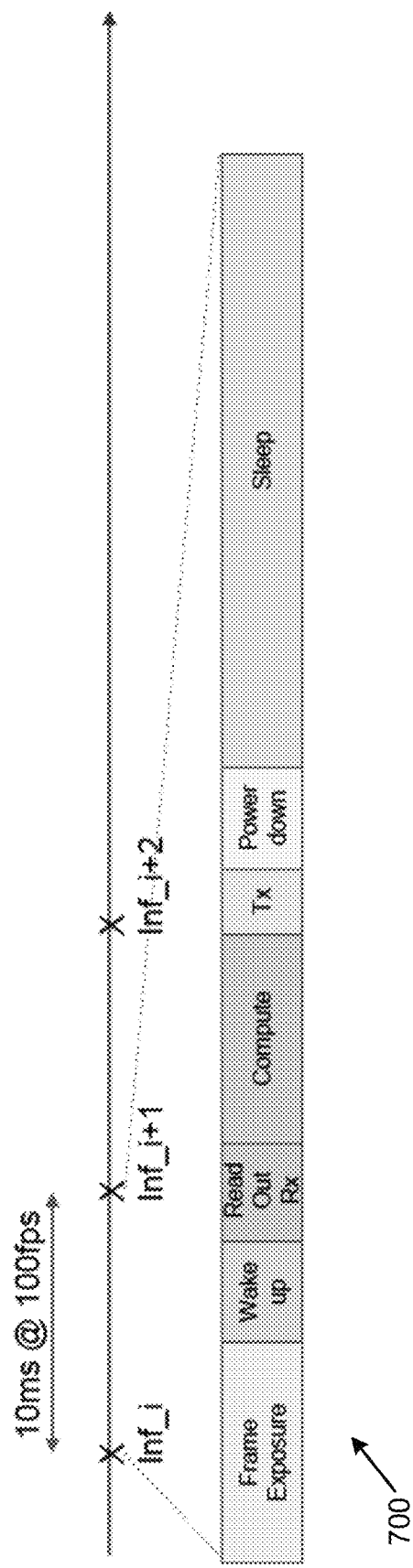
FIG. 7A, FIG. 7B, FIG. 7C, FIG. 7D, FIG. 7E, FIG. 7F, FIG. 7G, FIG. 7H, FIG. 7I, and FIG. 7J illustrate example components of sensor system of FIG. 6 and their operations, in accordance with one or more examples of the present disclosure.

FIG. 7A-FIG. 7J illustrate example techniques to reduce the computing and memory power of sensor system 605. FIG. 7A illustrates an example sequence of operations 700 of compute components of sensor system 605. Referring to FIG. 7A, within a frame period (e.g., between Inf_i and Inf_i+1), various compute components such as feature extraction logic in feature extraction layer 320 and neural network logic of CNN layer 325 can be turned on only within part of frame period. For example, the compute components can be in a sleep state during the frame exposure period and can be powered up after the frame exposure period ends to process the pixel data. After the compute operation completes and outputs are transmitted (e.g., keyframe 615 or other classification outputs), the compute components can enter a sleep state again for the rest of the frame period. With such arrangements, the power consumed by the compute components can be reduced.

Figure 7B:
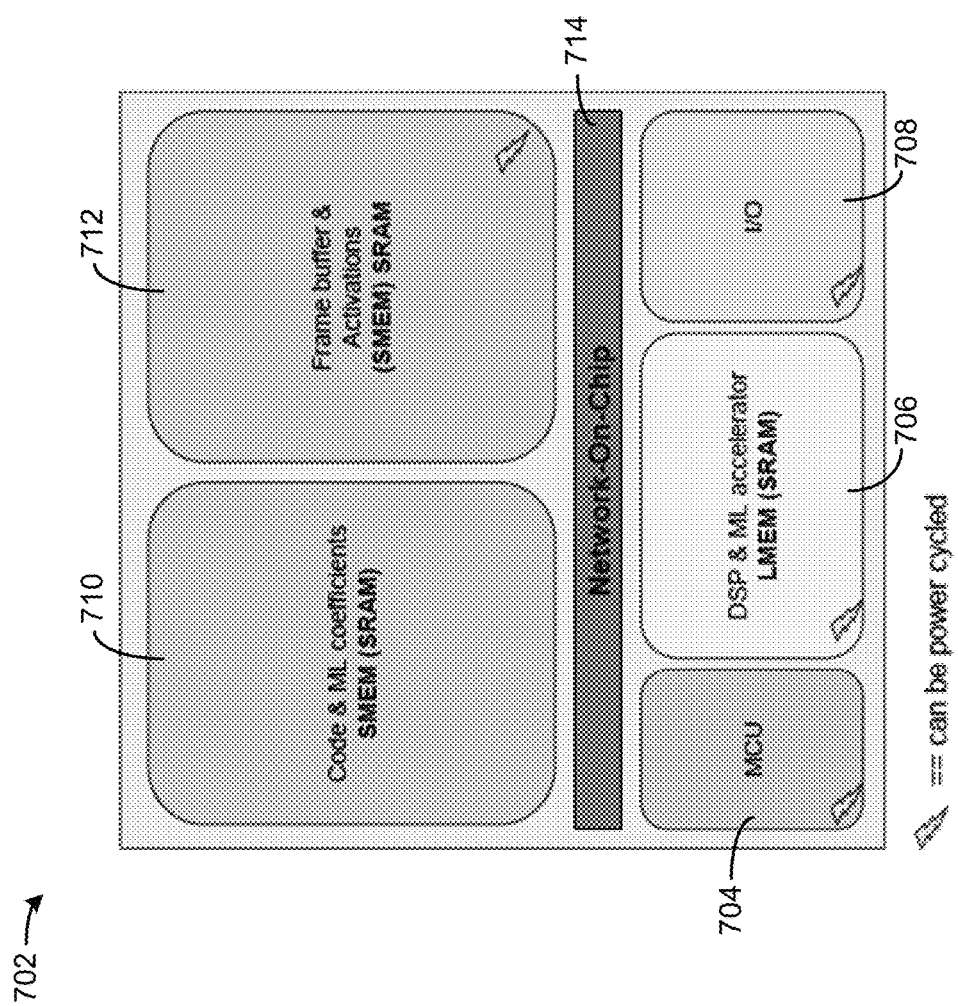

FIG. 7B illustrates a semiconductor layer 702 including various example compute components that can be operated according to sequence of operations 700 of FIG. 7A. Semiconductor layer 702 can include the compute components of, for example, feature extraction layer 320 and CNN layer 325. As shown in FIG. 7B, semiconductor layer 702 can include a microcontroller (MCU) 704, a digital signal processor (DSP) and machine learning (ML) accelerator 706 (e.g., to implement CNN 326 of FIG. 3B), and input/output systems (I/O) 708. DSP and ML accelerator 706 can implement CNN 326 to perform feature extraction as part of feature extraction circuitry 410. DSP and ML accelerator 706 can include memory to support the feature extraction operations. I/O 708 can include data serializers and data de-serializers to communicate with other components, such as host system 610. Semiconductor layer 702 further includes a first memory 710 and a second memory 712. First memory 710 can store ML coefficients (e.g., weights arrays [$W_0$], [$W_1$], and [$W_2$] of FIG. 3B) and ML intermediate results to support the feature extraction operation at DSP and ML accelerator 706. A first portion of second memory 712 can operate as a frame buffer to store a frame of pixel outputs from ADC layer 315, whereas a second portion of second memory 712 can operate as an output data storage to store activation function outputs from CNN 326. In some examples, the pixel values stored in the frame buffer can be bit-swapped according to a coding scheme to avoid loss of information when the most significant bit (MSB) is corrupted. The pixel values can be encoded using various error correction coding (ECC) schemes to improve reliability.

In FIG. 7B, first memory 710, second memory 712, as well as memory of DSP and ML accelerator 706, can include SRAM devices. MCU 704 can control/coordinate the various circuit components of sensor system 605, including those of semiconductor layer 702, based on the codes stored in first memory 710. Semiconductor layer 702 further includes a network-on-chip 714 to support communication among various circuit components of semiconductor layer 702. The compute circuit components of semiconductor layer 702 can communicate with other components in other semiconductors layers of sensor system 605, such as ADC logic in ADC layer 315, via TSV connections.

To reduce power consumption, MCU 704 can control various components of semiconductor layer 702 to perform sequence of operations 700 of FIG. 7A. For example, after the frame exposure period ends, MCU 704 can wake up and then power up second memory 712, as well as DSP and ML accelerator 706. First memory 710 remains powered on so that MCU 704 can fetch and execute the codes to perform the sequence of operations. MCU 704 can then control DSP and ML accelerator 706 to execute CNN 326 to perform the feature extraction operations on pixel data stored in the frame buffer portion of second memory 712 using the filter coefficients (e.g., [$W_0$], [$W_1$], and [$W_2$]), and store the outputs at the output data storage portion of second memory 712. After the feature extraction operations complete, MCU 704 can power down second memory 712, as well as DSP and ML accelerator 706, and enter a sleep state.

In addition, based on their different power consumption behaviors, different types of memories can be used to store different types of data to reduce the power consumption by the memory system. Specifically, during compute, a read from a non-volatile memory (NVM) can use a much higher power than static random access memory (SRAM), but during sleep state, the retention power of SRAM is much higher than those of NVM. Examples of NVM include magnetoresistive random access memory (MRAM), resistive random-access memory (RRAM) which can include memristors such as those illustrated in FIG. 5, or phase-change memory (PCM).

Figure 7C:
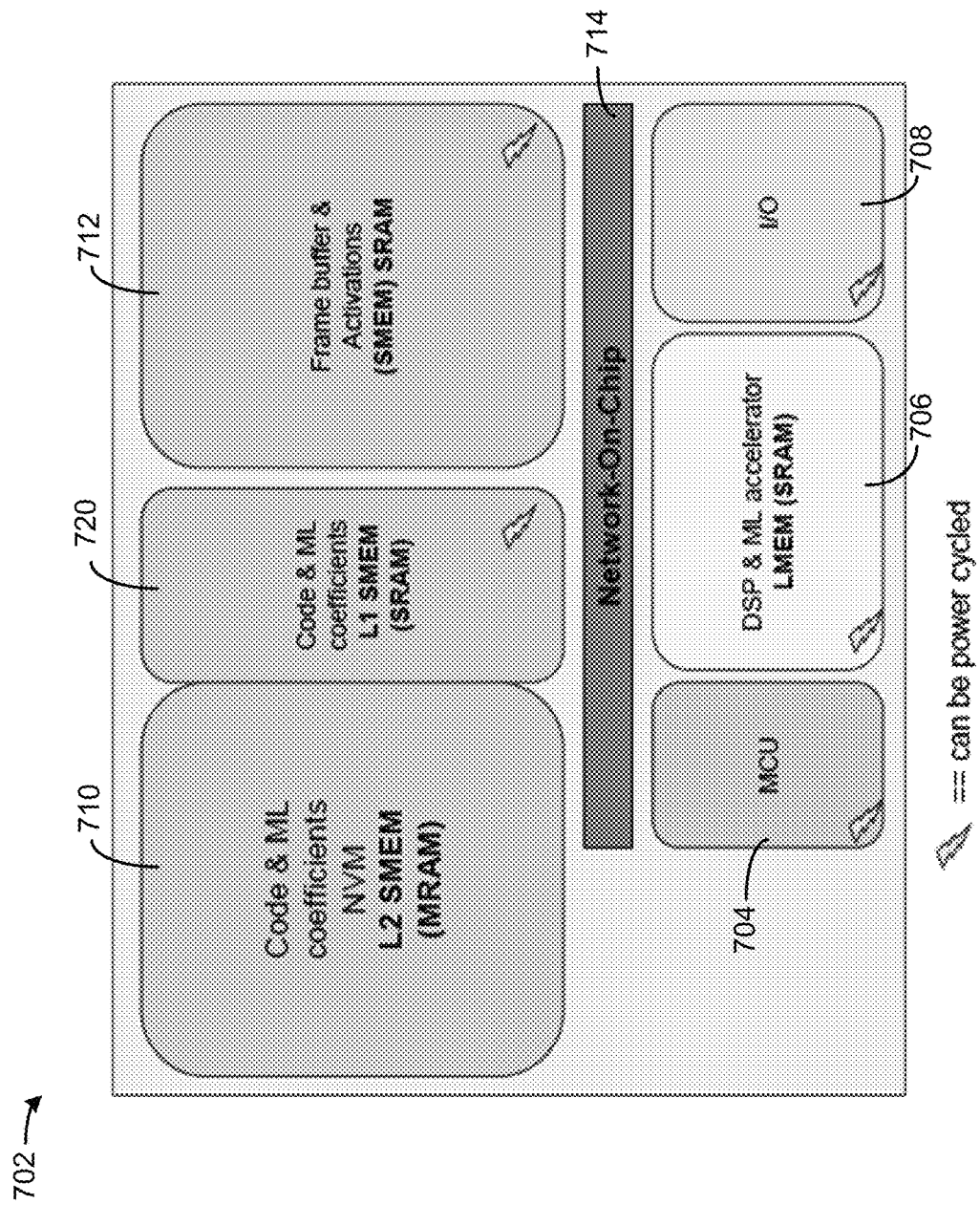

FIG. 7C illustrates another example of semiconductor layer 702 that includes different types of memory. Specifically, first memory 710, which can be used to store relatively static data such as codes and ML coefficients which typically do not change between frames, can be implemented using NVM (e.g., MRAM). On the other hand, second memory 712, which can be used to store dynamic data such as pixel data and activation function outputs from a neural network layer, can be implemented using SRAM. Semiconductor layer 702 further includes a third memory 720 which is implemented using SRAM and used as a cache to store a subset of codes and ML coefficients to be fetched to MCU 704 and DSP and ML accelerator 706. In FIG. 7C, due to the use of NVM devices, first memory 710 can be powered down during the sleep state while still retaining the codes and ML model coefficients, while in FIG. 7B, first memory 710 is not shut down during the sleep state to avoid losing the codes and the ML coefficients. The arrangements in FIG. 7C can lead to reduced power consumption during the sleep state. To speed up access of the codes and the ML coefficients, a subset of codes and the ML coefficients can be cached in third memory 720, which is much faster but also smaller than first memory 710, and the cached codes and ML coefficients can change as MCU 704 and DSP and ML accelerator 706 perform different operations within a frame period. Third memory 720 can be powered off during the sleep state and powered on with the rest of the compute components in semiconductor layer 702 after the exposure period ends to cache the codes and the ML coefficients.

Figure 7D:
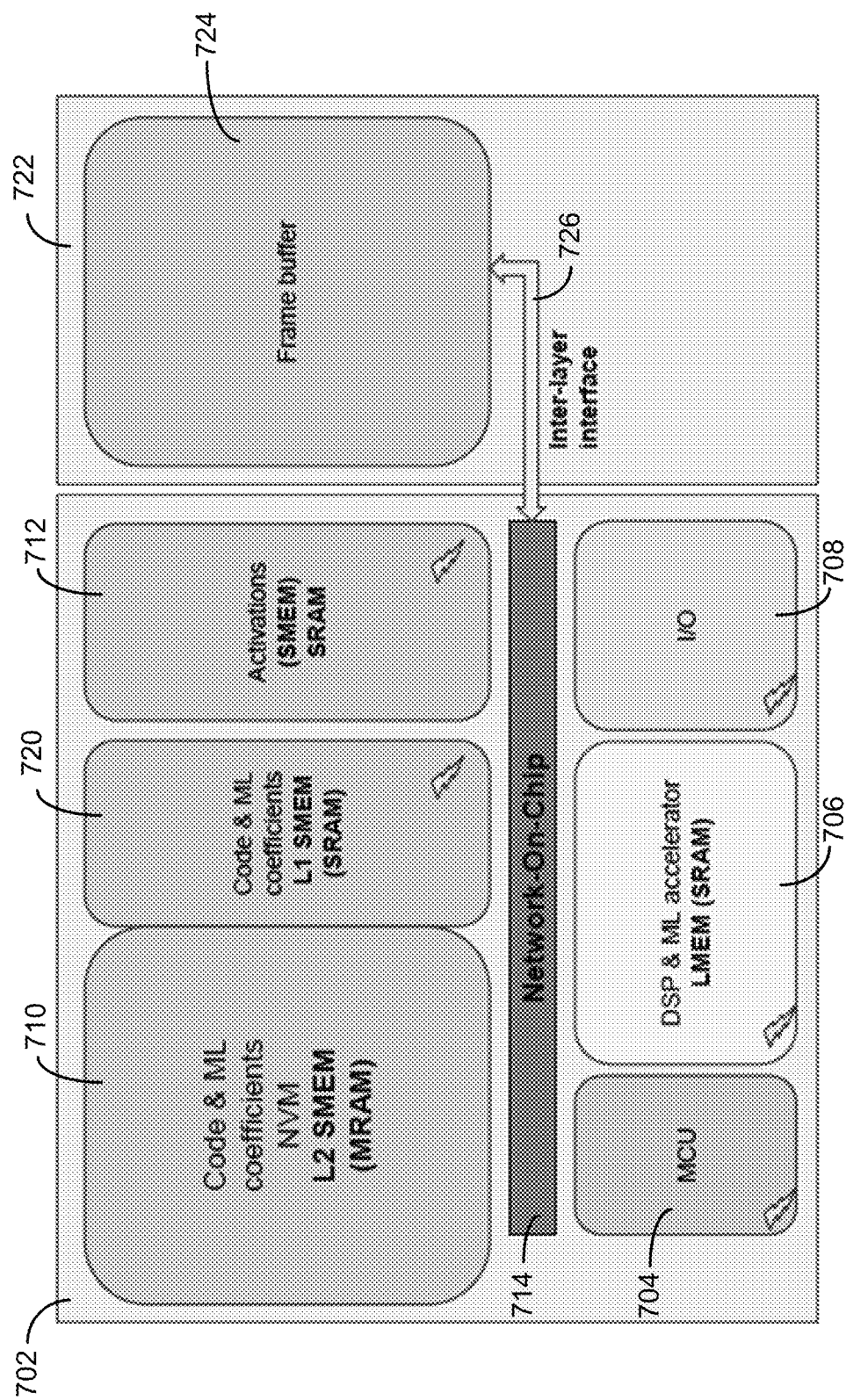

FIG. 7D illustrates another example of semiconductor layer 702, as well as an example of semiconductor layer 722. As shown in FIG. 7D, instead of having second memory 712 providing a frame buffer in semiconductor layer 702, a separate frame buffer 724 can be formed in semiconductor layer 722. Semiconductor layer 722 can be part of ADC layer 315 and stacked between photodetector layer 305 and semiconductor layer 702 and can be connected to semiconductor layer 702 via a parallel inter-layer interface 726, such as a TSV interface including parallel TSVs and/or micro-TSVs. The arrangements of FIG. 7D can reduce the total size of memory to be fitted into semiconductor layer 702. In addition, the parallel inter-layer interface 726 between frame buffer 724 and semiconductor layer 702 allow fast access of pixel data in frame buffer 724, especially compared with a case where the pixel data are moved through I/O 708 and undergo serialization and de-serialization operation. The fast access of pixel data in frame buffer 724 can facilitate control of light sensing operations at photodetector layer 305 by, for example, MCU 704. For example, based on a result of processing the pixel data stored in frame buffer 724 by DSP & ML accelerator 706, MCU 704 can determine a region of interest (ROI) and enable only the pixel cells within the ROI to generate pixel data in the next frame. MCU 704 can also control various aspects of pixel data generation by the pixel cells of photodetector layer 305, such as controlling the exposure period or bit depth.

Figure 7E:
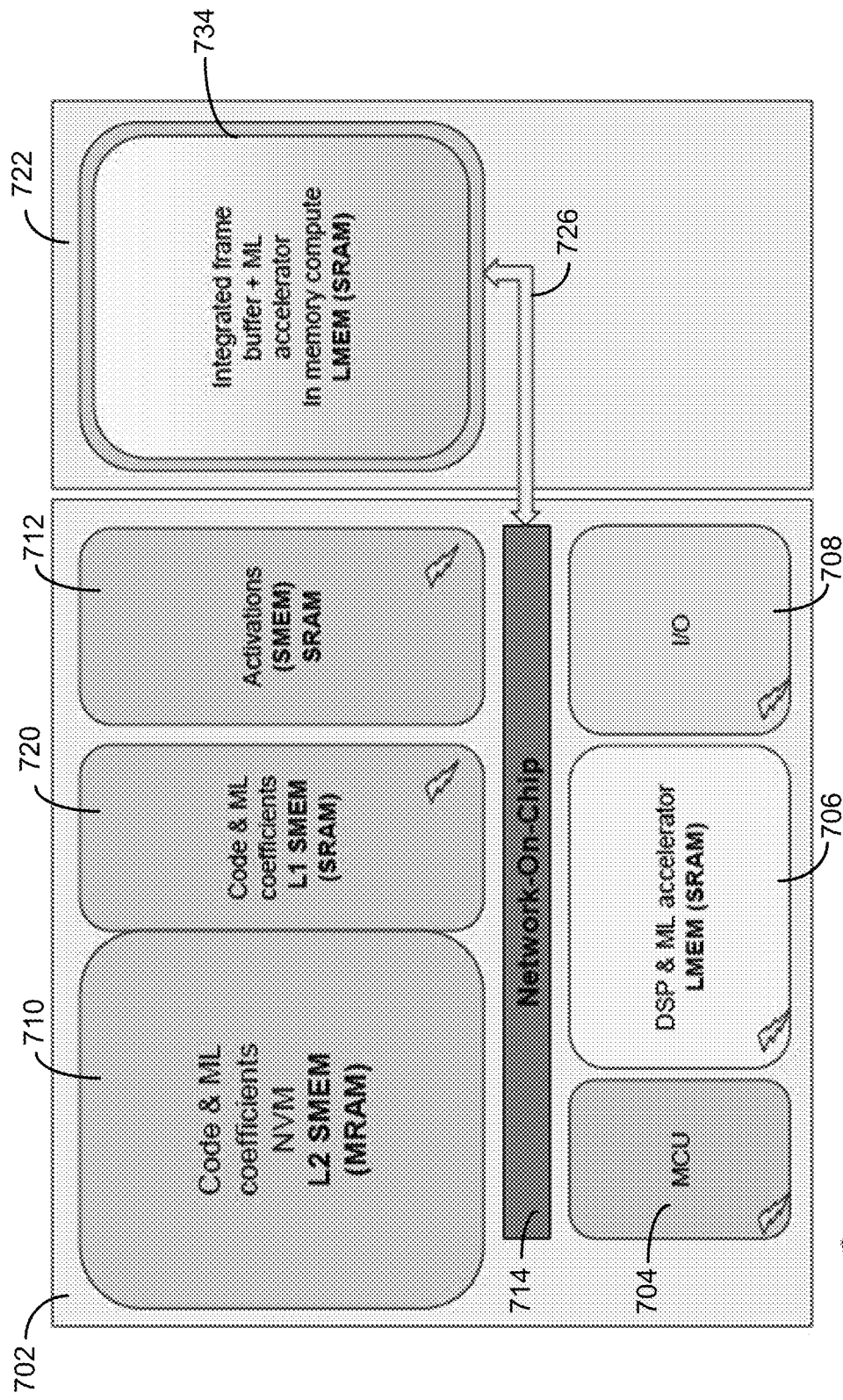

FIG. 7E illustrates another example of semiconductor layer 702, as well as an example of semiconductor layer 722. As shown in FIG. 7E, an integrated frame buffer and ML accelerator 734 can be implemented in semiconductor layer 722. Integrated frame buffer and ML accelerator 734 can include SRAM devices, as well as a memory controller, to provide certain in-memory compute capabilities to reduce the work load of DSP and ML accelerator 706. Examples of in-memory compute capabilities can include, for example, matrix transpose and reshaping operations. For example, as part of the matrix transpose/reshaping operation, the memory controller can perform read operations of the pixel data in the integrated frame buffer along one dimension (e.g., along rows) and store the pixel data along a different dimension (e.g., along columns) in the memory of DSP and ML accelerator 706. In some examples, integrated frame buffer and ML accelerator 734 can include an array of memristor, such as the one shown in FIG. 5, to perform matrix multiplications to implement CNN 326.

Figure 7F:
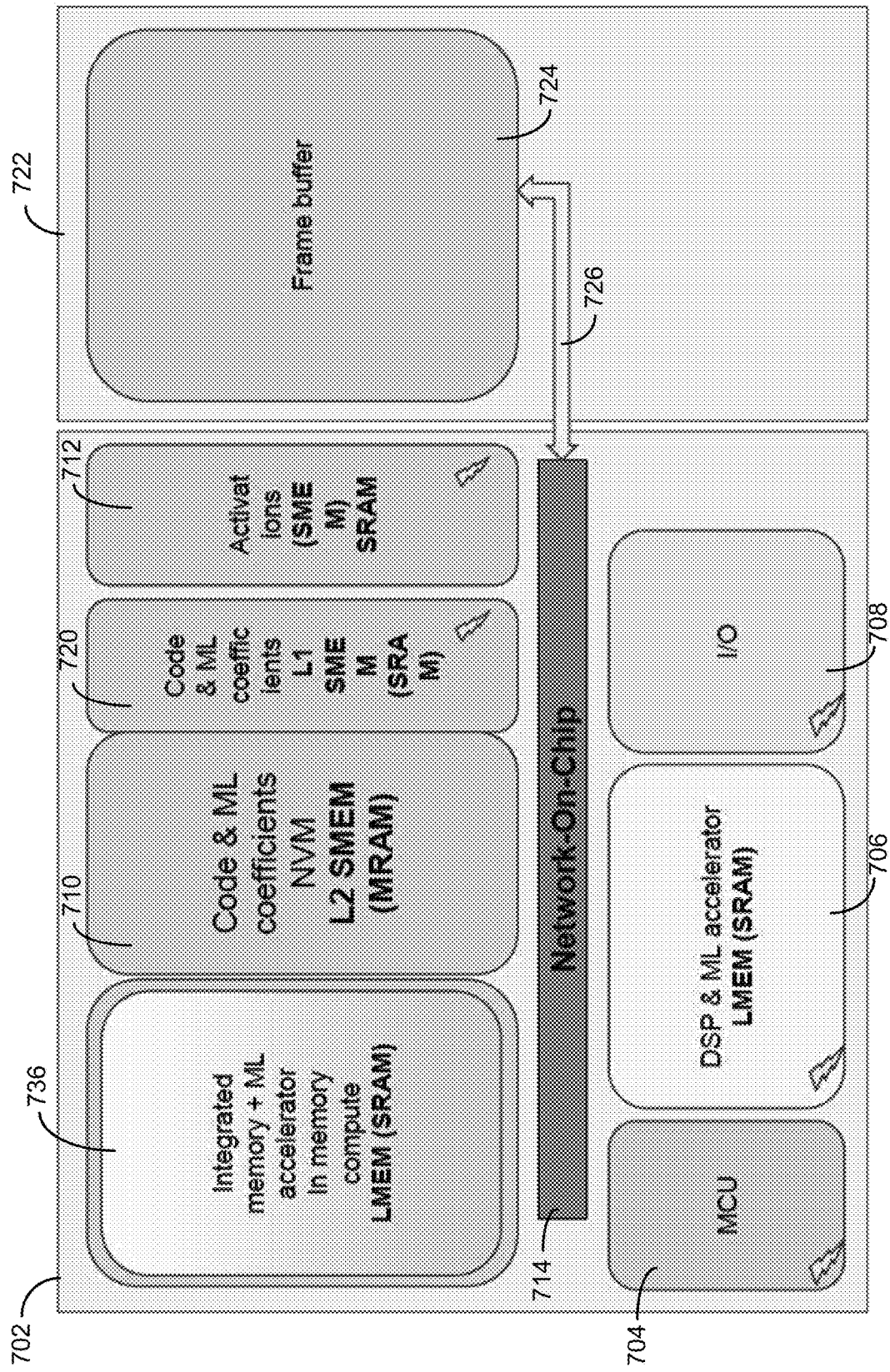

FIG. 7F illustrates another example of semiconductor layer 702, as well as an example of semiconductor layer 722. As shown in FIG. 7F, an integrated memory and ML accelerator 736 can be implemented in semiconductor layer 702. As in FIG. 7E, integrated memory and ML accelerator 736 can include SRAM devices, as well as a memory controller, to provide certain in-memory compute capabilities to reduce the work load of DSP and ML accelerator 706. For example, as part of the matrix transpose/reshaping operation, the memory controller can perform read operations of the pixel data in the integrated frame buffer along one dimension (e.g., along rows) and store the pixel data along a different dimension (e.g., along columns) in the memory of DSP and ML accelerator 706. In some examples, integrated memory and ML accelerator 736 can include an array of memristor, such as the one shown in FIG. 5, to perform matrix multiplications to implement CNN 326.

Figure 7G:
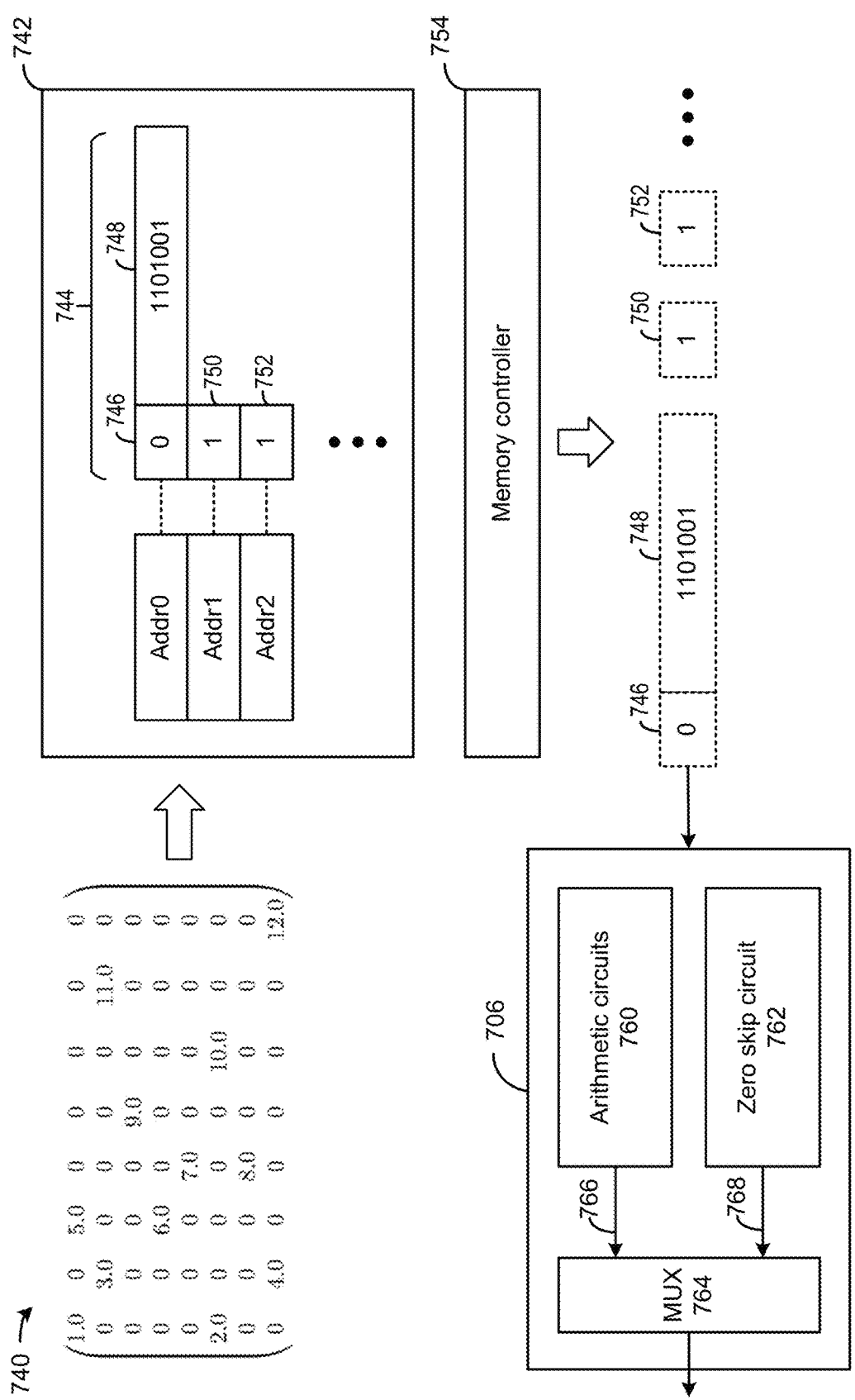

FIG. 7G illustrates additional techniques to reduce the power consumption by the compute and memory components of sensor system 605. As shown in the top left of FIG. 7G, weight matrix 740, which can be used to multiply with input data in convolution operations of FIG. 3B, typically includes a sparse matrix, in which many entries are zero. Through a mapping table (not shown in FIG. 7G), each entry of sparse weight matrix 740 can be stored at a particular address in memory 742.

Various techniques can be used to reduce the memory and computation power involved in the storage of sparse weight matrix 740. As shown in the top right of FIG. 7G, the zero and non-zero entries of sparse weight matrix 740 can be stored in different forms using different number of bits in a memory 742, which can be part of memories 710 and 720 of semiconductor layer 702. Specifically, each entry can be represented by a flag bit which indicates whether the entry is non-zero and, in a case where the entry is non-zero, multiple bits representing the non-zero entry value. For example, memory 742 may store a non-zero entry 744 at address 0 (addr0), with non-zero entry 744 including a zero flag bit 746 (indicating an non-zero entry) and data bits 748 representing the non-zero entry value. The multiple bits can be a direct binary representation of the non-zero entry value without additional encoding. In addition, memory 742 may also store a zero entry at address 1 (addr1) represented by an asserted flag bit, but no other bits. Memory 742 may also store a zero entry at address 2 (addr2) represented by another asserted flag bit, but no other bits. In another example, memory 742 can also use different voltages to represent zero and non-zero entries. For example, for a zero entry, memory 742 can store a bit at a first voltage, whereas for a non-zero entry, memory 742 can store a non-zero bit of the entry at a second voltage and a zero bit of the entry at a third voltage different from the first voltage. With these arrangements, where zero and non-zero entries are represented by different number of bits and/or voltage ranges, the total size of memory 742 needed to store sparse weight matrix 740, as well as the power consumption of memory 742, can be reduced. Such arrangements can also avoid the typical encoding and decoding operations associated data compression, which can speed up the storage and retrieval of sparse weight matrix 740 in memory 742.

In addition to using different bit lengths/voltages to represent zero and non-zero entries, other techniques can be used to further reduce power involved in transmission of sparse weight matrix 740 between memory 742 and DSP and ML accelerator 706. For example, as shown in FIG. 7G, a memory controller 754 can read out flag bits 746, 750, and 752, as well as data bits 748, from memory 742, and output the flag bits and data bits to DSP and ML accelerator 706. As the non-zero entries and the zero entries are transmitted using reduced number of bits, the transmit powers can be reduced. In some examples, memory controller 770 can detect a zero entry based on, for example, detecting an asserted flag bit, a bit represented by the first voltage, and skip transmission of the zero entry to further reduce the transmit power.

In addition, DSP and ML accelerator 706 may implement techniques to reduce computation power in performing computations with sparse weight matrix 740. For example, as shown in FIG. 7G, DSP and ML accelerator 706 can include an arithmetic circuit 760, a zero skip circuit 762, and a multiplexor (MUX) 764. Arithmetic circuit 762 can perform arithmetic operations (e.g., multiplication operations) with an non-zero entry of sparse weight matrix 740 to generate an output 766, whereas zero skip circuit 762 can skip the arithmetic operations with a zero entry of sparse weight matrix 740 and generate a zero output 768. MUX 764 can select one of output 766 or zero output 768 as output. With such arrangements, the number of arithmetic operations can be reduced as arithmetic operations involving zero entries are skipped, and the computation power involved in computations with sparse weight matrix 740 can be reduced as a result.

Besides providing a ML accelerator to perform feature extraction, in-memory compute can also provide other image processing capabilities to facilitate control of sensor system 605, such as embedded matching, layer pre-processing, and depth-wise convolution layers.

Specifically, in-memory compute can provide embedded matching functionalities, such as computing distances between an input vector with a reference vector in a vector database, provided by the in-memory compute, to look up the closest match. The matching can be used to perform a similarity search for an input vector to augment, or to replace, the feature extraction capabilities provided by CNN, to support various applications such as simultaneous localization and mapping (SLAM), sentence/image infrastructure service, etc. The distance being computed can be of L0 distance, L1 distance, L2 distance, etc. L0 distance can count the number of non-zero elements in a vector, L1 distance can refer to sum of the magnitudes of the vectors (e.g., Manhattan distance), whereas L2 distance can refer to the shortest distances between two points represented by the vectors (e.g., Euclidean distance).

Figure 7H:
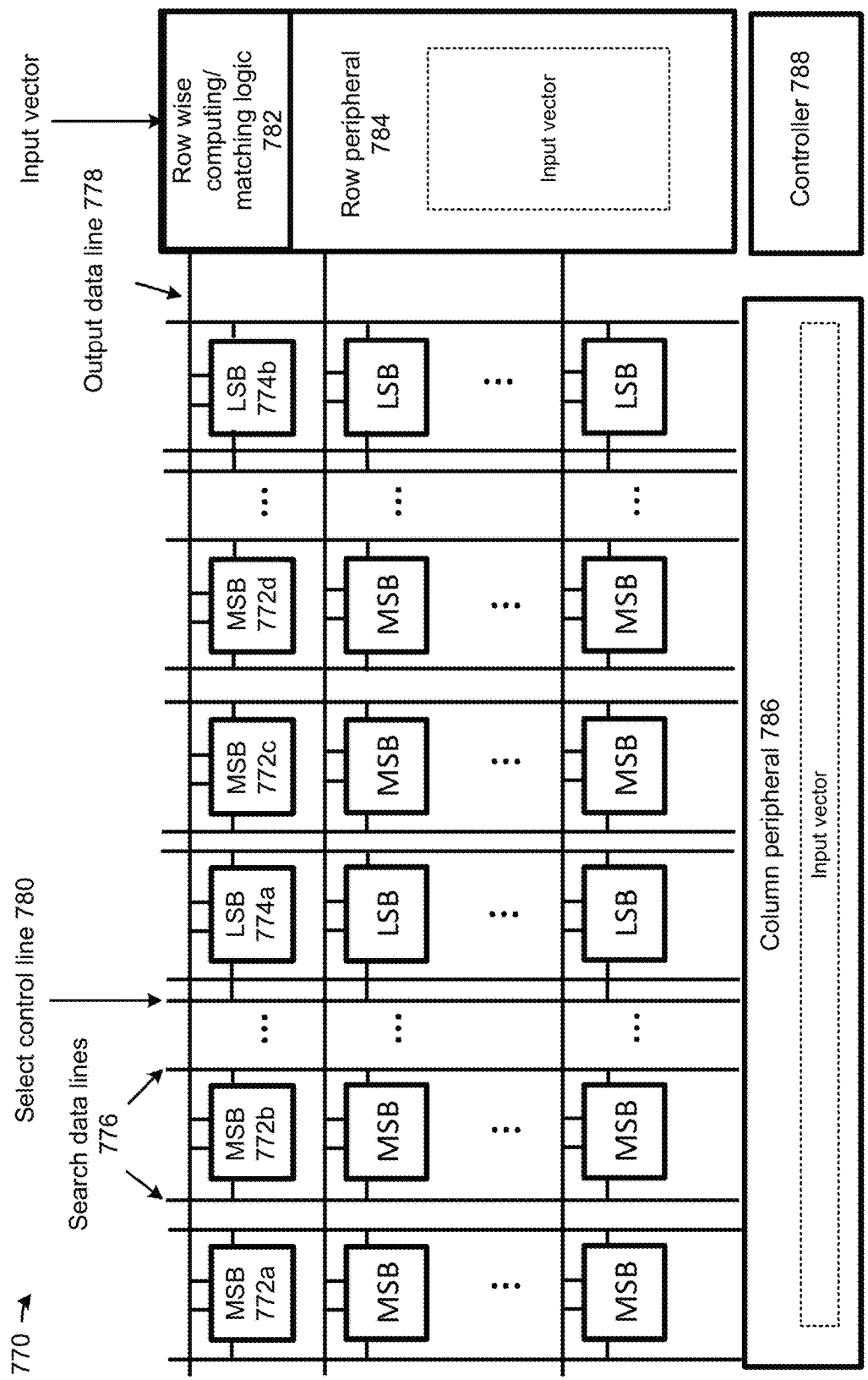

FIG. 7H illustrates an example memory system 770 that can provide in-memory compute capabilities for embedded matching. Memory system 770 can include an array of bit cells, such as bit cells 772 and 774. Bit cells 772, including bit cell 772a, 772b, 772c, and 772d, are configured as most significant bit (MSB) cells to store the MSBs of a reference vector. Moreover, bit cells 774, including bit cells 774a and 774b, are configured as least significant bit (LSB) cells to store the LSBs of the reference vector. In memory 770, the reference vectors having the same MSBs can be stored in a column of bit cells comprising multiple columns of MSB cells and LSB cells.

Figure 7I:
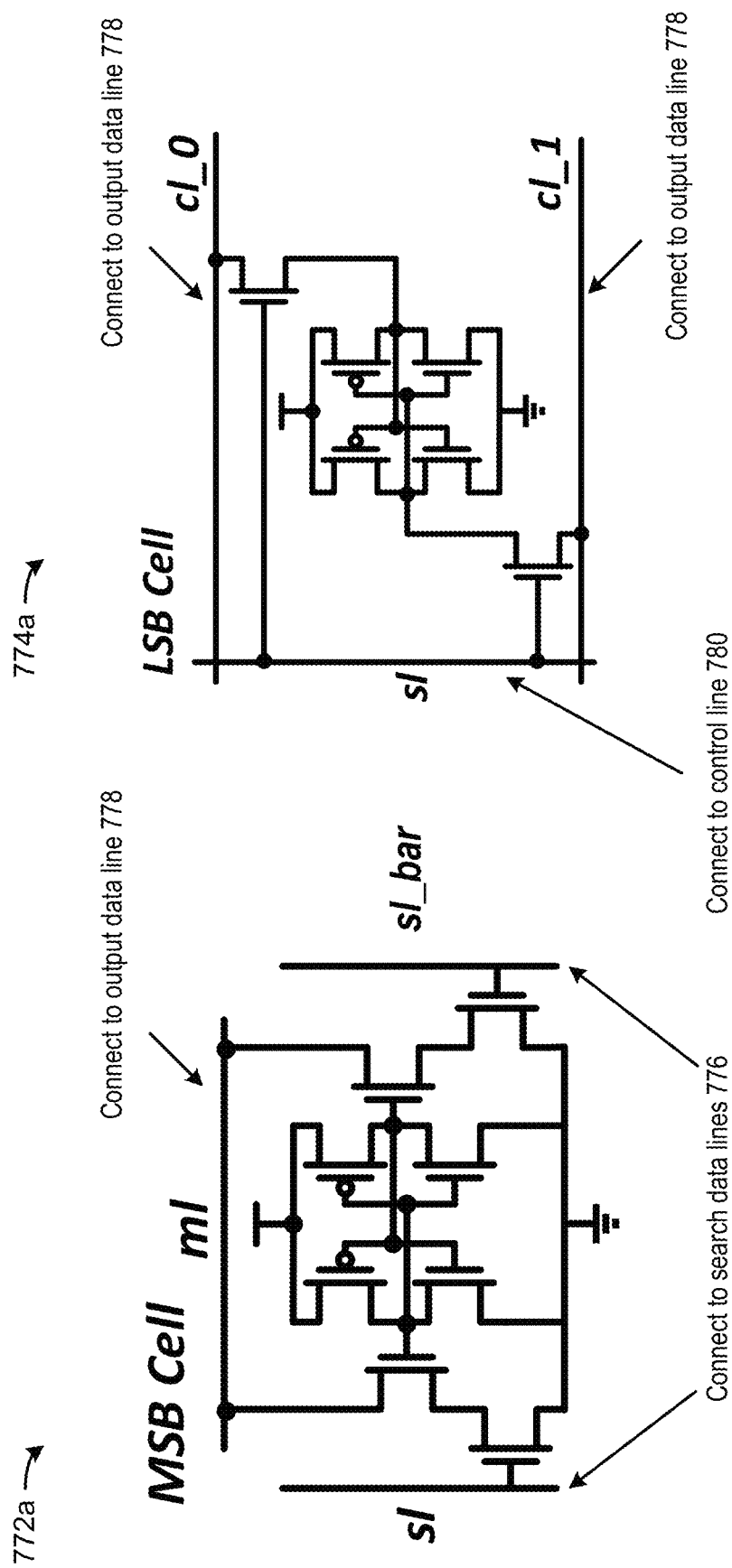

Example structures of MSB bit cells 772 (e.g., MSB bit cell 772a) and LSB bit cells 774 (e.g., LSB bit cell 774a) are illustrated in FIG. 7I. Referring to both FIG. 7H and FIG. 7I, the sl and sl_bar signals of MSB bit cell 772a are connected to columns of search data lines 776, whereas the ml signal of MSB bit cell 772a is connected to a row of output data line 778. In addition, the sl signal of LSB bit cell 774a is connected to a column of select control line 780, whereas the cl_0 and cl_1 signals are connected to rows of output data line 778. Memory system 770 further includes row wise computing/matching logic 782, a row peripheral 784, a column peripheral 786, and a controller 788.

The distance computation/similarity search operation for an input vector can be performed in two phases by controller 788 together with computing/matching logic 782, row peripheral 784, and column peripheral 786. In the first phase, a search can be performed to identify reference vectors having MSBs matching the input. To perform the search, column peripheral 786 can drive search data lines 776 based on the MSBs of the input vector, and the sl and sl_bar signals of each MSB cell, which stores a MSB of a reference vector, can be driven by the MSB of the input vector. The state of the ml signal can reflect whether the MSB of the reference vector (stored in the MSB bit cell) and the MSB of the input vector matches. Controller 788 can detect the state of the ml signals of the MSB bit cells, via output row data line 778, and identify reference vectors having the same MSBs as the input vector.

In a second phase, based on identifying which of the reference vectors have the same MSBs as the input vector, controller 788 can turn on assert control line 780 of LSB cells that belong to the matching reference vectors to perform distance/similarity compute. Row peripheral 784 can include bit cells having similar structure as the LSB cells shown in FIG. 7I to store the input vector, and the bit cells that store the LSBs of the input vector can drive the cl_0 and cl_1 signals via rows of output data line 778. When control line 780 is asserted with cl_0 and the cl_1 signal being driven by an input vector LSB, the reference vector LSB and the input vector LSB can tied together, which can then update the state of the cl_0 and cl_1 signal. The updated state of cl_0 signal can provide a digital output representing a logical AND operation between the input vector LSB and the reference vector LSB, whereas the updated state of cl_1 signal can output a digital output representing a logical NOR operation between the input vector LSB and the reference vector LSB. Row wise computing/matching logic 782 can obtain the logical AND and the logical NOR outputs between the input and reference vectors from rows of output data line 778 and manipulate the logical AND and the logical NOR outputs to represent, for example, multiplication and/or summation between the input vector and the reference vector. The manipulation result can indicate a distance (L0/L1/L2) or a degree of similarity between the input vector and the reference vector. In some examples, row wise computing/matching logic 782 can perform the manipulations of the LSB compute outputs of one row at a time and then sequentially perform the computations for the LSBs in each row where matching MSBs are found. In some examples, row wise computing/matching logic 782 can be replicated for each row, so that computations for LSBs of multiple rows can be performed at a time.

In addition, in-memory compute can support layer pre-processing and depth-wise convolution layers. For example, in-memory compute can support pre-processing operation on images, such as image filtering, low-level vision, with programmable and small set of kernels. In addition, in-memory compute can support depth-wise convolution layers, in which image data of each input channel (e.g., R, G, and B) convolve with a kernel of the corresponding input channel to generate immediate data for each input channel, followed by a pointwise convolution to combine the intermediate data into convolution output data for one output channel.

Figure 7J:
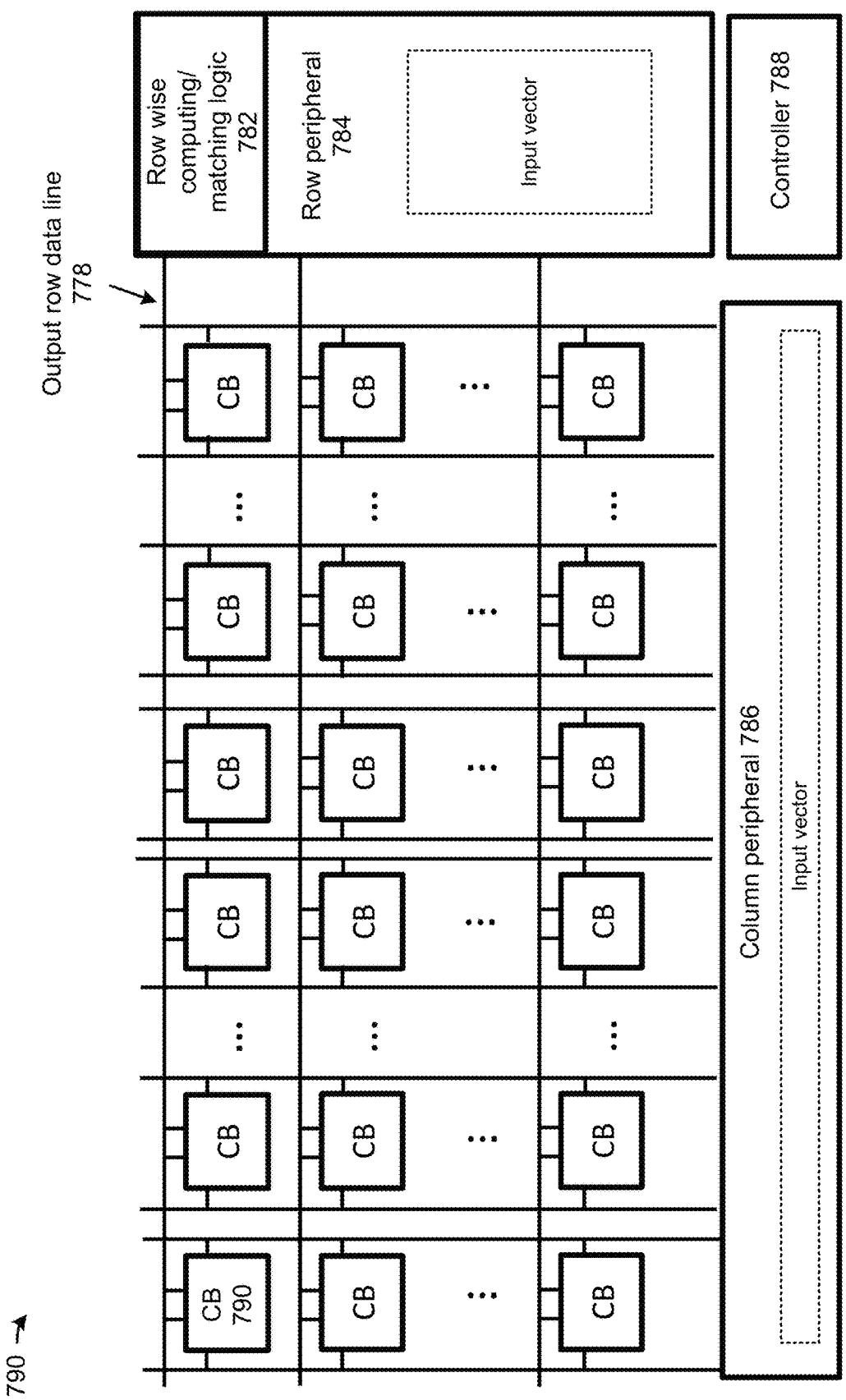

FIG. 7J illustrates an example of memory system 770 that can provide in-memory compute capabilities to support layer pre-processing and depth-wise convolution layers. As shown in FIG. 7J, memory system 770 can include an array of compute bit (CB) cells including CB cell 790. CB cell 790 can have a similar structure as LSB bit cell 774a of FIG. 7I and can store, for example, data of a filter (for layer pre-processing), a kernel (for convolution), whereas column peripheral 786 and row peripheral 784 can provide the input vector to the array of bit cells. The CB cells are connected to columns of search data lines 776 and rows of output data lines 778. Memory system 770 further includes row wise computing/matching logic 782, row peripheral 784, column peripheral 786, and controller 788, as described above in FIG. 7A. Row wise computing/matching logic 782 can manipulate the logical AND and the logical NOR outputs (cl_0 and cl_1 outputs) of CB cell 790 to perform the layer pre-processing and depth-wise convolution operations.

Figure 8B:
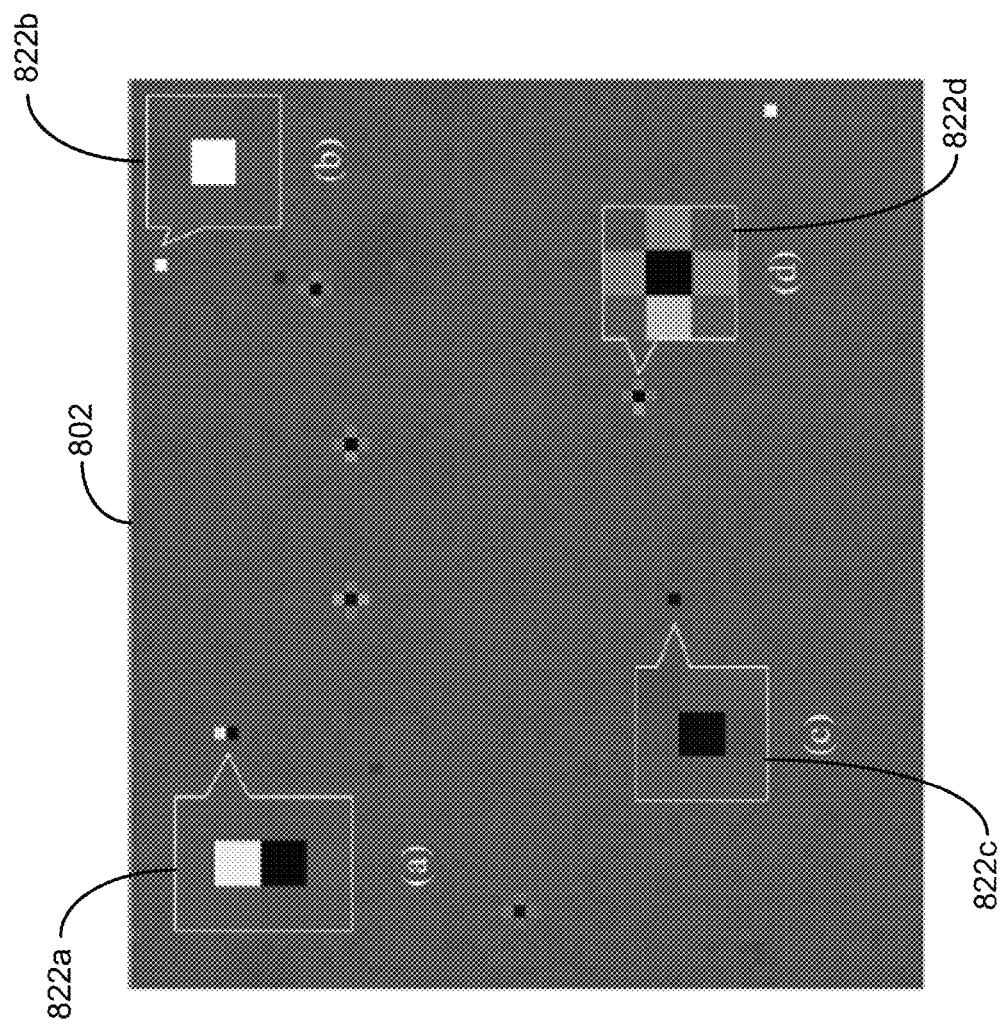
Figure 8C:
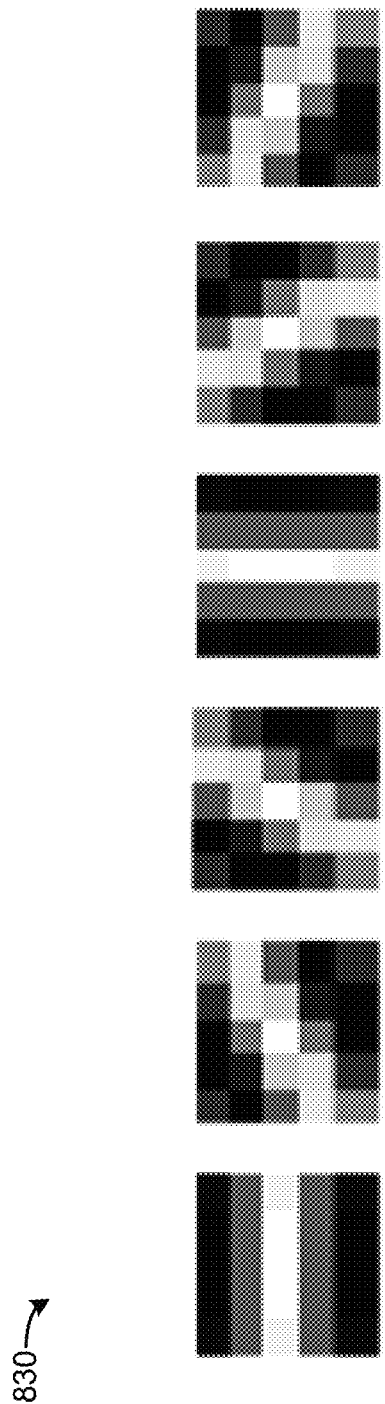

FIG. 8A-FIG. 8C illustrate additional techniques to reduce the power consumption by the compute and memory components of sensor system 605. FIG. 8A illustrates an example operation 800, in which a gating model is implemented to create sparsity in computation of DSP and ML accelerator 706. The gating model can select, from pixel values in a frame 802, a subset of pixel values 804 to be processed by DSP and ML accelerator 706, while the rest of the pixel values in the frame are not processed. In a case where the pixel values are associated with different channels (e.g., red, green, blue, and infra-red channels), different subsets of pixel values can be selected for processing by different gating models. The gating model can be generated from various sources such as statistical analysis and training. The gating model is then to be considered dynamic and data-dependent. In some examples, the gating model can also be applied to intermediate representations (e.g., features), intermediate computation results, that are computed or input to different layers of the neural network implemented by DSP and ML accelerator 706.

In some examples, the gating model can include a user-specific model 806 and a base model 808. User-specific model 806 can be different between different sensor systems 605 (e.g., on the same HMD platform used to capture different scenes, on different HMD platforms operated by different users), whereas base model 808 can be common between different sensor systems 605. For example, base model 808 can reflect a general distribution of pixels of interest in a scene under a particular operating condition, whereas user-specific model 806 can reflect the actual distribution of pixels in a scene captured by a specific sensor system 605. User-specific model 806 can be applied to pixel values in a frame 802 to compute an importance matrix 810 for each pixel in the frame. Importance matrix 810 can indicate, for example, regions of interests in frame 802. Base model 808 can then be applied to the regions of interests in frame 802 indicated by importance matrix 810 to select the pixel values input to DSP and ML accelerator 706. Base model 808 can include different gating functions to select different subsets of pixels for different channels. Both user-specific model 806 and base model 808 can change between frames, so that different subsets of pixels can be selected in different frames (e.g., to account for movement of an object).

Both user-specific model 806 and base model 808 can be generated from various sources, such as via statistical analysis, training. For example, through a statistical analysis of pixel values of frames captured in different operating conditions, the probability of each pixel carrying useful information for a certain application can be determined, and the models can be determined based on the probabilities. As another example, both user-specific model 806 and base model 808 can be trained, using training data, to learn about which subset of pixels likely to include useful information for the application and to provide those pixels to DSP and ML accelerator 706.

The gating scheme in FIG. 8A can also be used to remove error pixels from the input to DSP and ML accelerator 706. For example, through a unsupervised learning operation, user-specific model 806 can be trained to classify between blind pixels (e.g., pixels that are completely dark, white) and normal pixels (e.g., pixels that are not completely dark/white). Based on the classification, user-specific model 806 can determine that pixels 822a, 822b, 822c, and 822d are blind pixels, and de-select those pixels as inputs to DSP and ML accelerator 706. Those pixels can also be removed from the input in subsequent frames.

In addition, to reduce the updating of weights array in first memory 710 of FIG. 7A-FIG. 7E, fixed weights can be used in the initial layers of CNN 326 (e.g., convolution layer 328a). Such arrangements can reduce the write operations to first memory 710, which can reduce power consumption at first memory 710. For example, Gabor filter arrays 830, shown in FIG. 8C, can be used in convolution layer 328a to perform edge detection. The Gabor filter arrays can be stored at a lower bit precision. Moreover, Gabor filter can include coefficients that are equally spaced in orientation, which may enable efficient in-memory computing.

Privacy and Data Security

Figure 9:
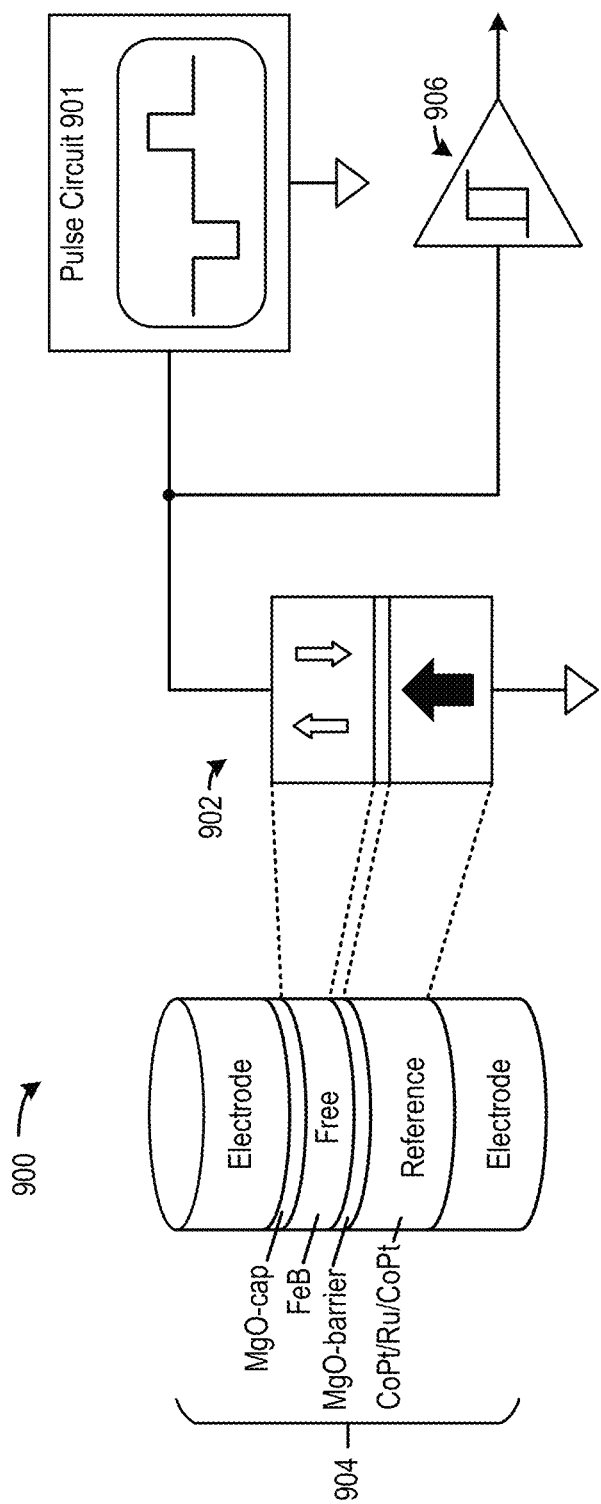
FIG. 9 illustrates example components of sensor system of FIG. 6 and their operations, in accordance with one or more examples of the present disclosure.

To improve privacy and data security, sensor system 605 can implement an encryption mechanism to encrypt the pixel data stored in the frame buffer, the weights stored in the memories 710 and 720, as well as other outputs (e.g., key frames). The encryption can be based on random numbers, which can be generated using NVMs of sensor system 605 (e.g., first memory 710 of FIG. 7C). FIG. 9 illustrates an example random number generator system 900 that can be part of semiconductor layer 702. As shown in FIG. 9, a pulse circuit 901 can transmit pulses to a magnetic tunnel junction (MTJ) 902 of an MRAM device 904, which can be part of first memory 710 (e.g., of FIG. 7C), and the pulses can cause spin-torque switching in a magnetic tunnel junction 902 of MRAM device 904. The switching action can cause random changes in the resistance of the MRAM device, which can be measured by a comparator 906, such as a Schmitt trigger, to generate a sequence of random numbers. Other NVM devices can be used to generate a sequence of random numbers. For example, the random formation, rupture, and defect composition of the conductive filament(s) within metal-oxide-based resistive memory devices offers a second source of inherent randomness. In addition, randomness in the atomic configurations of the amorphous phase created via the melt-quench process after PCM RESET operations can be harnessed for random number generation.

Customization of CNN at the Sensor System

As described above, CNN 326 is trained to perform feature extractions to facilitate control of sensor system 605. The training operation can be used to customize the CNN for different sensor systems 605. The customization can be user-specific, application-specific, scene-specific, etc.

Figure 10A:
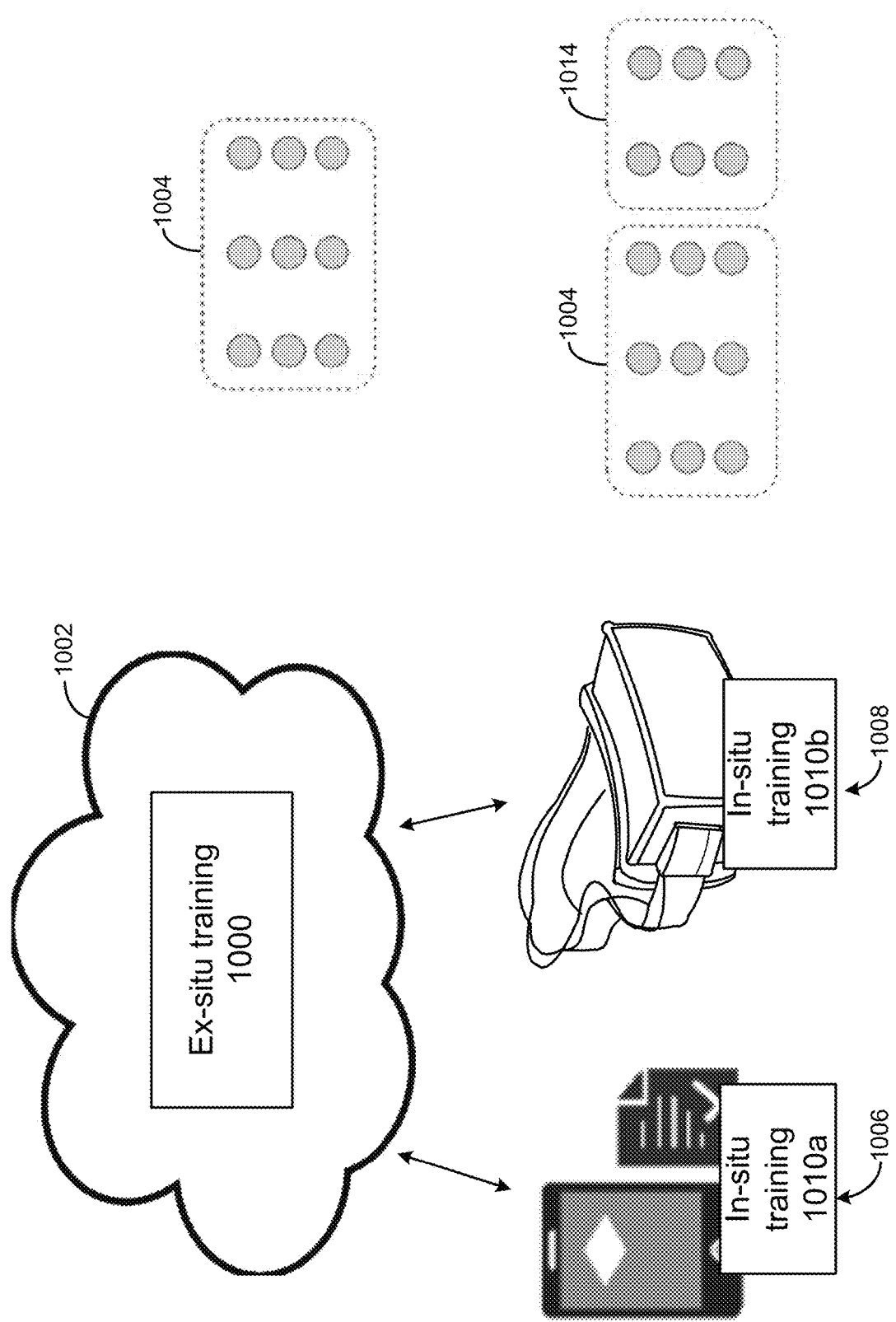
FIG. 10A, FIG. 10B, and FIG. 10C illustrate example components of sensor system of FIG. 6 and their operations, in accordance with one or more examples of the present disclosure.
Figure 10B:
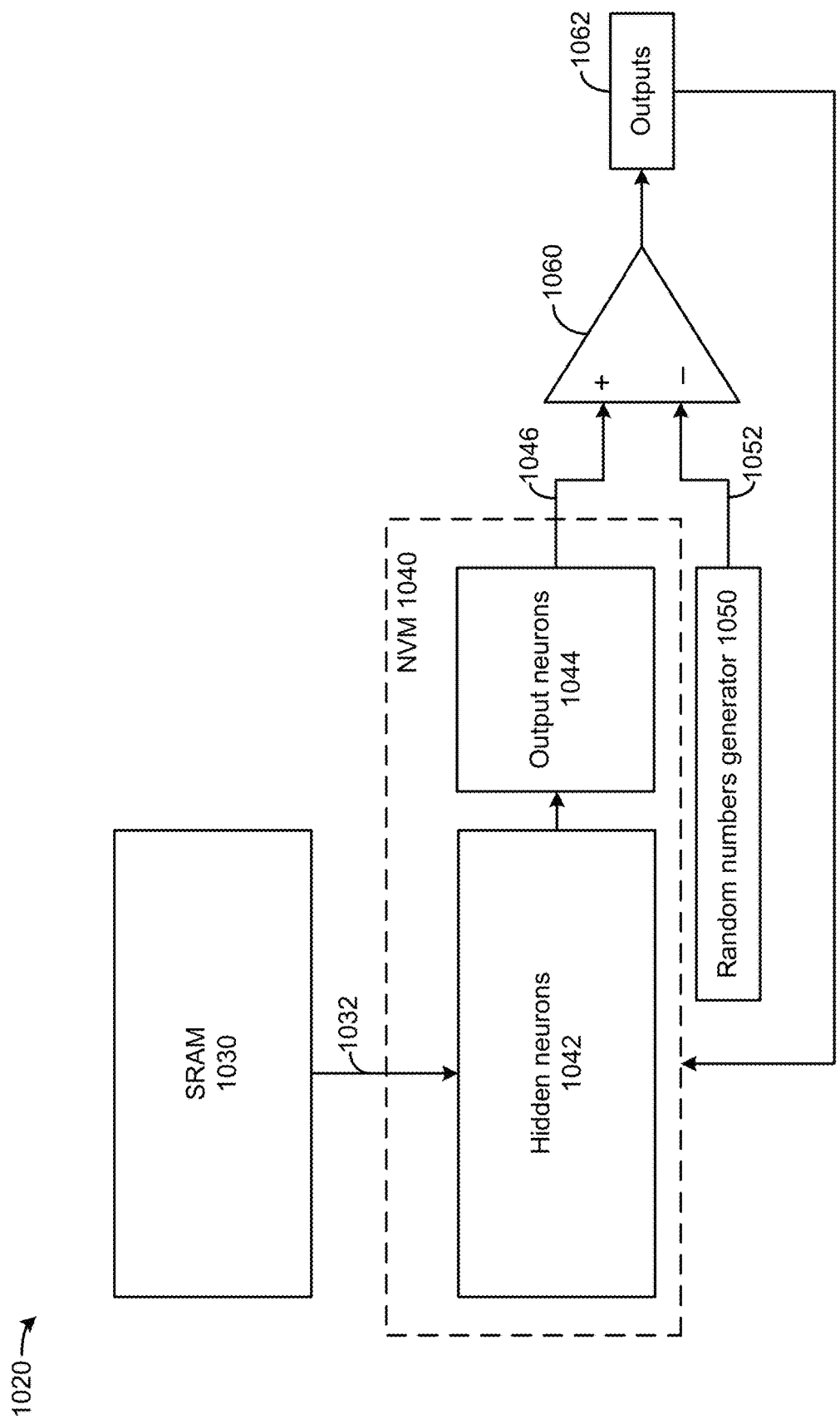
Figure 10C:
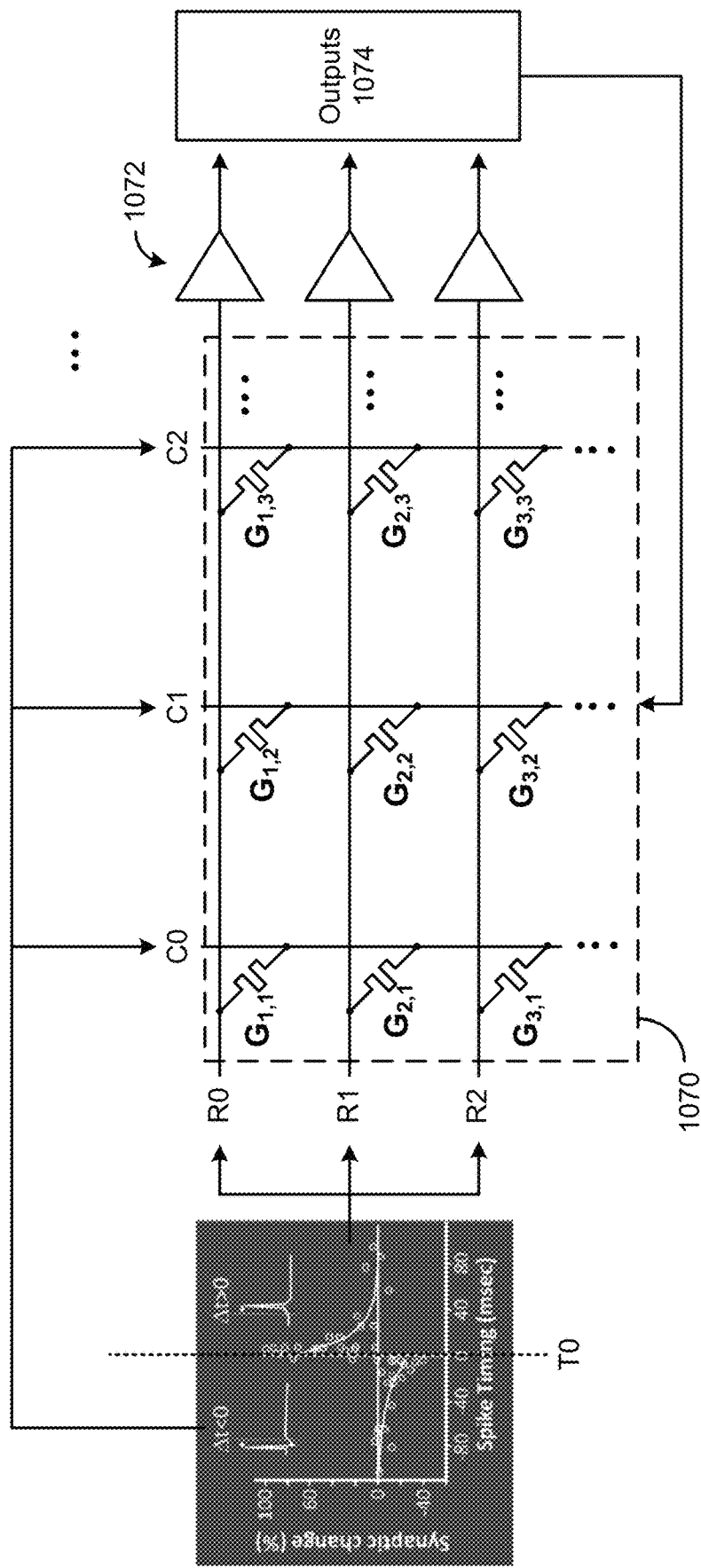

FIG. 10A-FIG. 10C illustrate various techniques of training CNN 326. Referring to FIG. 10A, a two-fold training operation can be performed. An ex-situ training operation 1000 of CNN can be performed to train a base model for feature extraction. The ex-situ training operation can be performed external to sensor system 605. For example, the ex-situ training can be performed in a cloud environment 1002, where a training software is executed in multiple worker machines in cloud environment 1002 to train CNN 326 to perform specific feature extraction tasks (e.g., to identify a hand, a head, and other types of objects) based on labeled image data in a supervised learning operation. As a result of the ex-situ training operation, base model parameters 1004, including weights arrays $[W_0]$, $[W_1]$, and $[W_2]$ of FIG. 3B, can be generated and fetched to sensor system 605 at different mobile platforms 1006 and 1008 for storage (e.g., at first memory 710).

At each mobile platform, an in-situ training operation (e.g., in-situ training operations 1010a, 1010b) can be performed to further customize CNN 326. The customization can be user-specific (e.g., to detect a hand of a particular user), application-specific, scene-specific (e.g., to detect a particular set of objects in a particular scene), etc. The in-situ training operation can generate, from base model parameters 1004, customized model parameters 1014, which can then be stored in first memory 710 to support feature extraction operations at mobile platforms 1006 and 1008.

In-situ training operation 1010 can include different types of learning operations, such as a supervised learning operation, an unsupervised learning operation, and a reinforcement learning operation. Specifically, in a supervised learning operation, the user can provide labeled image data captured locally by sensor system 605 to train CNN 326 at sensor system 605. In an unsupervised learning operation, sensor system 605 can train CNN 326 to classify the pixel data into different groups by determining the similarity (e.g., based on cosine distance, Euclidean distance) between pixel values of the image data, which are not labelled. In a reinforcement learning operation, sensor system 605 can learn and adjust the weights of CNN 326 based on interaction with the environment at different times to maximize a reward. The reward can be based on a goal of detection. For example, in a case where the goal is to find a region of pixels corresponding to a hand, the reward can be measured by a number of pixels having target features of a hand within the region in a frame. The weights of CNN 326 can then be updated in a subsequent reinforcement learning operation on a different frame to increase the number of hand pixels within the region. The rules for updating the weights in a reinforcement learning operation can be stochastic. For example, the outputs of CNN 326 can be compared with thresholds generated from random numbers to compute the reward. Both the unsupervised learning operation and reinforcement learning operation can run in the background without requiring user input.

In-situ training operation 1010 can be customized for different use cases. In one example, a transferring learning operation can be performed, in which the weights of the lower layers (obtained from ex-situ training) are frozen and only the weights of the upper layers are adjusted. For example, referring to FIG. 3B, weights [W0] of the first convolution layer 328a for performing basic feature detections can be frozen, while weights [W1] of the second convolution layer 328c and weights [W2] of fully-connected layer 328e are adjusted by the in-situ training operation. As another example, in-situ training operation 1010 can also include a fitting operation. Specifically, using the base model obtained from ex-situ training operation 1000 and from a frame of pixel values, sensor system 605 can generate initial outputs. A set of fitting parameters can then be generated to fit the initial outputs, and the fitting parameters can be applied to the weights of CNN 326 to process subsequent frames of pixel values. In some examples, in-situ training operation 1010 can be part of an increment or life-long learning operation in which new parameters are learnt for new users of a mobile platform, while models of existing users of the mobile platform are maintained, to enable an one device multi-user experience.

In some examples, ex-situ training operation 1000 and in-situ training operation operations 1010 can be performed in a federated/collaborative learning scheme, in which CNN 326 is trained across multiple decentralized worker machines/platforms holding local pixel data samples without exchanging their data samples. For example, in FIG. 10A, after the in-situ training operations complete, each mobile platform can transmit customized model parameters 1014 back to cloud environment 1002, which can share the customized model parameters 1014 among different platforms. Each platform can then adjust the customized model parameters 1014 based on parameters received from other platforms. With such arrangements, a common robust CNN 326 can be built across multiple mobile platforms. On the other hand, as pixel data are not exchanged among the mobile platforms, critical issues such as data privacy, data security, data access rights, can be addressed.

In some examples, the reinforcement learning and unsupervised learning operations can be performed using an array of memristors, such as the one shown in FIG. 5. FIG. 10B illustrates an example memory system 1020 that can be used to perform reinforcement learning. Memory system 1020 includes a hierarch of memory including SRAM 1030, NVM 1040, a random number generator 1050, and comparators 1060. SRAM 1030 and NVM 1040 can be implemented using, respectively, second memory 712 (which may include a frame buffer) and first memory 710 of FIG. 7A-FIG. 7F. SRAM 1030 can store a frame of pixel data 1032 and forward pixel data 1032 to NVM 1040. NVM 1040 can include an array of memristors, such as the one shown in FIG. 5, which can store weights and configured as hidden neurons 1042. Hidden neurons 1042 can multiply pixel data 1032 with the weights, as described in FIG. 5, and forward to output neurons 1044. Output neurons 1044 can include amplifiers with memristor as feedback networks to multiply and sum the multiplication results and to apply a non-linear activation function on the sums to generate intermediate outputs 1046. Comparators 1060 can compare intermediate outputs 1046 with random numbers 1052 generated by random numbers generator 1050 to generate outputs 1062, which can be fed back to NVM 1040 to update the weights. The random numbers 1052 can represent the stochastic rules of a reinforcement learning operation as described above. Comparators 1060 can be part of DSP and ML accelerator 706, whereas random number generator 1050 can be part of NVM 1040 (e.g., MRAM devices) which can be operated to generate random numbers as described in FIG. 9.

In addition, unsupervised learning operations can also be performed using an array of memristors, such as the one shown in FIG. 5. In some examples, unsupervised learning operations can be performed to train a neural network, which can be CNN 326 or other neural networks, to detect patterns of events at the pixel cells in photodetector layer 305, and the detected patterns can be used to control the operation of sensor system 605. For example, the detected patterns can be used to wake up sensor system 605.

In some examples, the neural network can be trained by exploiting the Spike-timing-dependent plasticity (STDP), which is an example of bio-inspired algorithm that enables unsupervised learning. The assumption underlying STDP is that when the presynaptic neuron spikes just before the postsynaptic neuron spikes, the synapse/weight between the two becomes stronger and vice-versa. Therefore, if the presynaptic neuron spikes again, the synapse will allow the postsynaptic neuron to spike faster or with a higher occurrence probability.

In sensor system 605, the input and output spike can correspond to an event at a pixel. The event can correspond to, for example, the intensity of light received by a photodiode within the frame exposure period exceeding one or more thresholds, which can be indicated by one or more flag bits in the digital pixel cell. In some examples, a pattern of the flag bits can indicate, for example, sensor system 605 operating in a certain environment (e.g., an environment having sufficient ambient light, a target environment for an application), which can lead to sensor system 605 being woken up to process the image data captured in the environment.

An array of memristors, such as the one shown in FIG. 5, can be trained to detect events. FIG. 10C illustrates an array of memristors 1070 that can be trained to perform the detection. As shown in FIG. 10C, an array of memristors 1070 can be implemented as cross-bar devices between column lines (C0, C1, C2, etc.) and row lines (R0, R1, R2, etc.). Signals representing events that occur before a time threshold (e.g., T0) from the pixel cells can be fed into column lines, whereas signals representing events that occur after the time threshold from the pixel cells can be fed into row lines. The memristor cross-bars can store weights and, thanks to the physics of the memristor devices, their conductance can follow STDP learning rule when programming pulses are applied to the devices. The rows can be connected to amplifiers 1072 which can sum of the memristor outputs of each columns within a row, apply an activation function on the sum, and generate outputs 1074. Outputs 1074 can represent a pattern of timing relationship of events among the pixel cells, which can be used to update the weights at the memristor cross-bars to model the STDP process.

In some examples, array of memristors 1070 can implement other types of multiplications, such as vector-vector and vector-matrix multiplications. For example, column lines (C0, C1, C2, etc.) can carry values representing a one-dimensional vector (e.g., a 1×128 vector), whereas row lines (R0, R1, R2, etc.) can carry values representing another one dimensional vector (e.g., another 1×128 vector), and array of memristors 1070 can implement a vector-vector multiplication between the two vectors. The vector-vector multiplication can represent the computations of, for example, a fully-connected neural network layer in FIG. 3B.

Method

Figure 11:
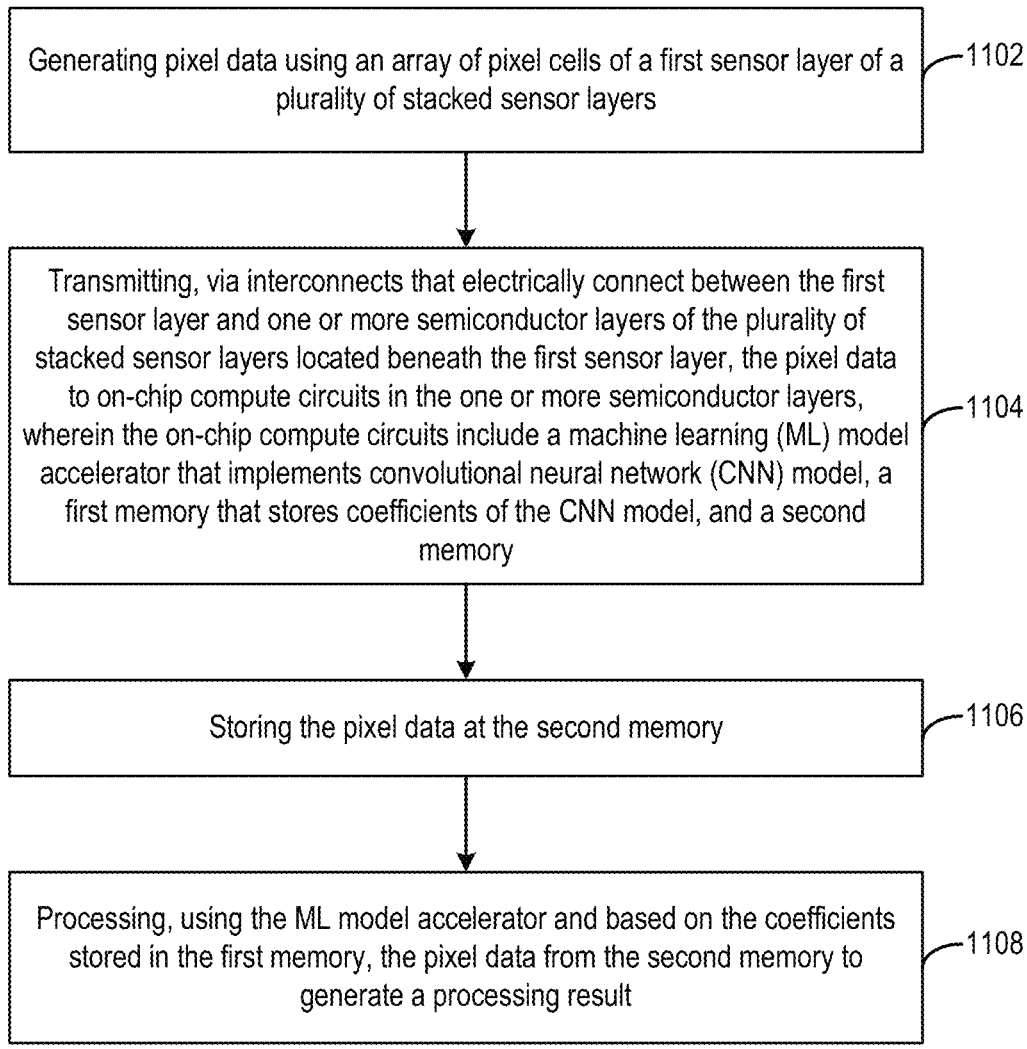
FIG. 11 illustrates a method of operating an image sensor assembly, in accordance with one or more examples of the present disclosure.

FIG. 11 illustrates a flowchart of a method 1100 of operating an image sensor assembly, such as image sensor assembly 300 of FIG. 3. Image sensor assembly 300 comprises a first sensor layer of a plurality of stacked sensor layers, including an array of pixel cells, and one or more semiconductor layers of the plurality of stacked sensor layers located beneath the first sensor layer. The first sensor layer can include photodiodes (e.g., of photodetector layer 305) to convert light to charge and an ADC (e.g., ADC layer 315) to quantize the charge to pixel data, whereas the one or more semiconductor layers comprise on-chip compute circuits configured to process the pixel data. The on-chip compute circuits may include a machine learning (ML) model accelerator, such as ML accelerator 706, configured to implement a convolutional neural network (CNN) model to process the pixel data; a first memory, such as memory 710 and 720, to store coefficients of the CNN model and instruction codes; a second memory, such as memory 712, to store the pixel data of a frame; and a controller, such as MCU 704, configured to execute the codes to control operations of the ML model accelerator, the first memory, and the second memory. Method 1100 can be performed by, for example, on-chip compute circuits (e.g., MCU 704) in conjunction of other components of image sensor assembly 300 shown in FIG. 3A-FIG. 10.

In step 1102, the on-chip compute circuits can control the array of pixel cells to generate pixel data. In some examples, the on-chip compute circuits can enable a subset of the array of pixel cells to perform a sparse image sensing operation.

In step 1104, the array of pixel cells can transmit, via interconnects that electrically connect between the first sensor layer and the one or more semiconductor layers, the pixel data to the on-chip compute circuits. The interconnects can include, for example, through silicon vias (TSVs).

In step 1106, the on-chip compute circuits can store the pixel data at the second memory. In some examples, the second memory can include a frame buffer to store the pixel data. In some examples, MCU 704 can power down the second memory during the exposure period and power up the second memory after the exposure period when the pixel data are generated by the ADC and ready to be stored in the second memory. MCU 704 may power on the first memory during the exposure period. In some examples, MCU 704 may also power down the first memory during the exposure period, if the first memory include non-volatile memory (NVM) devices, such as MRAM devices, RRAM devices, PCM devices, so that the coefficients stored in the first memory can remain when the first memory is powered down.

In step 1108, the on-chip compute circuits can process, using the ML model accelerator and based on the coefficients stored in the first memory, the pixel data from the second memory to generate a processing result. The processing can include performing convolution operations between the pixel data and weight matrices to, for example, extract features, detect the presence of an object in the image and its image location.

In some examples, the processing can be performed using a DSP. In some examples, the processing can be performed in the first memory, which can include an array of memristors as shown in FIG. 5 and FIG. 10. In some examples, the processing can include in-memory compute operations in the second memory, which can include circuits to perform logical AND and the logical NOR operations between the pixel data and the weight matrices, and the logical AND and the logical NOR operations outputs can be further manipulated to perform matrix multiplication, matrix summation, a degree of similarity between two matrices/vectors, etc., as shown in FIG. 7H-FIG. 7J. In some examples, a sparse image processing operation can also be performed based on a gating model as shown in FIG. 8A, where a subset of the pixel data is selectively forwarded to the processing circuit (e.g., DSP) to perform the processing. The processing circuit can also skip arithmetic operations on zero values in the pixel data and coefficients input to the processing circuit. In some examples, the MRAM devices in the first memory can be used to generate random numbers to encrypt the pixel data and the coefficients to improve privacy and to support training operations (e.g., reinforcement learning) to train the coefficients.

System Environment

Figure 12:
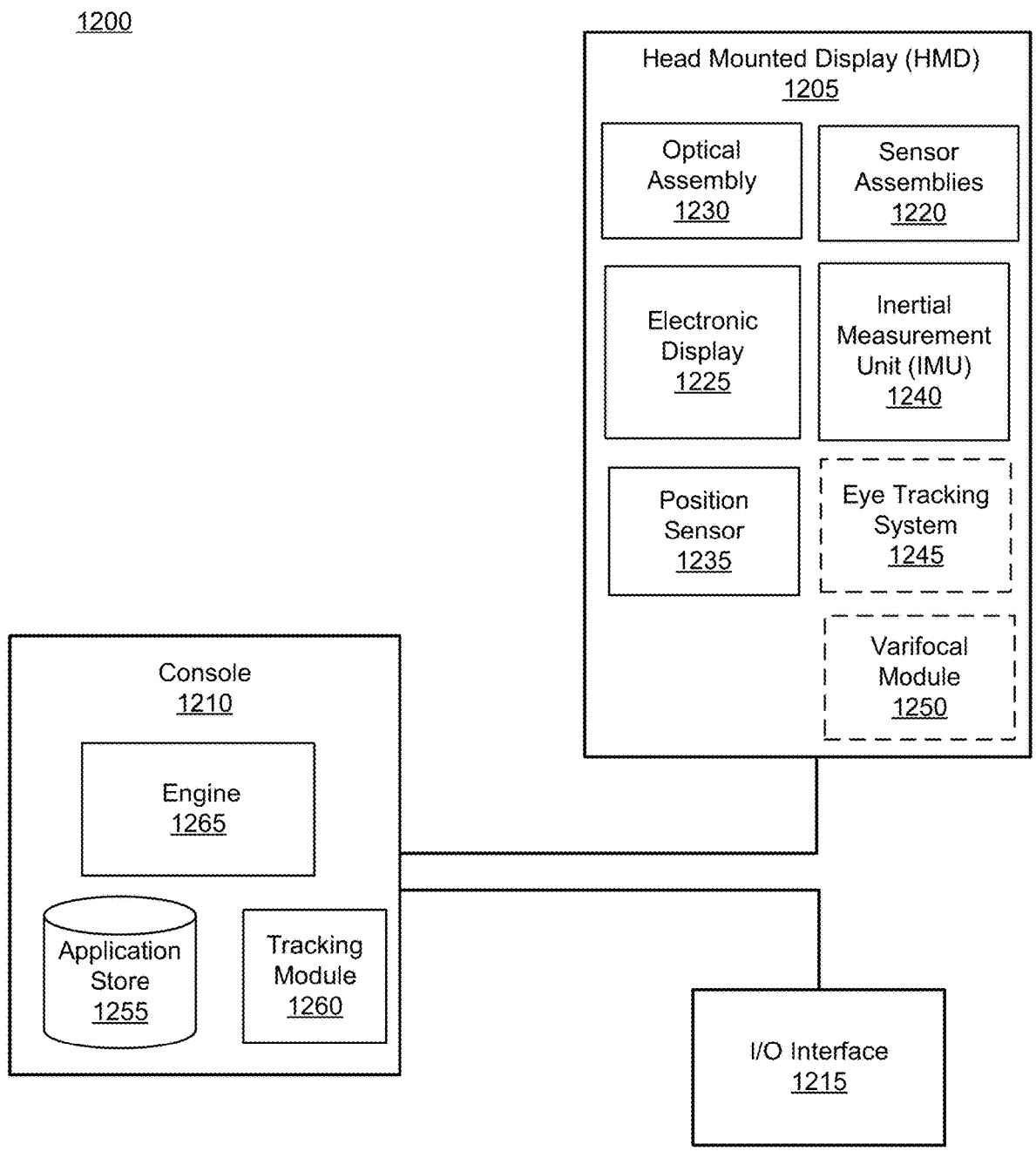
FIG. 12 is a block diagram of an HMD system in which a console operates, in accordance with one or more examples of the present disclosure.

FIG. 12 is a block diagram of one embodiment of an HMD system 1200 in which a console 1210 operates. The HMD system 1200 may operate in an artificial reality system. The HMD system 1200, shown by FIG. 11, comprises an HMD 1205 and an input/output (I/O) interface 1215 that is coupled to the console 1210. While FIG. 11 shows an example HMD system 1200 including one HMD 1205 and an I/O interface 1215, in other examples, any number of these components may be included in the HMD system 1200. For example, there may be multiple HMDs 1205 each having an associated I/O interface 1215, with each HMD 1205 and I/O interface 1215 communicating with the console 1210. In alternative configurations, different and/or additional components may be included in the HMD system 1200. Additionally, functionality described in conjunction with one or more of the components shown in FIG. 11 may be distributed among the components in a different manner than described in conjunction with FIG. 11 in some examples. For example, some or all of the functionality of the console 1210 is provided by the HMD 1205.

The HMD 1205 is a head-mounted display that presents content to a user comprising virtual and/or augmented views of a physical, real-world environment with computer-generated elements (e.g., two-dimensional (2D) or three-dimensional (3D) images, 2D or 3D video, sound). In some examples, the presented content includes audio that is presented via an external device (e.g., speakers and/or headphones) that receives audio information from the HMD 1205, the console 1210, or both and presents audio data based on the audio information. The HMD 1205 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other. An example of the HMD 1205 may be the HMD 100 described above in conjunction with FIG. 1A.

The HMD 1205 includes one or more sensor assemblies 1220, such as an electronic display 1225, an optical assembly 1230, one or more position sensors 1235, an IMU 1240, an optional eye tracking system 1245, and an optional varifocal module 1250. Some examples of the HMD 1205 have different components than those described in conjunction with FIG. 11. Additionally, the functionality provided by various components described in conjunction with FIG. 11 may be differently distributed among the components of the HMD 1205 in other examples.

Each sensor assembly 1220 may comprise a plurality of stacked sensor layers. A first sensor layer located on top of the plurality of stacked sensor layers may include an array of pixel cells configured to capture one or more images of at least a portion of light reflected from one or more objects in a local area surrounding some or all of the HMD 1205. At least one other sensor layer of the plurality of stacked sensor layers located beneath the first (top) sensor layer may be configured to process data related to the captured one or more images. The HMD 1205 or the console 1210 may dynamically activate a first subset of the sensor assemblies 1220 and deactivate a second subset of the sensor assemblies 1220 based on, for example, an application running on the HMD 1205. Thus, at each time instant, only a portion of the sensor assemblies 1220 would be activated. In some examples, information about one or more tracked features of one or more moving objects may be passed from one sensor assembly 1220 to another sensor assembly 1220, so the other sensor assembly 1220 may continue to track the one or more features of the one or more moving objects.

In some examples, each sensor assembly 1220 may be coupled to a host, for example, a processor (controller) of the HMD 1205 or the console 1210. The sensor assembly 1220 may be configured to send first data of a first resolution to the host using a first frame rate with the first data being associated with an image captured by the sensor assembly 1220 at a first time instant. The host may be configured to send, using the first frame rate, information about one or more features obtained based on the first data received from the sensor assembly 1220. The sensor assembly 1220 may be further configured to send second data of a second resolution lower than the first resolution to the host using a second frame rate higher than the first frame rate with the second data being associated with another image captured by the sensor assembly at a second time instant.

Each sensor assembly 1220 may include an interface connection between each pixel in the array of the top sensor layer and logic of at least one sensor layer of the one or more sensor layers located beneath the top sensor layer. At least one of the one or more sensor layers located beneath the top sensor layer of the sensor assembly 1220 may include logic configured to extract one or more features from the captured one or more images. At least one of the one or more sensor layers located beneath the top sensor layer of the sensor assembly 1220 may further include a CNN based on an array of memristors for storage of trained network weights.

At least one sensor assembly 1220 may capture data describing depth information of the local area. The at least one sensor assembly 1220 can compute the depth information using the data (e.g., based on a captured portion of a structured light pattern). Alternatively, the at least one sensor assembly 1220 can send this information to another device, such as the console 1210 that can determine the depth information using the data from the sensor assembly 1220. Each of the sensor assemblies 1220 may be an embodiment of the sensor device 130 in FIG. 1A, the sensor assembly 200 in FIG. 2, the sensor assembly 300 in FIG. 3, and/or the sensor system 605 in FIG. 6.

The electronic display 1225 displays two-dimensional or three-dimensional images to the user, in accordance with data received from the console 1210. In various examples, the electronic display 1225 comprises a single electronic display or multiple electronic displays (e.g., a display for each eye of a user). Examples of the electronic display 1225 include: a LCD, an OLED display, an ILED display, an AMOLED display, a TOLED display, some other display, or some combination thereof. The electronic display 1225 may be an embodiment of the electronic display 155 in FIG. 1B.

The optical assembly 1230 magnifies image light received from the electronic display 1225, corrects optical errors associated with the image light, and presents the corrected image light to a user of the HMD 1205. The optical assembly 1230 includes a plurality of optical elements. Example optical elements included in the optical assembly 1230 include: an aperture, a Fresnel lens, a convex lens, a concave lens, a filter, a reflecting surface, or any other suitable optical element that affects image light. Moreover, the optical assembly 1230 may include combinations of different optical elements. In some examples, one or more of the optical elements in the optical assembly 1230 may have one or more coatings, such as partially reflective or anti-reflective coatings.

Magnification and focusing of the image light by the optical assembly 1230 allows the electronic display 1225 to be physically smaller, weigh less, and consume less power than larger displays. Additionally, magnification may increase the field-of-view of the content presented by the electronic display 1225. For example, the field-of-view of the displayed content is such that the displayed content is presented using almost all (e.g., approximately 110 degrees diagonal), and in some cases all, of the field-of-view. Additionally in some examples, the amount of magnification may be adjusted by adding or removing optical elements.

In some examples, the optical assembly 1230 may be designed to correct one or more types of optical error. Examples of optical error include barrel or pincushion distortions, longitudinal chromatic aberrations, or transverse chromatic aberrations. Other types of optical errors may further include spherical aberrations, chromatic aberrations or errors due to the lens field curvature, astigmatisms, or any other type of optical error. In some examples, content provided to the electronic display 1225 for display is pre-distorted, and the optical assembly 1230 corrects the distortion when it receives image light from the electronic display 1225 generated based on the content. In some examples, the optical assembly 1230 is configured to direct image light emitted from the electronic display 1225 to an eye box of the HMD 1205 corresponding to a location of a user's eye. The image light may include depth information for the local area determined by at least one of the plurality of sensor assemblies 1220 based in part on the processed data. The optical assembly 1230 may be an embodiment of the optical assembly 160 in FIG. 1B.

The IMU 1240 is an electronic device that generates data indicating a position of the HMD 1205 based on measurement signals received from one or more of the position sensors 1235 and from depth information received from the at least one sensor assembly 1220. A position sensor 1235 generates one or more measurement signals in response to motion of the HMD 1205. Examples of position sensors 1235 include: one or more accelerometers, one or more gyroscopes, one or more magnetometers, another suitable type of sensor that detects motion, a type of sensor used for error correction of the IMU 1240, or some combination thereof. The position sensors 1235 may be located external to the IMU 1240, internal to the IMU 1240, or some combination thereof.

Based on the one or more measurement signals from one or more position sensors 1235, the IMU 1240 generates data indicating an estimated current position of the HMD 1205 relative to an initial position of the HMD 1205. For example, the position sensors 1235 include multiple accelerometers to measure translational motion (e.g., forward/back, up/down, left/right) and multiple gyroscopes to measure rotational motion (e.g., pitch, yaw, roll). In some examples, the position sensors 1235 may represent the position sensors 125 of FIG. 1A. In some examples, the IMU 1240 rapidly samples the measurement signals and calculates the estimated current position of the HMD 1205 from the sampled data. For example, the IMU 1240 integrates the measurement signals received from the accelerometers over time to estimate a velocity vector and integrates the velocity vector over time to determine an estimated current position of a reference point on the HMD 1205. Alternatively, the IMU 1240 provides the sampled measurement signals to the console 1210, which interprets the data to reduce error. The reference point is a point that may be used to describe the position of the HMD 1205. The reference point may generally be defined as a point in space or a position related to the HMD's 1205 orientation and position.

The IMU 1240 receives one or more parameters from the console 1210. The one or more parameters are used to maintain tracking of the HMD 1205. Based on a received parameter, the IMU 1240 may adjust one or more IMU parameters (e.g., sample rate). In some examples, certain parameters cause the IMU 1240 to update an initial position of the reference point, so it corresponds to a next position of the reference point. Updating the initial position of the reference point as the next calibrated position of the reference point helps reduce accumulated error associated with the current position estimated the IMU 1240. The accumulated error, also referred to as drift error, causes the estimated position of the reference point to "drift" away from the actual position of the reference point over time. In some examples of the HMD 1205, the IMU 1240 may be a dedicated hardware component. In other examples, the IMU 1240 may be a software component implemented in one or more processors. In some examples, the IMU 1240 may represent the IMU 130 of FIG. 1A.

In some examples, the eye tracking system 1245 is integrated into the HMD 1205. The eye tracking system 1245 determines eye tracking information associated with an eye of a user wearing the HMD 1205. The eye tracking information determined by the eye tracking system 1245 may comprise information about an orientation of the user's eye, for example, information about an angle of an eye-gaze. In some examples, the eye tracking system 1245 is integrated into the optical assembly 1230. An embodiment of the eye-tracking system 1245 may comprise an illumination source and an imaging device (camera).

In some examples, the varifocal module 1250 is further integrated into the HMD 1205. The varifocal module 1250 may be coupled to the eye tracking system 1245 to obtain eye tracking information determined by the eye tracking system 1245. The varifocal module 1250 may be configured to adjust focus of one or more images displayed on the electronic display 1225 based on the determined eye tracking information obtained from the eye tracking system 1245. In this way, the varifocal module 1250 can mitigate vergence-accommodation conflict in relation to image light. The varifocal module 1250 can be interfaced (either mechanically or electrically) with at least one of the electronic display 1225 and at least one optical element of the optical assembly 1230. Then, the varifocal module 1250 may be configured to adjust focus of the one or more images displayed on the electronic display 1225 by adjusting position of at least one of the electronic display 1225 and the at least one optical element of the optical assembly 1230, based on the determined eye tracking information obtained from the eye tracking system 1245. By adjusting the position, the varifocal module 1250 varies focus of image light output from the electronic display 1225 towards the user's eye. The varifocal module 1250 may be also configured to adjust resolution of the images displayed on the electronic display 1225 by performing foveated rendering of the displayed images, based at least in part on the determined eye tracking information obtained from the eye tracking system 1245. In this case, the varifocal module 1250 provides appropriate image signals to the electronic display 1225. The varifocal module 1250 provides image signals with a maximum pixel density for the electronic display 1225 only in a foveal region of the user's eye-gaze, while providing image signals with lower pixel densities in other regions of the electronic display 1225. In one embodiment, the varifocal module 1250 may utilize the depth information obtained by the at least one sensor assembly 1220 to, for example, generate content for presentation on the electronic display 1225.

The I/O interface 1215 is a device that allows a user to send action requests and receive responses from the console 1210. An action request is a request to perform a particular action. For example, an action request may be an instruction to start or end capture of image, video data, or an instruction to perform a particular action within an application. The I/O interface 1215 may include one or more input devices. Example input devices include: a keyboard, a mouse, a game controller, or any other suitable device for receiving action requests and communicating the action requests to the console 1210. An action request received by the I/O interface 1215 is communicated to the console 1210, which performs an action corresponding to the action request. In some examples, the I/O interface 1215 includes an IMU 1240 that captures IMU data indicating an estimated position of the I/O interface 1215 relative to an initial position of the I/O interface 1215. In some examples, the I/O interface 1215 may provide haptic feedback to the user in accordance with instructions received from the console 1210. For example, haptic feedback is provided when an action request is received or the console 1210 communicates instructions to the I/O interface 1215 causing the I/O interface 1215 to generate haptic feedback when the console 1210 performs an action.

The console 1210 provides content to the HMD 1205 for processing in accordance with information received from one or more of: the at least one sensor assembly 1220, the HMD 1205, and the I/O interface 1215. In the example shown in FIG. 11, the console 1210 includes an application store 1255, a tracking module 1260, and an engine 1265. Some examples of the console 1210 have different modules or components than those described in conjunction with FIG. 11. Similarly, the functions further described below may be distributed among components of the console 1210 in a different manner than described in conjunction with FIG. 11.

The application store 1255 stores one or more applications for execution by the console 1210. An application is a group of instructions, that when executed by a processor, generates content for presentation to the user. Content generated by an application may be in response to inputs received from the user via movement of the HMD 1205 or the I/O interface 1215. Examples of applications include: gaming applications, conferencing applications, video playback applications, or other suitable applications.

The tracking module 1260 calibrates the HMD system 1200 using one or more calibration parameters and may adjust one or more calibration parameters to reduce error in determination of the position of the HMD 1205 or of the I/O interface 1215. For example, the tracking module 1260 communicates a calibration parameter to the at least one sensor assembly 1220 to adjust the focus of the at least one sensor assembly 1220 to more accurately determine positions of structured light elements captured by the at least one sensor assembly 1220. Calibration performed by the tracking module 1260 also accounts for information received from the IMU 1240 in the HMD 1205 and/or an IMU 1240 included in the I/O interface 1215. Additionally, if tracking of the HMD 1205 is lost (e.g., the at least one sensor assembly 1220 loses line of sight of at least a threshold number of structured light elements), the tracking module 1260 may re-calibrate some or all of the HMD system 1200.

The tracking module 1260 tracks movements of the HMD 1205 or of the I/O interface 1215 using information from the at least one sensor assembly 1220, the one or more position sensors 1235, the IMU 1240, or some combination thereof. For example, the tracking module 1250 determines a position of a reference point of the HMD 1205 in a mapping of a local area based on information from the HMD 1205. The tracking module 1260 may also determine positions of the reference point of the HMD 1205 or a reference point of the I/O interface 1215 using data indicating a position of the HMD 1205 from the IMU 1240 or using data indicating a position of the I/O interface 1215 from an IMU 1240 included in the I/O interface 1215, respectively. Additionally, in some examples, the tracking module 1260 may use portions of data indicating a position or the HMD 1205 from the IMU 1240, as well as representations of the local area from the at least one sensor assembly 1220 to predict a future location of the HMD 1205. The tracking module 1260 provides the estimated or predicted future position of the HMD 1205 or the I/O interface 1215 to the engine 1265.

The engine 1265 generates a 3D mapping of the local area surrounding some or all of the HMD 1205 based on information received from the HMD 1205. In some examples, the engine 1265 determines depth information for the 3D mapping of the local area based on information received from the at least one sensor assembly 1220 that is relevant for techniques used in computing depth. The engine 1265 may calculate depth information using one or more techniques in computing depth from structured light. In various examples, the engine 1265 uses the depth information to, e.g., update a model of the local area, and generate content based in part on the updated model.

The engine 1265 also executes applications within the HMD system 1200 and receives position information, acceleration information, velocity information, predicted future positions, or some combination thereof of the HMD 1205 from the tracking module 1260. Based on the received information, the engine 1265 determines content to provide to the HMD 1205 for presentation to the user. For example, if the received information indicates that the user has looked to the left, the engine 1265 generates content for the HMD 1205 that mirrors the user's movement in a virtual environment or in an environment augmenting the local area with additional content. Additionally, the engine 1265 performs an action within an application executing on the console 1210 in response to an action request received from the I/O interface 1215 and provides feedback to the user that the action was performed. The provided feedback may be visual or audible feedback via the HMD 1205 or haptic feedback via the I/O interface 1215.

In some examples, based on the eye tracking information (e.g., orientation of the user's eye) received from the eye tracking system 1245, the engine 1265 determines resolution of the content provided to the HMD 1205 for presentation to the user on the electronic display 1225. The engine 1265 provides the content to the HMD 1205 having a maximum pixel resolution on the electronic display 1225 in a foveal region of the user's gaze, whereas the engine 1265 provides a lower pixel resolution in other regions of the electronic display 1225, thus achieving less power consumption at the HMD 1205 and saving computing cycles of the console 1210 without compromising a visual experience of the user. In some examples, the engine 1265 can further use the eye tracking information to adjust where objects are displayed on the electronic display 1225 to prevent vergence-accommodation conflict.

Additional Configuration Information

The foregoing description of the examples of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the examples of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Examples of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description but rather by any claims that issue on an application based hereon. Accordingly, the disclosure of the examples is intended to be illustrative, but not limiting, of the scope of the disclosure, which is set forth in the following claims.

What is claimed is:

1. An apparatus comprising:
a first sensor layer, of a plurality of stacked sensor layers, including an array of pixel cells configured to generate a frame of pixel data during an exposure period; and
one or more semiconductor layers of the plurality of stacked sensor layers located beneath the first sensor layer, the one or more semiconductor layers being electrically connected to the first sensor layer via interconnects,
wherein the one or more semiconductor layers comprises on-chip compute circuits configured to receive the pixel data via the interconnects and process the pixel data, the on-chip compute circuits comprising:
a machine learning (ML) model accelerator configured to implement a convolutional neural network (CNN) model to process the pixel data;
a first memory configured to store coefficients of the CNN model and instruction codes;
a second memory configured to store the pixel data; and
a controller configured to execute the codes to control operations of the ML model accelerator, the first memory, and the second memory;
wherein at least one memory is configured to be in a powered down state within the exposure period, the at least one memory comprising the second memory; and
wherein the first memory is configured to retain the coefficients and the instruction codes while the at least one memory is in the powered down state.

2. The apparatus of claim 1, wherein the controller is configured to power down the ML model accelerator and the second memory within the exposure period, power up the ML model accelerator and the second memory after the exposure period ends to process the pixel data, and power down the ML model accelerator and the second memory after the processing of the pixel data completes.

3. The apparatus of claim 1, wherein the first memory comprises a non-volatile memory (NVM); and
wherein the second memory comprises static random access memory (SRAM) devices.

4. The apparatus of claim 3, wherein the NVM comprises at least one of: magnetoresistive random access memory (MRAM) devices, resistive random-access memory (RRAM) devices, or phase-change memory (PCM) devices.

5. The apparatus of claim 1, wherein the one or more semiconductor layers comprise a first semiconductor layer and a second semiconductor layer, the first semiconductor layer forming a stack with the second semiconductor layer;
wherein the first semiconductor layer includes the ML model accelerator and the first memory;
wherein the second semiconductor layer includes the second memory; and
wherein the second memory is connected to the ML model accelerator via a parallel through silicon via (TSV) interface.

6. The apparatus of claim 5, wherein the second semiconductor layer further comprises a memory controller configured to perform an in-memory compute operation on the pixel data stored in the second memory and the in-memory compute operation comprising at least one of: a matrix transpose operation, a matrix re-shaping operation, or a matrix multiplication operation.

7. The apparatus of claim 6, wherein the second memory comprises circuitry configured to perform at least one of: a logical AND operation between a first matrix representing the pixel data and a second matrix representing the coefficients, or a logical NOR operation between the first matrix and the second matrix; and
wherein the memory controller is configured to perform, based on a result of the at least one of the logical AND operation or the logical NOR operation, at least one of: a multiplication operation, a summation operation, or a degree of similarity operation between the first matrix and the second matrix.

8. The apparatus of claim 7, wherein a zero coefficient is represented by an asserted flag bit in the first memory; and
wherein a non-zero coefficient is represented by a de-asserted flag bit and a set of data bits representing a numerical value of the non-zero coefficient in the first memory.

9. The apparatus of claim 8, wherein the ML model accelerator is configured to skip arithmetic operations involving zero coefficients based on detecting the asserted flag bits of the zero coefficients.

10. The apparatus of claim 1, wherein the ML model accelerator is configured to implement a gating model to select a subset of the pixel data as input to the CNN model; and
wherein the gating model comprises a user-specific model and a base model, the user-specific model being generated at the apparatus, the base model being generated at an external device external to the apparatus.

11. The apparatus of claim 10, wherein the gating model selects different subsets of the pixel data for different input channels and for different frames.

12. The apparatus of claim 1, wherein the one or more semiconductor layers comprise a magnetoresistive random access memory (MRAM) device; and
wherein the controller is configured to:
transmit pulses to the MRAM device to modulate a resistance of the MRAM device;
generate a sequence of random numbers based on measuring the modulated resistances of the MRAM device; and
encrypt at least one of: the coefficients of the CNN model, or the pixel data, using the sequence of random numbers.

13. The apparatus of claim 1, wherein the CNN model comprises:
a first layer including a first set of weights; and
a second layer including a second set of weights;
wherein the first set of weights and the second set of weights are trained based on an ex-situ training operation external to the apparatus; and
wherein the second set of weights are adjusted based on an in-situ training operation at the apparatus.

14. The apparatus of claim 13, wherein the ex-situ training operation is performed in a cloud environment; and
wherein the apparatus is configured to transmit the adjusted second set of weights back to the cloud environment.

15. The apparatus of claim 14, wherein the in-situ training operation comprises a reinforcement learning operation;
wherein the first memory comprises an array of memristors configured to implement the second layer; and
wherein the ML model accelerator is configured to compare intermediate outputs from the array of memristors with random numbers to generate additional outputs, and to adjust weights stored in the array of memristors based on the additional outputs.

16. The apparatus of claim 15, wherein the first memory comprises a magnetoresistive random access memory (MRAM) device; and wherein the controller is configured to transmit pulses to the MRAM device to generate the random numbers.

17. The apparatus of claim 14, wherein the in-situ training operation comprises an unsupervised learning operation;

wherein the first memory comprises an array of memristors configured to implement the second layer;

wherein the array of memristors is configured to receive signals representing events detected by the array of pixel cells, and to generate intermediate outputs representing a pattern of relative timing of the events; and wherein the ML model accelerator is configured to generate additional outputs based on the intermediate outputs, and to adjust weights stored in the array of memristors based on the additional outputs.

18. The apparatus of claim 13, wherein the first memory comprises an array of memristors configured to implement the second layer; and wherein the array of memristors is configured to perform at least one of: a vector-matrix multiplication operation, or a vector-vector multiplication operation, to implement a fully-connected neural network layer of the CNN model.

19. A method, comprising:

generating a frame of pixel data during an exposure period, using an array of pixel cells of a first sensor layer, wherein the first sensor layer is part of a plurality of stacked sensor layers, the plurality of stacked sensor layers including one or more semiconductor layers located beneath the first sensor layer;

transmitting, via interconnects that electrically connect the first sensor layer to the one or more semiconductor layers, the pixel data to on-chip compute circuits in the one or more semiconductor layers, wherein the on-chip compute circuits include a machine learning (ML) model accelerator that implements a convolutional neural network (CNN) model, a first memory in which coefficients of the CNN model and instruction codes have been stored, and a second memory;

storing the pixel data in the second memory; and processing, using the ML model accelerator and based on the coefficients and the instruction codes stored in the first memory, the pixel data from the second memory to generate a processing result;

wherein at least one memory is configured to be in a powered down state within the exposure period, the at least one memory comprising the second memory; and wherein the first memory is configured to retain the coefficients and the instruction codes while the at least one memory is in the powered down state.

20. The method of claim 19, wherein the processing comprises at least one of:

using an array of memristors included in the first memory to perform an in-memory compute operation as part of the processing, or using circuits of the second memory to perform at least one of: a logical AND operation between a first matrix representing the pixel data and a second matrix representing the coefficients, or a logical NOR operation between the first matrix and the second matrix.

* * * * *